(12) United States Patent
Hirukawa et al.

(10) Patent No.: US 6,249,335 B1
(45) Date of Patent: Jun. 19, 2001

(54) PHOTO-MASK AND METHOD OF EXPOSING AND PROJECTION-EXPOSING APPARATUS

(75) Inventors: Shigeru Hirukawa, Kashiwa; Naomasa Shiraishi, Kawasaki; Masaomi Kameyama, Tokyo, all of (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 08/473,995

(22) Filed: Jun. 7, 1995

Related U.S. Application Data

(62) Division of application No. 08/288,162, filed on Aug. 10, 1994, now abandoned, which is a continuation of application No. 08/003,423, filed on Jan. 12, 1993, now abandoned.

(30) Foreign Application Priority Data

| | | |
|---|---|---|
| Jan. 17, 1992 | (JP) | 4-006406 |
| Feb. 4, 1992 | (JP) | 4-019140 |
| May 21, 1992 | (JP) | 4-128368 |
| May 29, 1992 | (JP) | 4-138982 |
| Jul. 1, 1992 | (JP) | 4-174097 |

(51) Int. Cl.$^7$ ............................ G03B 27/42; G03B 27/72
(52) U.S. Cl. ............................................... 355/53; 355/71
(58) Field of Search .................................. 355/53, 67, 71

(56) References Cited

U.S. PATENT DOCUMENTS

| | | | | |
|---|---|---|---|---|
| 3,584,948 | * | 6/1971 | Herriott | 355/77 |
| 4,596,467 | * | 6/1986 | Bartelt | 356/363 |
| 4,828,392 | * | 5/1989 | Nomura et al. | 356/401 |
| 5,117,255 | * | 5/1992 | Shiraishi et al. | 355/53 |
| 5,173,380 | * | 12/1992 | Kamon | 430/5 |
| 5,175,647 | * | 12/1992 | Gupta et al. | 359/566 |
| 5,208,629 | * | 5/1993 | Matsuo et al. | 355/53 |
| 5,340,637 | * | 8/1994 | Okai et al. | 359/569 X |

* cited by examiner

*Primary Examiner*—Fred L. Braun
(74) *Attorney, Agent, or Firm*—Vorys, Sater, Seymour and Pease LLP

(57) ABSTRACT

A projection-exposing apparatus has a mask which has a pattern formed with a pitch $P_R$, an illuminating optical system for applying illuminating light from a light source to the mask, a projection optical system for projecting an image of the pattern onto a photosensitive substrate, and a deflecting grating member formed with a pitch $P_G$ disposed between the light source and the pattern of the mask for generating diffracted light. The pitch $P_G$ of the deflecting grating member is defined in the relation $P_G=2P_R$. The diffraction grating member is remote from the pattern on the mask by a distance $\Delta t$, where $\Delta t \geq P_G/2NA_{IL}$, $NA_{IL}$ being the numerical aperture of the illumination optical system.

38 Claims, 19 Drawing Sheets

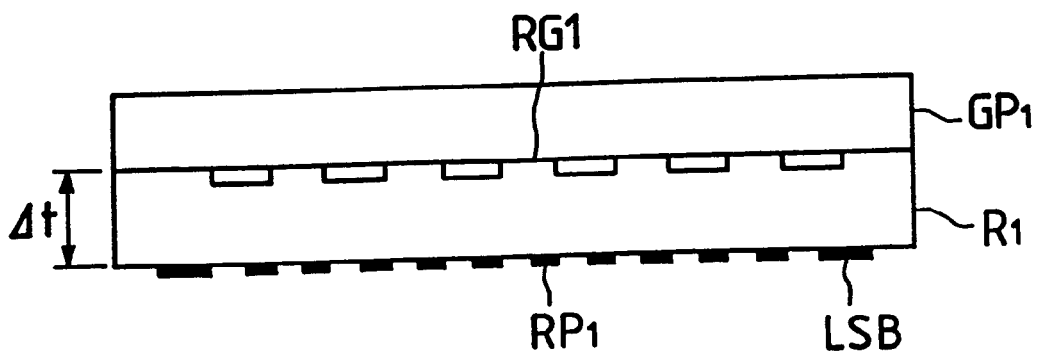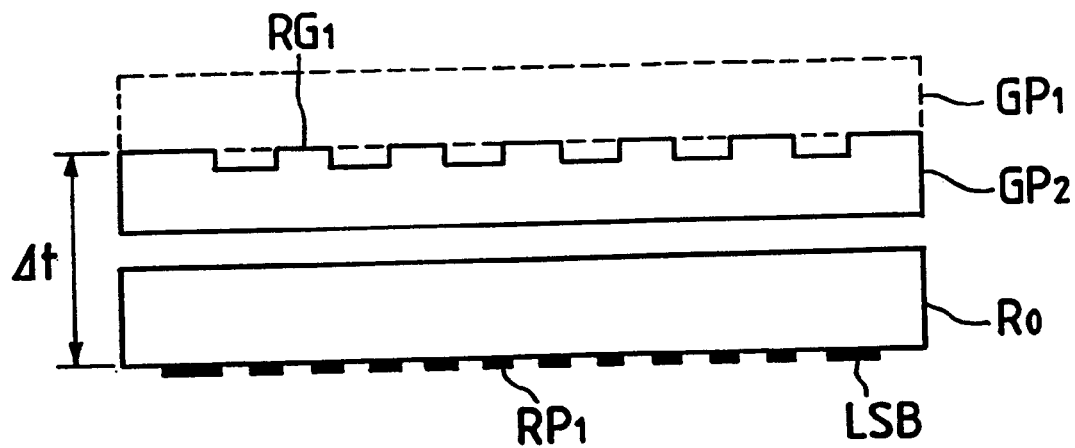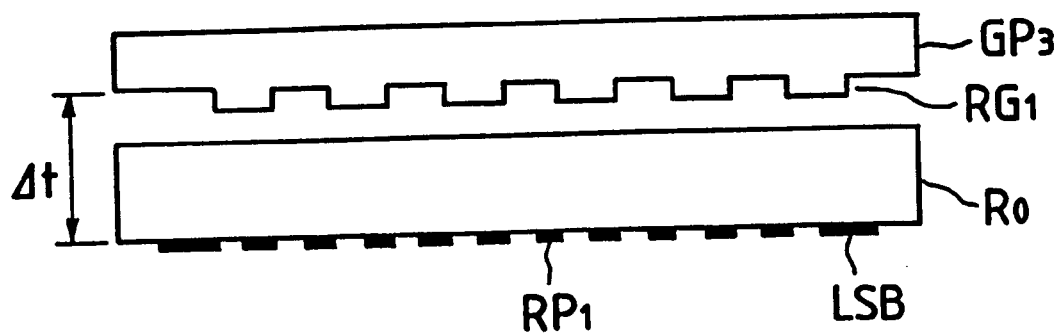

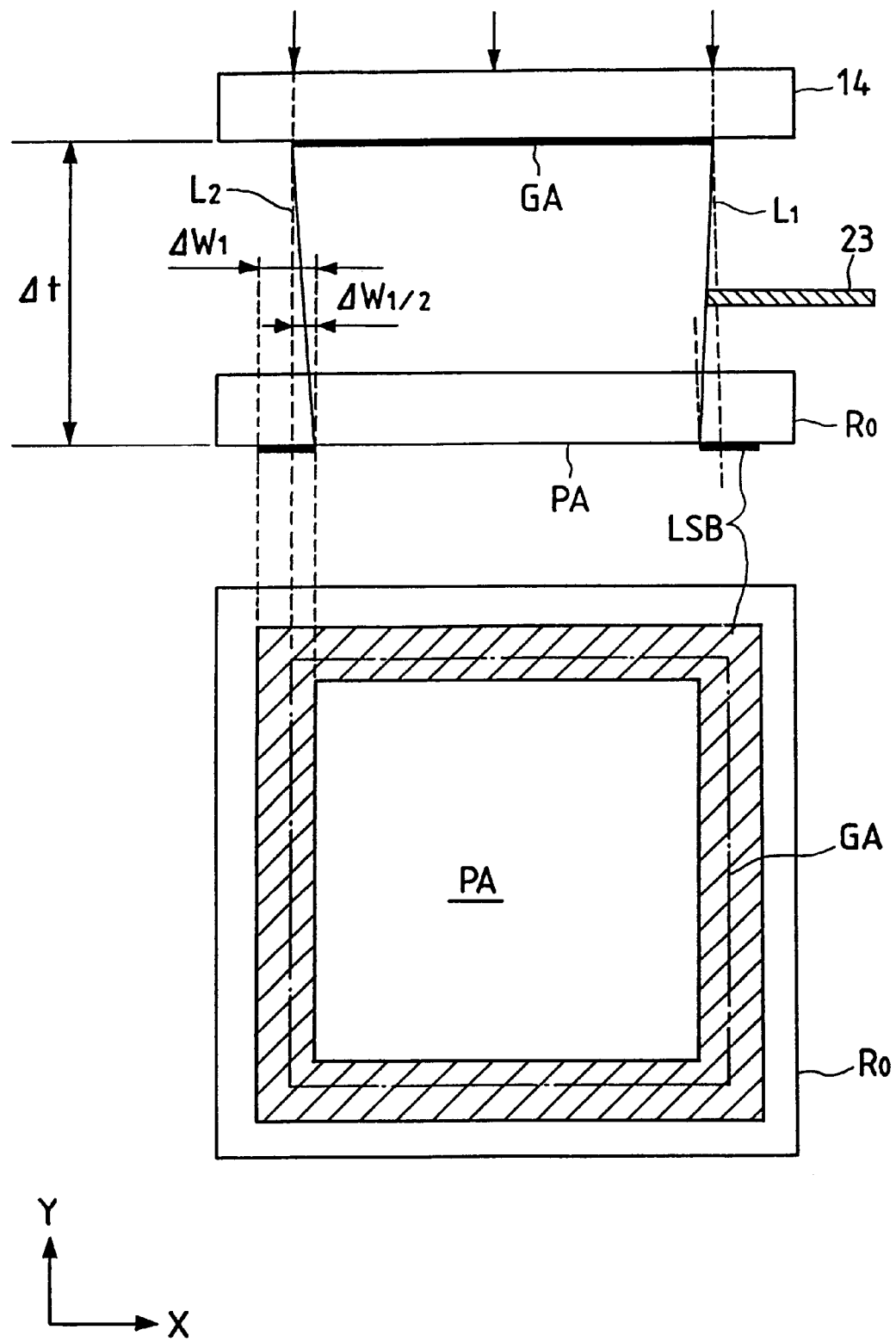

PHOTO-MASK AND METHOD OF EXPOSING AND PROJECTION-EXPOSING APPARATUS

This is a division of application Ser. No. 08/288,162 filed Aug. 10, 1994, now abandoned which is a continuation of application Ser. No. 08/003,423 filed Jan. 12, 1993 (abandoned).

BACKGROUND OF THE INVENTION

1. Field of the Invention

This invention relates to a photo-mask used in the lithography process of the manufacture of semiconductive elements or liquid crystal display elements, and further to a method of exposing and a projection-exposing apparatus for transferring the pattern of a mask onto a photosensitive substrate.

2. Related Background Art

A method of transferring a pattern formed on a mask or a reticle (hereinafter referred to as the reticle) onto a substrate is adopted in the lithography process for forming the circuit pattern of a semiconductive element or the like. Photosensitive photoresist is applied onto the substrate (semiconductive wafer or glass plate), and the circuit pattern is transferred to photosensitive thin film (photoresist) in conformity with an applied optical image, i.e., the pattern shape of the transparent portion of the reticle pattern. In a projection-exposing apparatus, the image of the reticle pattern is projected onto the wafer through a projection optical system.

The projection-exposing apparatus is divided broadly into the collective exposure type and the scanning exposure type. Projection-exposing apparatuses of the collective exposure type include projection-exposing apparatuses of the step and repeat type, i.e., so-called steppers. Also, projection-exposing apparatuses of the scanning exposure type include mirror projection aligners in which a reticle and a wafer are opposed to each other with a projection optical system interposed therebetween and relative scanning is effected to thereby effect exposure while the reticle is illuminated by arcuate slit illuminating light. Further, recently, in the scanning exposure type, a new system for achieving high resolving power has been proposed as a step and scan type in pages 424–433 of SPIE, Vol. 1088, Optical Laser Microlithography II (1989). The step and scan type is the use of a scan type in which a reticle is one-dimensionally scanned and at the same time, a wafer is one-dimensionally scanned at a speed synchronized therewith, with a type in which the wafer is step-moved in a direction orthogonal to the scanning exposure direction.

Now, the projection optical system used in the exposing apparatus of the scanning exposure type comprises chiefly a reflecting element alone, and uses arcuate slit illuminating light. This is for obtaining the advantage that various aberrations become substantially zero in the narrow range (zonal) of an image height point spaced apart by a predetermined distance from the optical axis of the projection optical system. Further, the projection optical system comprising a reflecting element (a reflection projection system), as compared with a projection optical system comprising a refracting element (a refraction projection system), has the advantage that it can use illuminating light of a wider wavelength range as exposure light. This means the obtainment of the effect of reducing a standing wave created within photoresist on the wafer.

Also, the reflection projection system, unlike the refraction projection system, does not have the necessity of taking the light transmittance characteristic of the optical element used into account. Accordingly, in the reflection projection system, even an exposing apparatus using energy rays of the vacuum ultraviolet range which, in the refraction projection system, is difficult to realize because of transmittance can be realized. However, the good image range of the projection optical system is limited to an arcuate area and therefore, to secure a wider exposure area, scanning during exposure is necessary. An example of the projection optical system, particularly the reflection refraction reduction projection system, suitable for use in the step and scan system is disclosed, for example, in U.S. Pat. No. 4,747,678. Also, besides the step and scan system using arcuate slit illuminating light, an attempt to apply a projection optical system having a circular image field (the full field type) to the step and scan system is proposed, for example, in U.S. application Ser. No. 253,717 (Oct. 5, 1989).

On the other hand, a projection-exposing apparatus of the collective exposure type (for example, a stepper) has adopted a construction in which in the plane of an illuminating optical system (hereinafter referred to as the pupil plane of the illuminating optical system) which becomes the Fourier transformation plane of that surface of a reticle on which a pattern exists, or in a plane near it, an illuminating light beam is limited to a substantially circular shape (or a rectangular shape) centering at the optical axis of the illuminating optical system and illuminates the reticle. Therefore, the illuminating light beam has been incident on the reticle at an angle approximate to perpendicularity thereto. Also, on the reticle (a glass substrate such as quartz) used in this apparatus, there has been depicted a circuit pattern comprised of a transmitting portion (the naked surface portion of the substrate) of which the transmittance to the illuminating light beam is approximately 100% and a light-intercepting portion (chromium) of which the transmittance is approximately 0%. In the apparatus of this kind, the illuminating light beam applied to the reticle is diffracted by the reticle pattern, and 0-order diffracted light and ±1st-order diffracted lights are created from the pattern. These diffracted lights are condensed by the projection optical system and interference fringes, i.e., the image of the reticle pattern, is formed on a wafer. At this time, the angle θ (the reticle side) formed between the 0-order diffracted light and the ±1st-order diffracted lights is determined by $\sin\theta = \lambda/P$ when the wavelength of exposure light is $\lambda$ ($\mu$m) and the reticle side numerical aperture of the projection optical system is NA.

Now, if the pattern pitch becomes minute, $\sin\theta$ will become great, and if $\sin\theta$ becomes greater than the reticle side numerical aperture (NA) of the projection optical system, the ±1st-order diffracted lights will be limited by the effective diameter of the plane of the projection optical system which is the Fourier transformation plane of the reticle pattern (hereinafter referred to as the pupil plane of the projection optical system) and will become unable to be transmitted through the projection optical system. That is, only the 0-order diffracted light will arrive at the wafer and interference fringes (the image of the pattern) will not be created. Accordingly, when in the above-described apparatus, use is made of a reticle comprising only the aforedescribed transmitting portion and light-intercepting portion (hereinafter referred to as the usual reticle), the degree of minuteness (the maximum pattern pitch) P of the reticle pattern which can be resolved on the wafer is given by the relational expression that $P \cong \lambda/NA$, from $\sin\theta = NA$.

From this, the minimum pattern size is a half of the pitch P and therefore, the minimum pattern size is of the order of 0.5×λ/NA. In the actual photolithography process, however, some degree of depth of focus becomes necessary due to the influences of the curvature of the wafer, the level difference of the wafer by the process, etc. or the thickness of photo-resist itself. Therefore, the practical minimum resolution pattern size is expressed as k×λ/NA, where k is called a process coefficient and usually is of the order of 0.6–0.8.

Thus, to expose and transfer a pattern more minute than at present in the prior-art apparatus, it has been necessary to use a light source of short wavelength for exposure (such as an excimer laser source) or to use a projection optical system of great numerical aperture. However, making the wavelength of the exposure light source shorter than at present is difficult at the present point of time because the running cost of the excimer laser source or the like increases and the development of resist is difficult since in the short wavelength range, the absorption of light becomes great. Also, the numerical aperture of the projection optical system is already approximate to the theoretic limit even at present and it is nearly desperate to make the numerical aperture greater than that. Even if it is possible to make the numerical aperture greater than at present, the apparatus will become bulky and costly and moreover, the depth of focus determined by $\pm\lambda/NA^2$ will sharply decrease with an increase in the numerical aperture and therefore, the depth of focus necessary for practical use will become smaller, and this leads to the problem that a practical exposing apparatus cannot be provided.

Therefore, it has also been proposed to use a phase shift reticle provided with a phase shifter (such as dielectric thin film) for shifting the phase of transmitted light from particular one of the transmitting portions of the circuit pattern of the reticle by $\pi$ (rad) relative to transmitted light from the other transmitting portion. The phase shift reticle is disclosed, for example, in Japanese Patent Publication No. 62-50811, and if this phase shift reticle is used, the transfer of a pattern more minute than when the usual reticle is used becomes possible. That is, there is the effect of improving the resolving power.

If a phase shift reticle of this kind is used, the transfer of a pattern which is minute as compared with the usual reticle is possible, but the phase shift reticle is difficult to manufacture and moreover, the manufacturing process becomes complex and correspondingly, costs become higher. For example, the usual reticle can be provided simply by forming a light intercepting pattern by chromium or the like on a glass substrate, whereas the phase shift reticle requires the formation of a phase shifter pattern, discretely from the formation of a light intercepting pattern. Accordingly, in the manufacture, at least two patternings and the alignment of those patterns are necessary. Moreover, a method of inspecting the defect of the phase shift reticle has not yet been established and many other problems are left still to be solved, and it is difficult at present to put the phase shift reticle into practical use.

So, attempts have recently been made to make the transfer of a minute pattern possible by the optimization of the illuminating condition or the contrivance of the exposing method. For example, there has been proposed a method of selecting a combination of the optimum numerical aperture (i.e., coherence factor σ) of an illuminating optical system and the numerical aperture (N.A.) of a projection optical system relative to a pattern of a particular line width for each line width of the pattern to thereby improve the resolution and the depth of focus. Further, there has been proposed a zonal illuminating method of prescribing the light quantity distribution of an illuminating light beam in the pupil plane of the illuminating optical system or a plane near it into a zonal shape, or the inclined illuminating method (the deformed light source method) of limiting the light quantity distribution of an illuminating light beam to a plurality of discrete partial areas eccentric with respect to the optical axis of the illuminating optical system, inclining the illuminating light beam by a predetermined angle correspondingly to the periodicity of a reticle pattern and applying it. Particularly, the deformed light source method was announced in the autumn meeting of the Applied Physical Society in 1991, and has further been filed as U.S. application Ser. No. 791,138 (Nov. 13, 1991) and U.S. application Ser. No. 847,030 (Apr. 15, 1992).

However, to make the deformed light source method function effectively, it is necessary to make the angle of incidence of the illuminating light onto the reticle, i.e., the numerical aperture of the illuminating optical system, greater than in the prior art. Therefore, in a projection-exposing apparatus a doping the deformed light source method, the ratio of the numerical aperture of the illuminating optical system to the numerical aperture of the projection optical system, i.e., σ value (coherence factor), becomes great and thus, the illuminating optical system becomes bulkier and more complicated than in the prior-art apparatus and the designing and manufacture of the illuminating optical system become difficult. Further, the bulkiness of the apparatus not only leads to the increased cost of the apparatus itself, but also leads to the problem that the enlargement of a clean room which is the environment in which the projection-exposing apparatus is used is required and the running cost is increased. Such problems arise in both of the collective exposure type and the scanning exposure type.

Also, the formation of the deformed light source shape has been realized by disposing a deformed aperture stop in a secondary light source surface (particularly the exit surface of a fly-eye lens). Thus, a considerable quantity of light is intercepted, and this leads to the problem that illumination (illuminating power) is greatly reduced. Further, the deformed stop decreases the number of lens elements effective in the fly-eye lens, and this also leads to the problem that the effect of uniformizing and averaging the illumination peculiar to the fly-eye lens is reduced and the uniformity of the illumination on the reticle surface and the wafer surface is aggravated.

SUMMARY OF THE INVENTION

The present invention has as its object the provision of a photo-mask, a method of exposing and a projection-exposing apparatus which do not require a phase shift reticle difficult to manufacture and an improvement in an illuminating optical system and which are capable of effecting projection exposure of a high resolution and a great depth of focus equal (equivalent) to the deformed light source method.

So, in the photo-mask according to the present invention, a deflecting member (for example, a diffraction grating pattern) is provided at a predetermined distance on the light source side of a mask pattern. The deflecting member is formed, for example, on the surface (glass surface) opposite to a surface on which the mask pattern is formed (a pattern surface), or a transparent substrate discrete from the mask.

Also, when the numerical aperture of the illuminating optical system is $NA_{IL}$ and the pitch of the diffraction-grating pattern as the deflecting member is $P_G$, the spacing $\Delta t$ between the mask pattern and the diffraction grating pattern with respect to a direction perpendicular to the mask is defined in the relation that $\Delta t \geq P_G/2NA_{IL}$.

Further, when the mask pattern includes a periodic pattern and the pitch of the periodic pattern is $P_R$, the diffraction grating pattern as the deflecting member has its pitch $P_G$ defined as $P_G=2P_R$ and is formed so that the pitch direction thereof may substantially coincide with the pitch direction of the periodic pattern.

Also, when the mask pattern is a two-dimensional periodic pattern of pitches $P_{R1}$ and $P_{R2}$, the diffraction grating pattern as the deflecting member is one in which grating elements of which the lengths of the sides with respect to the pitch directions of the two-dimensional periodic pattern are $P_{R1}$ and $P_{R2}$ are arranged checkerwise.

Furthermore, the formation area of the diffraction grating pattern as the deflecting member is determined to a size equal to or larger than the illuminated area of the mask pattern. Any of the above-described diffraction grating patterns may preferably be a phase type diffraction grating.

In the method of exposing according to the present invention, illuminating light is deflected by the deflecting member disposed at a predetermined distance on the light source side of the mask pattern so that the illuminating light may be incident on the mask pattern at an angle with respect thereto. Particularly the illuminating light is deflected by the deflecting member so that of diffracted lights created from the mask pattern, one of ±1st-order diffracted lights and 0-order diffracted light may pass substantially at an equidistance from the optical axis of a projection optical system in the Fourier transformation plane in the projection optical system for the mask pattern or a plane near it.

Further, the deflecting member may preferably be moved in a predetermined direction and/or minutely rotated while the mask pattern is exposed on a photosensitive substrate. Particularly the deflecting member may preferably be moved in the direction of the optical axis of the projection optical system by an amount equal to or greater than the wavelength of the illuminating light.

Also, the mask pattern may preferably be comprised of a transmitting portion of which the transmittance to the illuminating light is approximately 1, and a semi-transmitting portion which gives a phase difference of approximately $(2m+1)\pi$ (m being an integer) to the illuminating light passing through said transmitting portion and of which the transmittance to the illuminating light is equal to or less than ¼ of the transmittance of the transmitting portion. Furthermore, the photosensitive substrate and the imaging plane of the projection optical system may preferably be moved relative to each other in the direction of the optical axis while the mask pattern comprised of the transmitting portion and the semi-transmitting portion is exposed on the photosensitive substrate.

A first projection-exposing apparatus according to the present invention is provided with an illuminating optical system for shaping illuminating light from a light source into a substantially uniform intensity distribution and applying said uniform illuminating light to a mask, a projection optical system for projecting the image of the mask pattern onto a photosensitive substrate, and a deflecting member disposed on the light source side of the mask pattern with a predetermined spacing therefrom for deflecting, when the illuminating light is incident, at least part of the incident light by a predetermined angle with respect to the mask pattern. Particularly, the incidence area of the illuminating light incident on the deflecting member is made larger by a predetermined amount than the illuminated area of the mask pattern. Also, the coherence factor of the illuminating optical system may preferably be determined to 0.5 or less, particularly, the order of 0.1–0.3.

Further, the first projection-exposing apparatus has a driving member for rotating the mask pattern and the deflecting member which is a diffraction grating pattern relative to each other in a plane perpendicular to the optical axis of the projection optical system, and makes the direction of period of the mask pattern substantially coincident with the direction of period of the diffraction grating pattern.

Also, the first projection-exposing apparatus has a light-intercepting member provided between the projection optical system and the deflecting member for intercepting the expanse of the light beam by the deflecting member.

Further, the first projection-exposing apparatus has a mechanism for varying the coherence factor of the illuminating optical system.

Also, in the first projection-exposing apparatus, the deflecting member has at least two deflecting plates differing in the amount of deflection of the illuminating light from each other, and has interchanging means for interchanging at least two deflecting members in conformity with the degree of minuteness of the mask pattern. Further, the first projection-exposing apparatus is provided with a variable aperture stop for varying the diameter of the illuminating light beam in the illuminating optical system, and has adjusting means for varying the coherence factor of the illuminating optical system from 0.1 to the order of 0.7 on the basis of at least one of the adjustment of the variable aperture stop and the interchange of the deflecting member.

A second projection-exposing apparatus according to the present invention is provided with an illuminating optical system for shaping illuminating light from a light source into a substantially uniform intensity distribution and applying said uniform illuminating light to a mask, a projection optical system for projecting the image of the mask pattern onto a photosensitive substrate, a deflecting member disposed on the light source side of the mask pattern with a predetermined spacing therefrom or the light source side of the conjugate surface of the mask pattern in the illuminating optical system for deflecting, when the illuminating light is incident, at least part of the incident light by a predetermined angle with respect to the mask pattern, and a driving member for moving the deflecting member in a predetermined direction or minutely rotating the deflecting member while the mask pattern is exposed onto the photosensitive substrate.

A third projection-exposing apparatus according to the present invention has a mask pattern comprised of a transmitting portion of which the transmittance to illuminating light is approximately 1, and a semi-transmitting portion which gives a phase difference of approximately $(2m+1)\pi$ (m being an integer) to the illuminating light passing through said transmitting portion and of which the transmittance to the illuminating light is ¼ or less of transmittance of the transmitting portion, and is provided with an illuminating optical system for shaping illuminating light from a light source into a substantially uniform intensity distribution and applying the uniform illuminating light to a mask, a projection optical system for projecting the image of the mask pattern onto a photosensitive substrate, and a deflecting member disposed on the light source side of the mask pattern with a predetermined spacing therefrom for deflecting, when the illuminating light is incident, deflecting at least part of said incident light by a predetermined angle relative to the mask pattern.

A fourth projection-exposing apparatus according to the present invention has an illuminating optical system for applying illuminating light from a light source to a mask, a projection optical system for projecting the image of the mask pattern onto a photosensitive substrate, driving means for moving the mask pattern and the photosensitive substrate relative to each other in a plane perpendicular to the optical axis of the projection optical system during exposure, and a stop member disposed on the light source side of the mask pattern or the conjugate surface thereof and in a plane spaced apart by a predetermined spacing or the conjugate surface of the mask pattern for prescribing the illuminated area of the mask pattern to a predetermined area smaller than the formation area of the mask pattern, and further the stop member has a diffraction grating pattern for causing, when the illuminating light is incident, at least a part of the incident light to be incident on the mask pattern at a predetermined angle with respect thereto.

As described above, according to the present invention, projection exposure of high resolving power and a great depth of focus equivalent to the deformed light source method can be realized without the illuminating optical system being improved. The principle of the present invention will hereinafter be described with reference to FIG. 10 of the accompanying drawings. FIG. 10 shows the manner in which illuminating light (principal ray) IL is incident on a reticle R at an angle $\phi$ with respect to the optical axis AX. Generally, a reticle pattern $RP_1$ includes many periodic patterns. Accordingly, from the reticle pattern $RP_1$ to which the illuminating light IL is applied, 0-order diffracted light component $D_0$ and ±1st-order diffracted light components $D_p$ and $D_m$ and higher-order diffracted light components are created in directions conforming to the degree of minuteness of the pattern. When at this time, inclined illumination as shown in FIG. 10 is effected, the diffracted light components of the respective orders created from the reticle pattern are created with a certain inclination (angular shift), as compared with a case where perpendicular illumination is effected.

Now, the illuminating light IL is diffracted by the reticle pattern $RP_1$ and creates 0-order diffracted light $D_0$ travelling in a direction inclined by $\phi$ with respect to the optical axis AX, +1st-order diffracted light $D_p$ travelling in a direction inclined by $\theta_p$ with respect to the 0-order diffracted light $D_0$, and −1st-order diffracted light $D_m$ travelling in a direction inclined by $\theta_m$ with respect to the 0-order diffracted light $D_0$. The illuminating light IL is incident on the reticle pattern $RP_1$ at an angle $\phi$ with respect to the optical axis AX of a projection optical system PL. Therefore, the 0-order diffracted light $D_0$ travels in a direction inclined by the angle $\phi$ with respect to the optical axis AX of the projection optical system. Accordingly, the +1st-order diffracted light $D_p$ travels in the direction of ($\theta_p+\phi$) with respect to the optical axis AX, and the −1st-order diffracted light $D_m$ travels in the direction of ($\theta_m-\phi$) with respect to the optical axis AX. When at this time, the pitch of the reticle pattern is $P_R$, the angles of diffraction $\theta_p$ and $\theta_m$ are represented by the following equations. It is to be understood here that both of the +1st-order diffracted light $D_p$ and the −1st-order diffracted light $D_m$ are passing through the pupil plane $E_p$ of the projection optical system PL.

$$\sin(\theta_p+\theta)-\sin\phi=\lambda/P_R \qquad (1)$$

$$\sin(\theta_m-\theta)+\sin\phi=\lambda/P_R$$

Now, if the angles of diffraction increase as the reticle pattern $RP_1$ becomes more minute, in FIG. 10, the +1st-order diffracted light $D_p$ travelling in the direction of the angle ($\theta_p+\phi$) cannot pass through the pupil plane Ep of the projection optical system PL. That is, when the reticle side numerical aperture of the projection optical system PL is $NA_R$, there is the relation that $\sin(\theta_p+\phi)>NA_R$. However, the illuminating light IL is incident while being inclined with respect to the optical axis AX and therefore, even at the angle of diffraction at this time, the −1st-order diffracted light $D_m$ becomes capable to be incident on the projection optical system PL. That is, the relation that $\sin(\theta_m-\phi)<NA_R$ is brought about.

Accordingly, an interference fringe by two light beams, i.e., the 0-order diffracted light $D_0$ and the −1st-order diffracted light $D_m$, is created on a wafer W. This interference fringe is the image of the reticle pattern $RP_1$. Accordingly, when the reticle pattern $RP_1$ is at a line and space of 1:1, it becomes possible to pattern the image of the reticle pattern $RP_1$ on the photoresist on the wafer W at a contrast of about 90%.

The resolution limit at this time is that when $\sin(\theta_m-\phi)=NA_R$. Accordingly, the pitch of the transferable minimum pattern on the reticle side is represented by the following equation:

$$P_R=\lambda/(NA_R+\sin\phi) \qquad (2)$$

If as an example, $\sin\phi$ is determined to the order of $0.5\times NA_R$, the minimum pitch of the transferable pattern on the reticle is represented by the following equation:

$$P_R=\lambda/(NA_R+0.5NA_R)=2\lambda/3NA_R \qquad (3)$$

On the other hand, in the case of the prior-art perpendicular illumination in which as described above, the light quantity distribution of the illuminating light on the pupil plane Ep is a circular area centering around the optical axis AX, the resolution limit has been $P_R\cong\lambda/NA_R$. Accordingly, it is seen that in the deformed light source method (the inclined illuminating method), a resolution higher than in the prior-art perpendicular illumination can be realized.

Thus, in the present invention, a deflecting member is provided on the incidence side of the illuminating light with a predetermined spacing relative to the reticle pattern. For example, a diffraction grating pattern is used as the deflecting member, and the diffraction grating pattern is formed on the glass surface of the reticle so that the direction of the period (pitch) of the pattern may substantially coincide with the direction of the pitch of the reticle pattern (See FIG. 1 of the accompanying drawings). At this time, it is necessary for the diffraction grating pattern RG1 to deflect (diffract) the illuminating light IL by an angle $\phi$ so that the illuminating light IL may be incident on the reticle pattern RP1 at an angle $\phi$ (an angle defined primarily from the pitch $P_R$ of the reticle pattern as is apparent from equation (2) above) with respect to the optical axis AX. Therefore, the pitch $P_G$ of the diffraction grating pattern RG1 is determined to the relation that $P_G=2\times P_R$.

As the result, even if the conventional perpendicular illumination is adopted, ±1st-order diffracted lights L1 and L2 are created at an angle of diffraction $\phi$ ($\sin\phi=\lambda P_G=\lambda/2P_R$) from the diffraction grating pattern RG1, and these diffracted lights L1 and L2 are applied to the reticle pattern RP1 at the angle $\phi$. Thus, 0-order diffracted light $D_0$ and 1st-order diffracted light $D_m$ created from the reticle pattern RP1 are incident on the pupil plane Ep of the projection optical system PL at an angle $\phi_0$ ($\sin\phi_0=\lambda/P_R=2\sin\phi$). In other words, the 0-order diffracted light $D_0$ and the 1st-order diffracted light $D_m$ are created with the angles thereof relative to the optical axis AX (angles of emergence) being $\phi$. Accordingly, pattern transfer of high resolution becomes possible.

The ±1st-order diffracted lights L1 and L2 from the diffraction grating pattern RG1 are inclined symmetrically with respect to the optical axis AX and are applied to the reticle pattern RP1. Therefore, where for example, the reticle pattern RP1 is a one-dimensional line and space pattern, the illumination distribution on the pupil plane Ep of the projection optical system PL, i.e., the illuminations on two partial areas through which the diffracted light from the reticle pattern RP1 passes, can be made substantially equal. Particularly, when the diffraction grating pattern RG1 is a phase type diffraction grating and is optimized under a exposure wavelength $\lambda$ and a pitch $P_G$, the creation of 0-order light from the diffraction grating pattern RG1 can be prevented. That is, only ±1st-order diffracted lights L1 and L2 are created from the diffraction grating pattern RG1 and in principle, this is entirely equal to the deformed light source method (inclined illuminating method). On the other hand, when the creation of 0-order light is left, all diffracted lights including the 0-order light illuminate the reticle pattern and there is obtained the effect of apparently increasing the coherence factor ($\sigma$ value) of the illuminating optical system.

Description will now be briefly made of the reason why the depth of focus is made great by a method of applying illuminating light to a reticle pattern at a particular angle of incidence to thereby form an imaged pattern on a wafer by the use of a 0-order diffracted light component and a 1st-order diffracted light component.

When as shown in FIG. 10 of the accompanying drawings, a wafer W is coincident with the focal position of the projection optical system PL (the best imaging plane), the diffracted light components leaving a point in the reticle pattern RP1 and arriving at a point on the wafer W have equal optical path lengths even if they pass through any portion of the projection optical system PL. Therefore, even when the 0-order diffracted light component passes through substantially the center of the pupil plane Ep of the projection optical system PL (the vicinity of the optical axis) as in the prior art, the optical path lengths of the 0-order diffracted light component and the other diffracted light components are equal and the wave surface aberrations thereof are zero.

However, in the case of a defocus state in which the wafer W is not coincident with the focal position of the projection optical system PL, the optical path lengths of high-order diffracted light components which are obliquely incident are short forwardly of the focus (in the direction away from the projection optical system PL) relative to the 0-order diffracted light component passing through the vicinity of the optical axis and is long rearwardly of the focus (in the direction toward the projection optical system PL), and the difference therebetween conforms to the difference between the angles of incidence. Thus, the 0-order, ±1st-order, . . . diffracted light components mutually form a wave surface aberration and create blur before and behind the focal position.

The wave surface aberration by the afore-described defocus is an amount given by $\Delta F r^2/2$, where $\Delta F$ is the amount of deviation of the wafer from the focal position, and r (=sin $\theta w$) is the sine of the angle of incidence $\theta w$ when each diffracted light component is incident on the − (negative) side. At this time, r represents the distance of each diffracted light component from the optical axis AX on the pupil plane Ep. In the prior-art projection-exposing apparatus (stepper), 0-order diffracted light $D_0$ passes through the vicinity of the optical axis AX and therefore, r(0-order)=0. On the other hand, as regards ±1st-order diffracted lights $D_p$ and $D_m$, r(1st-order)=M·$\lambda/P_R$ (M being the imaging magnification of the projection optical system). Accordingly, the wave surface aberration of the 0-order diffracted light $D_0$ and ±1st-order diffracted lights $D_p$, $D_m$ by the defocus is $\Delta F \cdot M^2(\lambda/P_R)^2/2$.

On the other hand, in the projection-exposing apparatus according to the present invention, the 0-order diffracted light component $D_0$ is created in a direction inclined by an angle $\phi$ from the optical axis AX and therefore, the distance of the 0-order diffracted light component on the pupil plane Ep from the optical axis AX is r(0-order)=M·sin $\phi$. Further, the distance of the −1st-order diffracted light component on the pupil plane from the optical axis is r(−1st-order)=M·sin $(\theta_m-\phi)$. If at this time, sin $\phi$=sin$(\theta_m-\phi)$, the relative wave surface aberration of the 0-order diffracted light component $D_0$ and −1st-order diffracted light component $D_m$ by the defocus becomes zero and thus, the image blur of the pattern RP1 will not occur so greatly as in the prior art even if the wafer W somewhat deviates from the focal position in the direction of the optical axis. That is, the depth of focus will increase. Also, as shown in equation (2) above, sin$(\theta_m-\phi)$+ sin $\phi=\lambda/P_R$ and therefore, if the angle of incidence $\theta$ of the illuminating light beam IL onto the reticle R is defined in the relation that sin $\phi=\lambda/2P_R(=\lambda/P_G)$ relative to the pattern of a pitch $P_R$, it will be possible to greatly increase the depth of focus. In the present invention, as described above, the relation that sin $\phi=\lambda/2P_R$ is achieved by the deflecting member and thus, a great depth of focus is obtained.

Thus, according to the present invention, a deflecting member is simple disposed on the light source side of a mask pattern with a predetermined spacing relative thereto, whereby without improving the prior-art projection-exposing apparatus in any way, projection exposure of a high resolution and a great depth of focus equivalent to the deformed light source method becomes possible. Also, even when a plurality of periodic patterns differing in pitch exist in one and the same mask or the directions of the periods thereof differ from each other, a deflecting member optimum for each pattern is simply provided in proximity to the mask pattern, whereby it becomes possible to optimize the illuminating condition for each pattern (i.e., the angle of incidence of illuminating light onto the mask). Further, there is the advantage that unlike a phase shift reticle, the deflecting member is easy to manufacture and the influence of the defect thereof is very small and projection exposure of a higher resolution becomes possible. Particularly, in the first projection-exposing apparatus of the present invention, projection exposure of a high resolution and a great depth of focus equivalent to the deformed light source method can be realized by an illuminating system of a small coherence factor, and the illuminating optical system becomes inexpensive and easy to manufacture and the costs of the projection-exposing apparatus are reduced.

Further, in the second projection-exposing apparatus of the present invention, the deflecting member is moved and/or minutely rotated during exposure. Therefore, the image of any defect, foreign substance or the like on the deflecting member projected onto a photosensitive substrate is moved and averaged relative to the photosensitive substrate during exposure, and the image of the defect, foreign substance or the like will not be transferred to the photosensitive substrate. Particularly, when the deflecting member is moved in the direction of the optical axis of the projection optical system, interference fringe created by the multiplex reflection between the mask and the deflecting member, namely, illumination irregularity on the pattern surface of the mask, can be averaged and the uniformity of illumination can be further improved. Also, since projection exposure of a high resolution and a great depth of focus equivalent to the deformed light source method is possible irrespective of the presence or absence of any defect, foreign substance or the like on the deflecting member, the manufacturing and inspection costs of the deflecting member can be reduced.

Also, in the third projection-exposing apparatus of the present invention, use is made of a phase shift reticle of the so-called half tone type comprised of a transmitting portion and a semi-transmitting portion. In the half tone type, if the transmittance of the semi-transmitting portion is varied, the intensities of diffracted lights created from the reticle pattern and the ratio thereof can be varied. Therefore, it becomes possible to give the semi-transmitting portion an optimum transmittance in conformity with the degree of minuteness (pitch and line width) of the reticle pattern, thereby realizing an optimum imaging state for each pattern, that is, optimizing the intensity ratio between 0-order diffracted light and 1st-order diffracted light. Accordingly, projection exposure of a high resolution and a great depth of focus equivalent to the deformed light source method is possible and the contrast of the projected image of the reticle pattern can be improved. Also, the phase shift reticle of the half-tone type, as compared with a phase shift reticle of the spatial frequency modulation type or the edge emphasis type, is markedly simple in manufacturing steps such as patterning and deflect inspection and is equivalent to the reticle of the conventional type, and yet is substantially equal to a phase shift reticle in the improvement effect of the resolution and depth of the focus.

Further, in the fourth projection-exposing apparatus of the present invention, even if it is of the scanning exposure type, projection exposure of a high resolution and a great depth of focus equivalent to the deformed light source method becomes possible. Particularly, in a projection-exposing apparatus provided with a projection optical system of the reflection type in which the illuminated area of the reticle pattern is arcuate, it is difficult to apply the deformed light source method by improving the illuminating optical system and therefore the present invention is very effective. Also, in a projection-exposing apparatus provided with a projection optical system of the reflection type or the reflection-refraction type in which exposure wavelength may be of a relatively wide band, the present invention which is suited for illuminating light of a wide band can be easily applied.

BRIEF DESCRIPTION OF THE DRAWINGS

FIGS. 4A, 4B and 4C illustrate modifications of the reticle according to the first embodiment.

FIG. 15 shows a light intercepting zone for cutting the half shadow blur of FIG. 14, and a movable light intercepting portion.

DETAILED DESCRIPTION OF THE PREFERRED EMBODIMENTS

Figure 1:
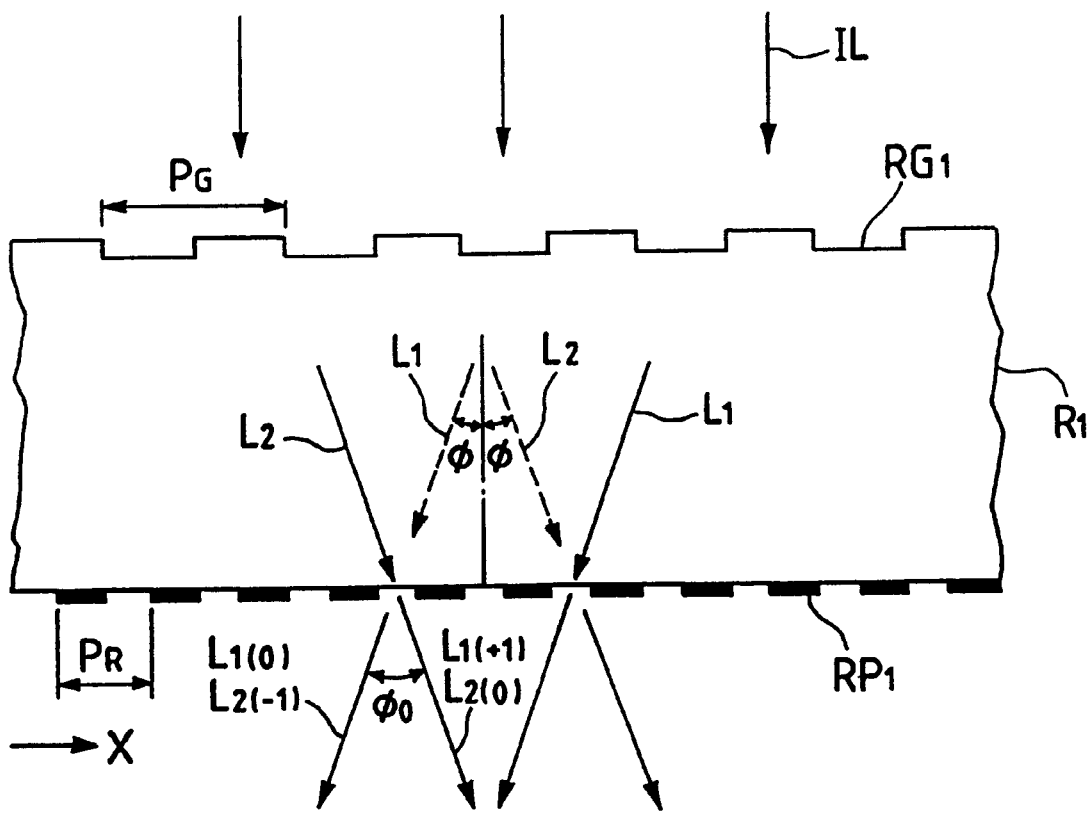
FIG. 1 schematically illustrates the construction of a reticle according to a first embodiment of the present invention.

FIG. 1 is a schematic view showing the construction of a photo-mask (reticle) according to a first embodiment of the present invention. In the present embodiment, description will be made on the premise that this reticle R1 is applied to a projection-exposing apparatus.

In FIG. 1, the reticle R1 has a one-dimensional line and space pattern RP1 formed on one surface of a transparent substrate having two surfaces substantially parallel to each other and a one-dimensional diffraction grating pattern (deflecting member) RG1 formed on the other surface of the transparent substrate. Accordingly, the line and space pattern (reticle pattern) RP1 and the diffraction grating pattern RG1 are disposed in substantially parallel opposed relationship with each other. The transparent substrate is a substrate substantially transparent to an exposure wavelength $\lambda$, for example, a glass substrate such as quartz. Also, it is to be understood that the reticle pattern RP1 is formed of a light intercepting material such as chormium attached to the substrate and the diffraction grating pattern RG1 is a phase type diffraction grating of a duty ratio 1:1.

Further, the diffraction grating pattern RG1 is formed such that the direction of the period (pitch) thereof substantially coincides with the direction of the pitch of the reticle pattern RP1 (in FIG. 1, X direction) and the pitch $P_G$ thereof is determined in the relation that $P_G=2P_R$. Also, in the present embodiment, the phase type diffraction grating is used and therefore, when the refractive index of the reticle R1 is n, the depth d of grooves in the diffraction grating is determined as shown by the following equation. The phase type diffraction grating can be formed, for example, by etching a reticle (transparent substrate).

$$d(n-1)=\lambda/2 \quad (4)$$

Figure 3:
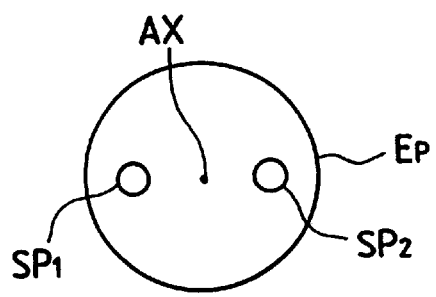
FIG. 3 represents the illumination distribution on the pupil plane of a projection optical system during the exposure of the reticle shown in FIG. 1.

Thus, when exposure light (such as i line or KrF excimer laser) IL is incident on the diffraction grating pattern RG1 perpendicularly thereto, only ±1st-order diffracted lights L1 and L2 are created from the diffraction grating pattern RG1. Further, the ±1st-order diffracted lights L1 and L2 are symmetrically incident on the reticle pattern RP1 at an angle $\phi$ (sin $\phi=\lambda/P_G$) with respect to each other relative to a direction perpendicular to the reticle R1 (the direction of the optical axis of a projection optical system). As a result, one of the ±1st-order diffracted lights and 0-order diffracted light created from the reticle pattern RP1 pass through two partial areas SP1 and SP2 substantially equidistant from the optical axis AX of the projection optical system in or near a Fourier transformation plane (hereinafter referred to as the pupil plane of the projection optical system) Ep for the reticle pattern in the projection optical system (see FIG. 3). That is, an illuminated state equivalent to the deformed light source method is brought about and a high resolution and a great depth of focus are obtained.

At this time, paying attention to a point on the reticle pattern RP1 in FIG. 1, 0-order diffracted light L1(0) by the diffracted light L1 and −1st-order diffracted light L2(−1) by the diffracted light L2 are created in the same direction from the pattern RP1 and also, +1st-order diffracted light L1(+1) by the diffracted light L1 and 0-order diffracted light L2(0) by the diffracted light L2 are created in the same direction. This is because the ±1st-order diffracted lights L1 and L2 are symmetrically inclined and applied to the reticle pattern RP1. Accordingly, the illumination distribution on the puil plane Ep of the projection optical system, i.e., the illuminations of the partial area through which the diffracted lights L1(0) and L2(−1) pass (for example, SP1 in FIG. 3) and the partial area through which the diffracted lights L1(+1) and L2(0) pass (for example, SP2 in FIG. 3) become substantially equal, whereby sag or the like will not occur in a resist image.

The duty ratio of the diffraction grating pattern RG1 may be arbitrary, but may preferably be determined to 1:1 in preventing the creation of high-order diffracted lights. Also, the diffraction grating pattern RG1 may be a two-dimensional periodic pattern, and in such case, it can be formed so that the pitch with respect to one direction and that direction may satisfy the above-mentioned condition.

Further, the diffraction grating pattern RG1 may have only its pitch $P_G$ and the direction of the pitch accurately set relative to the reticle pattern RP1 so as to satisfy the above-mentioned condition. Accordingly, the diffraction grating pattern RG1 may relatively shift (positionally deviate) in XY plane relative to the reticle pattern RP1. However, it is necessary that as a matter of course, the relative rotation error be made nearly zero in order to make the pitch directions of the two patterns coincident with each other. From what has been described, it will be seen that during the manufacture of a reticle, the diffraction grating pattern RG1 can be formed without strict alignment being done and the manufacture of a reticle of the above-described construction is easy.

As an example, when a reticle formed with a diffraction grating pattern RG1 of a pitch $P_G=7$ μm which satisfied the above equation (4) for a reticle pattern RP1 of a pitch $P_R=3.5$ μm was exposed onto a silicon substrate having positive resist as thick as 1.2 μm applied thereto, by the use of an i-line stepper (the numerical aperture NA of a projection optical system being NA=0.5, the coherence factor σ of an illuminating optical system being σ=0.3, and the projection magnification M of the projection optical system being M=⅕) to thereby form a line and space pattern of a pitch 0.7 μm (the minimum line width 0.35 μm), a depth of focus of about 2.5 μm could be obtained. In contrast, when a reticle having not the diffraction grating pattern RG1 was exposed under similar conditions, a depth of focus of about 1.0 μm could only be obtained.

Figure 2:
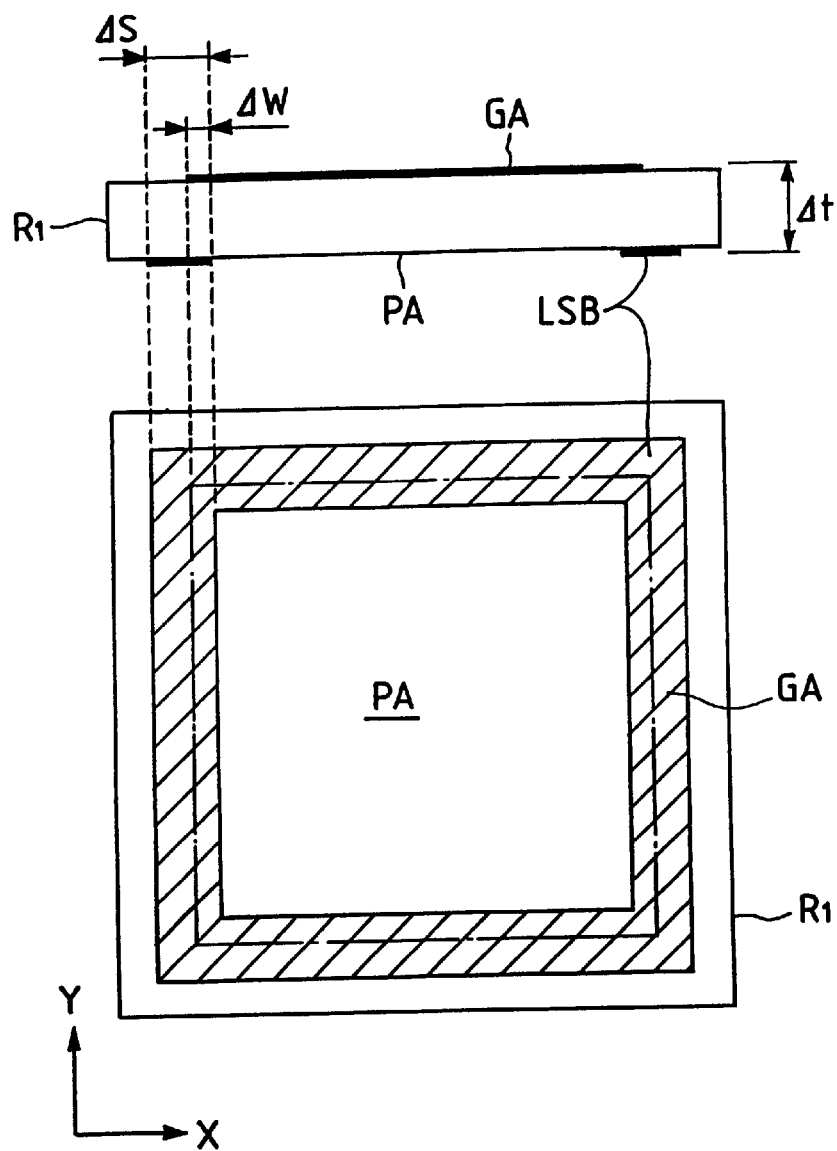
FIG. 2 is a view used for the illustration of the formation condition of the reticle according to the present invention.

Conditions under which the reticle according to the present embodiment is formed will now be described with reference to FIG. 2. FIG. 2 shows the entire construction of the reticle shown in FIG. 1 as it is seen from the side and upper surface thereof. As shown in FIG. 2, a light intercepting zone (chromium or the like) LSB of a predetermined width ΔS is formed on the pattern surface (lower surface) of the reticle, and a reticle pattern RP1 (not shown) is formed in a pattern area PA surrounded by the light intercepting zone LSB.

Now, in the present embodiment, a diffraction grating pattern RG1 (in FIG. 2, the formation area GA thereof is shown) is formed on the glass surface of the reticle R1. However, the spacing Δt between the reticle pattern RP1 and the diffraction grating pattern RG1 (which in the present embodiment, corresponds to the thickness of the reticle R1) with respect to a direction perpendicular to the reticle R1 (the direction of the optical axis of the projection optical system) may preferably be narrow. This is for eliminating the influence or the like of the half shadow blur of the diffraction grating pattern RG1. So, description will hereinafter be made of the spacing Δt (the minimum value) for realizing inclined illumination to the reticle pattern.

Under the angle of incidence $NA_0$ ($=\sin\phi$) of illuminating light (±1st-order diffracted lights) to the reticle pattern RP1 and the numerical aperture $NA_{IL}$ of the illuminating optical system, the maximum and minimum angles of incidence (sine) $NA_1$ and $NA_2$ of the illuminating light to the reticle pattern RP1 are represented by the following equations:

$$NA_1 = NA_0 - NA_{IL} \tag{5}$$

$$NA_2 = NA_0 + NA_{IL}$$

Now, the optical path differences $k_1$ and $k_2$ of the lights of the angles of incidence $NA_1$ and $NA_2$ from the light passing through the vicinity of the optical axis under the spacing (corresponding to the defocus amount) t are represented by the following equations:

$$k_1 = \Delta t \cdot NA_1^2 / 2 \tag{6}$$

$$k_2 = \Delta t \cdot NA_2^2 / 2$$

Accordingly, if the difference between the optical path differences $k_1$ and $k_2$ is longer than the order of the exposure wavelength λ, the image contrast of the diffracting grating pattern RG1 will become approximately zero. That is, it will suffice if the following equation is satisfied:

$$k_2 - k_1 = \Delta t (NA_2^2 - NA_1^2)/2 \geq \lambda \tag{7}$$

Here, the following equation is obtained from the above equation (5):

$$NA_2^2 - NA_1^2 = 4 NA_0 \cdot NA_{IL} \tag{8}$$

Also, since $P_G \cdot NA_0 = \lambda$ holds good, the above equation (7) is represented as follows:

$$2\Delta t \cdot (\lambda/P_G) \cdot NA_{IL} \geq \lambda \tag{9}$$

Thus, the spacing Δt between the pattern surface of the reticle R1 and the surface on which the diffraction grating pattern RG1 is formed (in the present embodiment, the glass surface) can satisfy the following expression:

$$\Delta t \geq P_G / 2 NA_{IL} \tag{10}$$

When the spacing (reticle thickness) Δt is to be determined, the flexure of the reticle by the grating thereof may preferably be taken into account with the above expression (10). This is because if the reticle flexes, distortion will occur to the projected image of the reticle pattern.

Also, in FIG. 2, the formation area GA of the diffraction grating pattern RG1 is defined so as to be larger by ΔW than the pattern are PA in each of X and Y directions (but it is to be understood that the reticle pattern RP1 is formed on the entire surface of the area PA). This, as is apparent from FIG. 1, is for making the ±1st-order diffracted lights L1 and L2 symmetrically applied over all of the formation area of the reticle pattern RP1. Accordingly, the size (the formation area GA) of the diffraction grating pattern RG1 may preferably be determined so that said ΔW may satisfy the relational expression that ΔW>Δt×tan φ.

Further, the light intercepting zone LSB may preferably be formed so that the width ΔS thereof may satisfy the relational expression that $\Delta S \geq 2 \times \Delta W$. This is for preventing the light diffracted by the diffraction grating pattern RG1 from passing through the outside of the light intercepting zone LSB.

Modifications of the present embodiment will now be described briefly with reference to FIGS. 4A–4C.

FIGS. 4A shows a reticle having a discrete transparent substrate (a glass substrate such as quartz) GP1 integrally fixed to the glass surface (diffraction grating pattern RG1) side of the reticle R1 (FIG. 1), and this reticle can obtain the effect that foreign substances or the like can be prevented from adhering to the surface on which the diffraction grating pattern RG1 is formed, or said surface can be prevented from being injured. Also, there is the advantage that if for example, the transparent substrate GP1 is made thick to such a degree that the reticle R1 and the transparent substrate GP1 do not generally flex, the thickness of the reticle R1, i.e., the spacing Δt, can be determined to a value (minimum value) of $\Delta t = P_{PG}/2 NA_{IL}$.

FIGS. 4B and 4C show reticles in which a diffraction grating pattern RG1 is formed on transparent substrates GP2, GP3 discrete from a reticle $R_0$ and the reticle $R_0$ and each of the transparent substrates GP2, GP3 are integrally fixed at a predetermined interval. In any of FIGS. 4B and 4C, the spacing Δt can be determined so as to satisfy the above expression (10). Also, here, the reticle $R_0$ and each of the transparent substrates GP2, GP3 are spaced apart by a predetermined amount, but alternatively, these may be fixed in intimate contact with each other.

In FIG. 4B, provision may further be made of a transparent substrate GP1 (dotted line) for preventing the adherence of foreign substances similar to that in FIG. 4A. In FIG. 4C, the diffraction grating pattern RG1 is formed on the lower surface (the surface adjacent to the reticle) of the transparent substrate GP3 and thus, the transparent substrate GP3 itself prevents the adherence of foreign substances. Also, the transparent substrate for preventing the adherence of foreign substances shown in FIGS. 4A and 4B may be conventional foreign substance adherence preventing film, i.e., so-called pellicle. Further, the transparent substrate GP1 may be fixed to the reticle R1 or the transparent substrate GP2 through a pellicle frame in which the pellicle is extended.

Figure 5A:
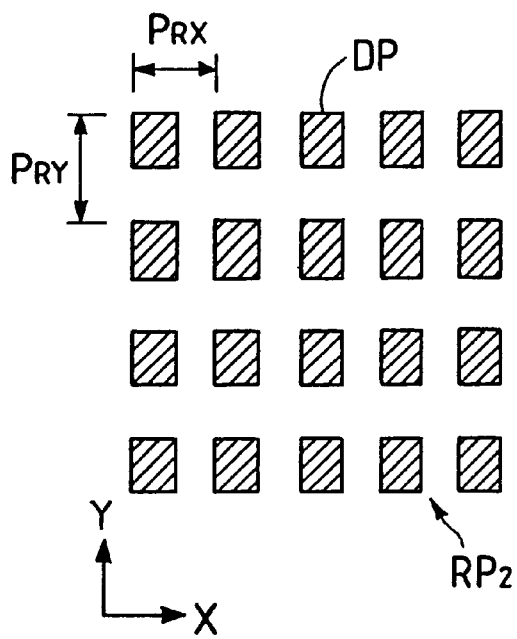
FIGS. 5A, 5B and 5C schematically illustrate the contruction of a reticle according to a second embodiment of the present invention.

A second embodiment of the present invention will now be described with reference to FIGS. 5A–5C. In this embodiment, description will be made of a case where a two-dimensional periodic pattern is used as a reticle pattern. In FIG. 5A, a reticle pattern RP2 is such that rectangular patterns (grating elements) DP formed of a light intercepting material are repetitively arranged on one surface of a reticle (transparent substrate) at pitches $P_{RX}$ and $P_{RY}$ in X and Y directions. Also, a two-dimensional diffraction grating pattern RG2 (of which the duty ratio is 1:1) as a deflecting member is formed on the glass surface of the reticle.

A diffraction grating pattern RG2 is such that rectangular patterns PS formed of a phase shifting material (such as SOG) for shifting the phase of transmitted light by a predetermined amount in conformity with the film thickness thereof are repetitively arranged at pitches $P_{GX}$ and $P_{GY}$ in X and Y directions. In other words, it is such that the rectangular patterns (phase shift portions) PS and light transmitting portions (naked surface portions of the substrate) are arranged in a checked pattern. Further, the diffraction grating pattern RG2 is formed such that the direction of the period thereof substantially coincides with the directions of the period of the reticle pattern RP2 (in the figures, X and Y directions), and the lengths of the respective sides of each rectangular pattern PS in X and Y directions are $P_{RX}$ and $P_{RY}$. Here, the pitches $P_{GX}$ and $P_{GY}$ are determined in the relations that $P_{GX}=2P_{RX}$ and $P_{GY}=2P_{RY}$. Also, in the present embodiment, use is made of a phase shifting material and therefore, the film thickness of the rectangular patterns (phase shifting material) (which corresponds to the depth d of the grooves in the first embodiment) may preferably be determined so as to satisfy the above equation (4). If the above equation (4) is satisfied, the phase of the light transmitted through the phase shift portions will shift by $\pi$ relative to the phase of the light passing through the light transmitting portions and only ±1st-order diffracted lights will be created from the diffraction grating pattern RG2.

Figure 5B:
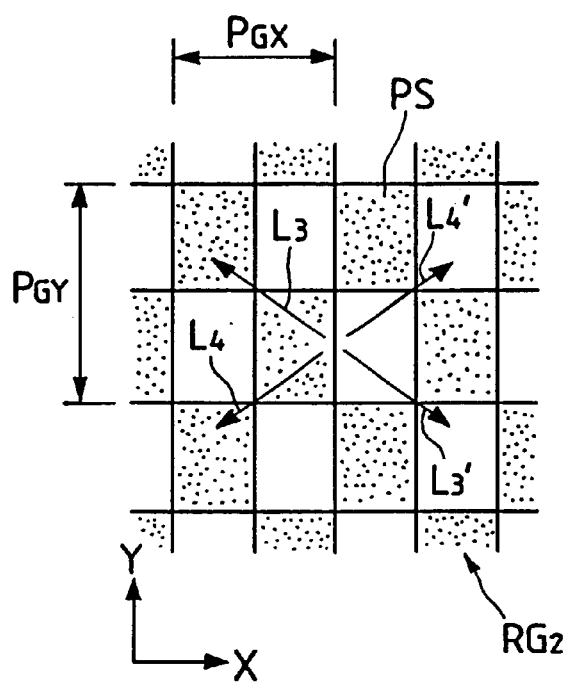
Figure 5C:
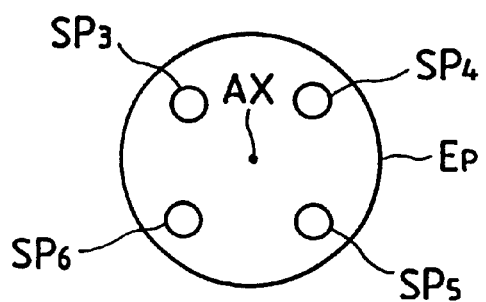

When thereby, exposure light IL is applied to the diffraction grating pattern RG2 substantially perpendicularly thereto, only two sets of ±1st-order diffracted lights (L3, L3') and (L4, L4') are created with respect to each of X and Y directions from the diffraction grating pattern RG2, as shown in FIG. 5B. Further the two sets of ±1st-order diffracted lights are symmetrically incident on the reticle pattern RP2 at an angle $\phi$ (sin $\phi=\lambda/P_G$) with respect to a direction perpendicular to the reticle (the direction of the optical axis of the projection optical system). Here, the exposure wavelength $\lambda$ originally becomes $\lambda'=\lambda/n$ due to the refractive index n of the transparent substrate, but here it is shown as it is converted in the air. As a result, one of the ±1st-order diffracted light and 0-order diffracted light created from the reticle pattern RP2 pass through four partial areas SP3–SP6 substantially equidistant from the optical axis AX of the projection optical system (see FIG. 5C). That is, a high resolution and a great depth of focus are obtained. At this time, the illuminations of the four partial areas SP3–SP6 are substantially equal.

Although the duty ratio of the diffraction grating pattern RG2 may be arbitrary, it may preferably be determined to 1:1 in preventing the creation of high-order diffracted lights. The other formation conditions of the diffraction grating pattern RG2, for example, the spacing between it and the reticle pattern RP2, the size of the formation area thereof and the width of the light intercepting zone provided on the pattern surface are entirely similar to those in the first embodiment and therefore need not be described here.

As an example, when a reticle on which was formed a diffraction grating pattern RG2 of pitches $P_{GX}=6$ μm and $P_{GY}=8$ μm satisfying the above equation (4) relative to a reticle pattern RP2 of pitches $P_{RX}=3$ μm and $P_{RY}=4$ μm was exposed onto a silicon substrate having positive resist as thick as 1.2 μm applied thereto, by the use of an i-line stepper entirely similar to that in the first embodiment, to thereby form a repetitive pattern (of which the minimum line width was 0.3 μm×0.4 μm) of a pitch of 0.6 μm×0.8 μm, there could be obtained a depth of focus of about 1.5 μm. In contrast, when a reticle having not the diffraction grating pattern RG2 was exposed under similar conditions, there was only obtained a depth of focus of about 0.6 μm.

Figure 6:
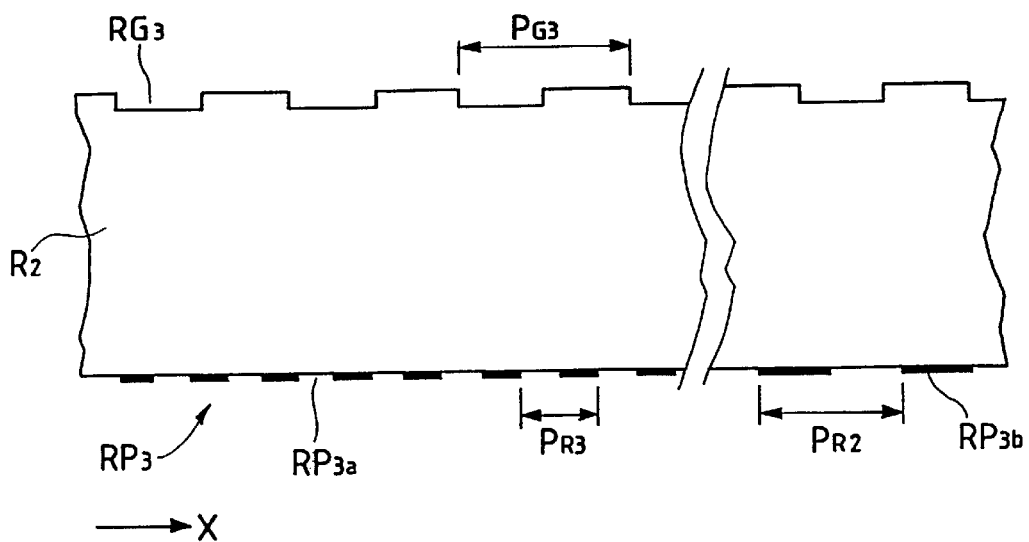
FIG. 6 schematically illustrates the construction of a reticle according to a third embodiment of the present invention.

A third embodiment of the present invention will now be described with reference to FIG. 6. In this embodiment, description will be made of a case where use is made of a reticle pattern RP3 comprising a plurality of (in FIG. 6, two) one-dimensional line and space pattern groups differing in pitch from each other. In FIG. 6, as the reticle pattern RP3, there are formed two sets of one-dimensional line and space pattern groups RP3a and RP3b arranged at pitches $P_{R2}$ and $P_{R3}$ ($P_{R2}>P_{R3}$) in X direction, on one surface of a reticle (transparent substrate) $R_2$, by a light intercepting material. Also, a one-dimensional diffraction grating pattern RG3 (of which the duty ratio is 1:1) as a deflecting member is formed at a pitch $P_{G3}$ in X direction on the glass surface of the reticle $R_2$.

The diffraction grating pattern RG3 is formed such that the direction of the period thereof substantially coincides with the direction of the period of the reticle pattern RP3 (in FIG. 6, X direction), and the pitch $P_{G3}$ thereof is determined to the relation that $P_{G3}=2P_{R3}$. The diffraction grating pattern RG3 may be a phase type diffraction grating or may be formed of a phase shifting material. Here, it is to be understood that the diffraction grating pattern RG3 is a phase type diffraction grating and satisfies the above equation (4). Thus, only ±1st-order diffracted lights are created from the diffraction grating pattern RG3.

As a result, as in the first embodiment, the ±1st-order diffracted lights created from the diffraction grating pattern RG3 are symmetrically incident on the reticle pattern RP3 at an angle $\phi$ (sin $\phi=\lambda/P_{G3}$) with respect to a direction perpendicular to the reticle $R_2$ (the direction of the optical axis of the projection optical system. That is, a high resolution and a great depth of focus are obtained.

In the present embodiment, the pitch $P_{G3}$ is determined to the relation that $P_{G3}=2P_{R3}$. Therefore, the optimization of the inclined illuminating condition (the angle of incidence $\phi$) of the illuminating light is not effected for the line and space pattern group $RP_{3b}$, yet a sufficiently high resolution and a great depth of focus are also obtained in the pattern group $RP_{3b}$.

For example, on the reticle, a plurality of one-dimensional line and space pattern groups of different pitches of 2.5 μm to 5 μm and the diffraction grating pattern RG3 are optimized for the line and space pattern group of a pitch of 3 μm, that is, the pitch $P_{G3}$ thereof is determined to 6 μm. Further, when exposure was done by an i-line stepper entirely similar to that in the first embodiment, even a line and space pattern group of a pitch of 0.56 μm could be formed on a wafer. That is, the limit resolution was improved to 0.28 μm (line width). In contrast, the limit resolution when a reticle having not the diffraction grating pattern RG3 was exposed under similar conditions was only 0.35 μm.

In the present embodiment, for a plurality of line and space pattern groups, the pitch $P_{G3}$ of the diffraction grating pattern RG3 is optimized with respect only to a particular pattern group, that is, the pitch $P_{G3}$ is determined to only one value. However, a plurality of diffraction grating patterns (deflecting members) of which the pitch (and the direction of the pitch) has been optimized correspondingly to each of the plurality of line and space pattern groups may be formed, for example, on the glass surface of the reticle. As a result, the pitch of the diffraction grating patterns and the direction of the pitch are optimized for all pattern groups. While the present embodiment has been described with respect to one-dimensional line and space patterns, it can be equally applied to two-dimensional periodic patterns.

Figure 7A:
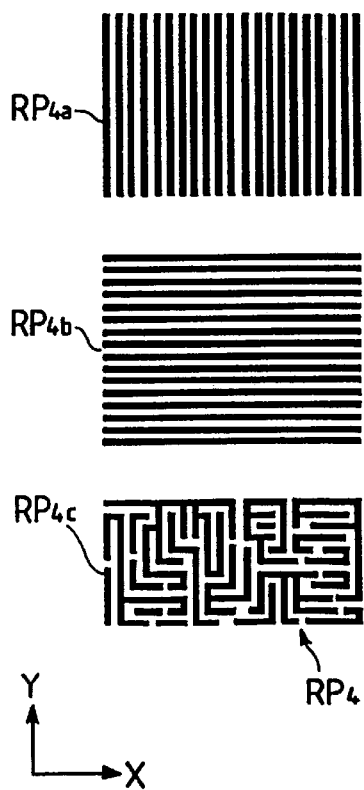
FIGS. 7A and 7B schematically illustrate the construction of a reticle according to a fourth embodiment of the present invention.
Figure 7B:
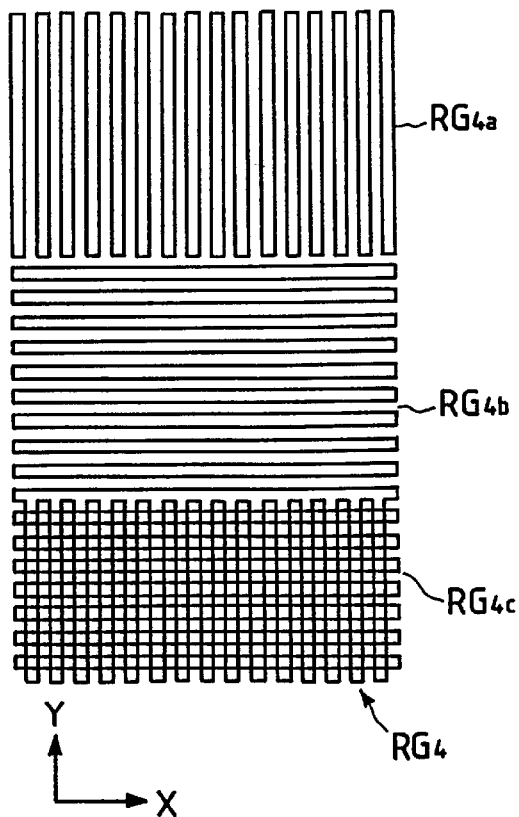

A fourth embodiment of the present invention will now be described with reference to FIGS. 7A and 7B. In this embodiment, description will be made of a case where use is made of a reticle pattern RP4 comprising a plurality of (in FIG. 7A, three) periodic patterns RP4a–RP4c differing in periodicity from one another. In FIG. 7A, as the reticle pattern RP4, there are formed two sets of one-dimensional line and space pattern groups RP4a and RP4b arranged at predetermined pitches in X and Y directions and a two dimensional periodic pattern group RP4c on one surface of a reticle (transparent substrate) by a light intercepting material. Also, as shown in FIG. 7B, on the glass surface of the reticle, two sets of one-dimensional diffraction grating patterns RG4a and RG4b and a two-dimensional diffraction grating pattern (checked pattern) RG4c are formed correspondingly to the three sets of periodic pattern groups RP4a–RP4c. In the present embodiment, the three sets of diffraction grating patterns RG4a–RG4c (of which the duty ratio is 1:1) provide a diffraction grating pattern RG4 as a deflecting member.

Also, respective ones of the periodic pattern groups RP4a, RP4b, RP4c and respective ones of the diffraction grating patterns RG4a, RG4b, RG4c are provided in substantially parallel and opposed relationship with each other with the reticle (transparent substrate) interposed therebetween. Further, each of the diffraction grating patterns RG4a, RG4b, RG4c is formed such that the direction of the period thereof substantially coincides with the direction of the period of each of the periodic patterns RP4a, RP4b, RP4c, and the pitch thereof is determined to double the pitch of each of the periodic patterns. The diffraction grating patterns RG4a, RG4b, RG4c may be phase type diffraction gratings or may be formed of a phase shifting material. It is to be understood here that they are phase type diffraction gratings and satisfy the above equation (4). Again in the present embodiment, as in the above-described embodiments, inclined illumination optimized for each of the periodic patterns RP4a, RP4b, RP4c can be effected and a high resolution and a great depth of focus are obtained.

Figure 8A:
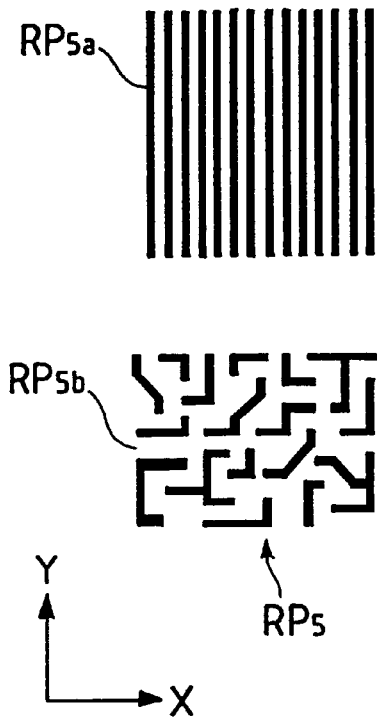
FIGS. 8A and 8B schematically illustrate the construction of a reticle according to a fifth embodiment of the present invention.
Figure 8B:
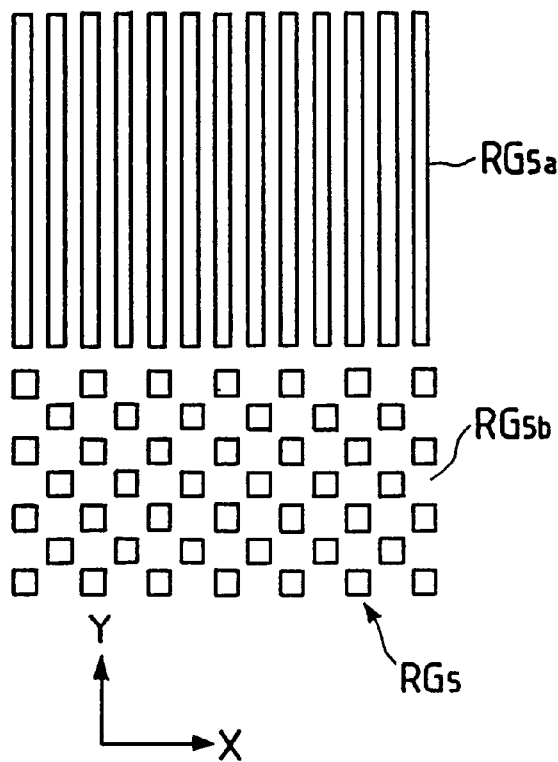

A fifth embodiment of the present invention will now be described with reference to FIGS. 8A and 8B. In this embodiment, as shown in FIG. 8A, a one-dimensional line and space pattern group RP5a arranged at a minute pitch (e.g. of the order of 3 μm) in X direction and a two-dimensional pattern RP5b of a relatively rough pitch are formed as a reticle pattern RP5. On the other hand, as shown in FIG. 8B, on the glass surface of the reticle, a one-dimensional phase type diffraction grating pattern RG5a (of which the duty ratio is 1:1) optimized for the periodic pattern group RP5a and a two-dimensional phase type diffraction grating pattern RG5b (of which the duty ratio is e.g. 1:3) corresponding to the two-dimensional pattern RP5b which is small in the effect by inclined illumination are formed as a diffraction grating pattern (deflecting member) RG5.

Also, respective ones of the reticle patterns RP5a, RP5b and respective ones of the diffraction grating patterns RG5a, RG5b are provided in substantially parallel and opposed relationship with each other with the reticle (transparent substrate) interposed therebetween. Further, it is to be understood that the diffraction grating pattern RG5a is formed such that the direction of the period thereof substantially coincides with the direction of the period of the periodical pattern RP5a, and the pitch thereof is determined to double the pitch of the periodic pattern RG5a and satisfies the above equation (4).

Figure 9:
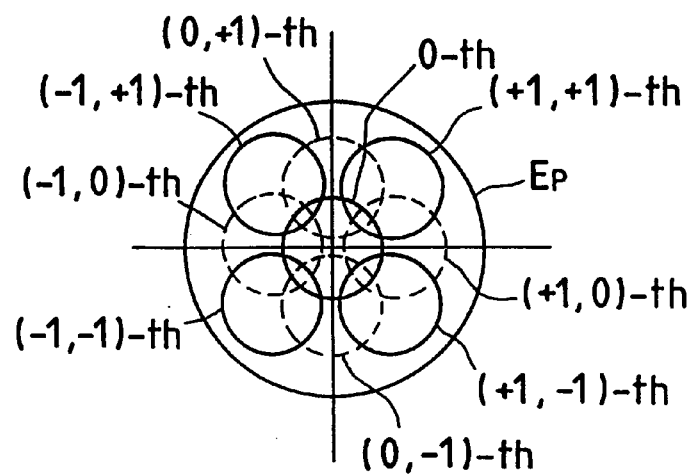
FIG. 9 represents the illumination distribution on the pupil plane of a projection optical system during the exposure of the reticle shown in FIG. 8.
Figure 10:
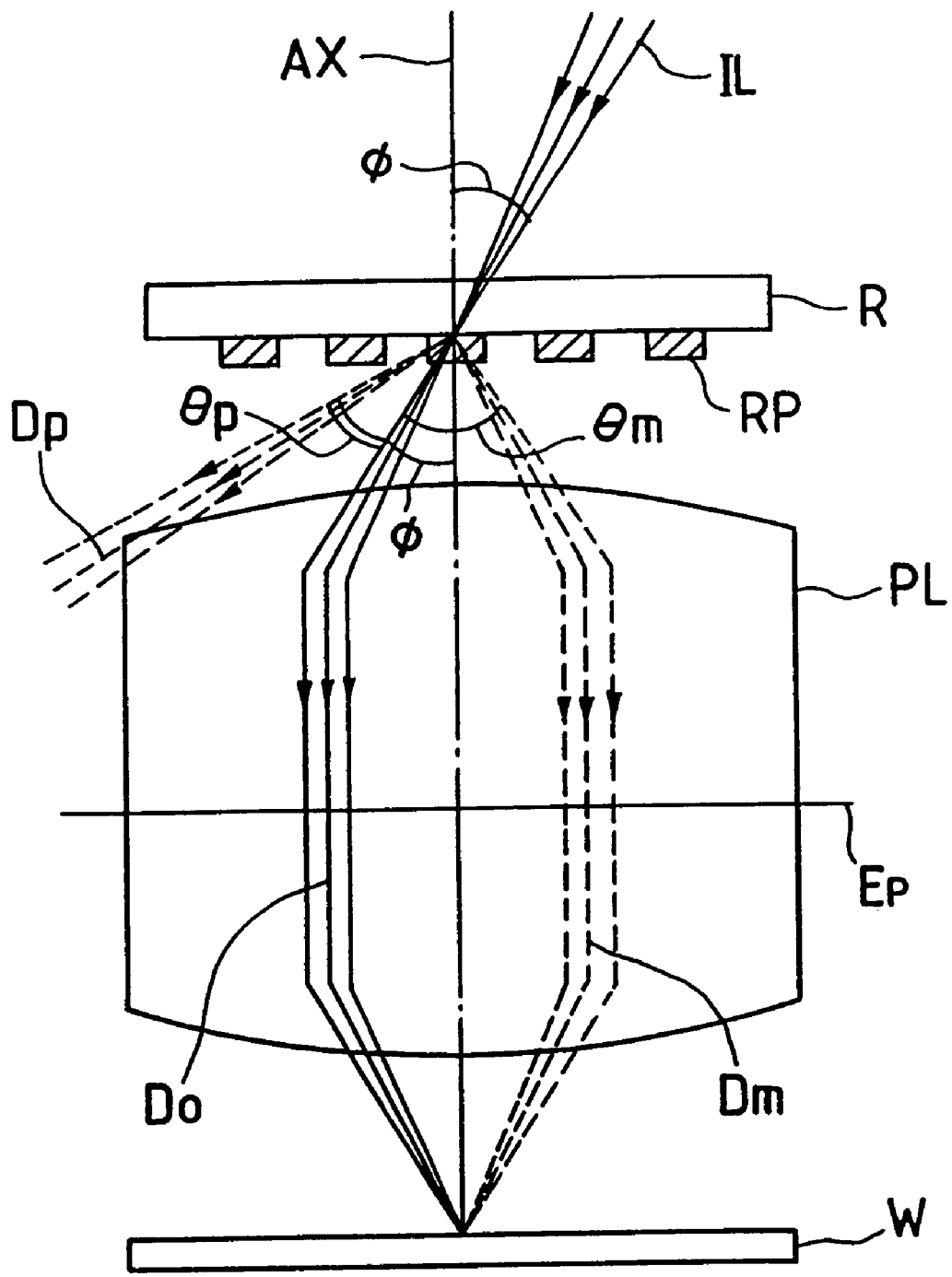
FIG. 10 is a view used for the illustration of the principles of the present invention.

Since the two dimensional pattern RP5b is small in the effect by inclined illumination, the diffraction grating pattern RG5b need not be provided for the two-dimensional pattern RP5b. In the present embodiment, however, in order to obtain the effect of making the σ value of the illuminating optical system for the two-dimensional pattern RP5b apparently great, the duty ratio of the diffraction grating pattern RG5b is predetermined to the order of 1:3 so that 0-order diffracted light may also be created from the diffraction grating pattern RG5b. Accordingly, when illuminating light is applied to the diffraction grating pattern RG5b substantially perpendicularly thereto, ±1st-order diffracted lights as well as 0-order diffracted light are created from the diffraction grating pattern RG5b and these diffracted lights irradiate the two-dimensional pattern RP5b. The illumination distribution on the pupil plane Ep of the projection optical system at this time is shown in FIG. 9. As shown in FIG. 9, diffracted lights of various orders are created from the two-dimensional pattern RP5b. Thereby, the effect of increasing the σ value of the illuminating optical system relative to the two-dimensional pattern RP5b is obtained without a spatial filter being disposed in the illuminating optical system and the opening diameter thereof being varied.

The depth of the grooves of the diffraction grating pattern RG5b may be made substantially equal to the depth of the grooves of the diffraction grating pattern RG5a. By so setting the depth of the grooves, the diffraction grating patterns RG5a and RG5b can be formed at the same time (by one and the same step). Also, if the duty ratio as previously mentioned is set to the order of 1:3 in terms of the area ratio, it will be possible to make the intensity ratio of one of ±1st-order diffracted light to 0-order diffracted light into nearly 1:1. Further, assuming that relative to the numerical aperture $NA_{IL}$ of the actual illuminating optical system (if expressed in terms of σ value, $σ≦0.5$ or so), the numerical aperture of the illuminating optical system required during the exposure of the rough reticle pattern RP5b is $NA_{RP}$ and the pitches of the diffraction grating pattern RG5b in X and Y directions are equal and the pitches are $P_{R5}$, the angle of diffraction $\phi_5$ of 1st-order diffracted light created from the diffraction grating pattern RG5b satisfies the following equation:

$$P_{R5} \cdot \sin \phi_5 = \lambda \qquad (11)$$

At this time, the following equation holds good between $\sin \phi_5$ and $NA_{IL}$, $NA_{RP}$:

$$NA_{RP} = NA_{IL} + \sin \phi_5 \qquad (12)$$

Accordingly, the pitch $P_{R5}$ of the diffraction grating pattern RG5b can be determined so as to satisfy the following equation:

$$P_{R5} = \lambda/(NA_{RP} - NA_{IL}) \qquad (13)$$

By the above-described construction, in the present embodiment, just as in each of the above-described embodiments, inclined illumination optimized relative to the periodic pattern RP5a can be accomplished and a high resolution and a great depth of focus are obtained. Further, the two-dimensional pattern RP5b can be illuminated at a great σ value and thus, a great depth of focus is obtained.

In the present embodiment, the diffraction grating pattern RG5b is provided for the relatively rough pattern RP5b as well. However, the diffraction grating pattern RG5a may be provided only for the minute periodic pattern RP5a to effect inclined illumination and conventional perpendicular illumination may only be effected for the pattern RP5b. In such case, the illuminations of the images of the patterns RP5a and RP5b on a wafer may differ greatly. Therefore, it will be preferable to use a light decreasing filter to present the illumination of the illuminating light applied to the pattern RP5b low, or to make the light transmittance of the formation area of the pattern RP5b low by the deposition of thin film. Thereby, it will become possible to expose both of the patterns RP5a and RP5b at an optimum exposure amount. Also, over-exposure will take place for the pattern RP5b and therefore, the line width of the pattern RP5*b* can simply be preformed more thickly than the design value, correspondingly to the optimum exposure amount for the pattern RP5*a*.

In the above-described third to fifth embodiments, the other formation conditions than the pitch of the diffraction grating pattern as the deflecting member, for examples, the conditions such as the spacing (Δt) between it and the reticle pattern, the size of the formation area thereof and the width of the light intercepting zone provided on the pattern surface, can be determined just as in the first embodiment.

As described above, in the first to fifth embodiments, a diffraction grating is provided on the glass surface of a reticle, thereby realizing inclined illumination for the reticle pattern. Therefore, it becomes possible to achieve projection exposure of a high resolution and a great depth of focus without the illuminating optical system being improved in any way and moreover, by intactly utilizing a conventional reticle. Also, even if there is minute defect (such as a flaw or a foreign substance) on the diffraction grating pattern used as the deflecting member, the influence thereof will be alleviated as the light from the defect travels by an amount corresponding to the thickness of the reticle, i.e., the spacing Δt, and the influence of the defect of the diffraction grating will become very small on the pattern surface of the reticle. Accordingly, the influence of the defect will pose no problem in the reticle of the present invention, although the defect of the shifter poses a great problem in a phase shift reticle. Further, in the phase shift reticle, it is necessary to form a light intercepting pattern and a shifter pattern in highly accurate superposed relationship with each other, while in the reticle of the present invention, high accuracy is not required in the alignment of the reticle pattern and the diffraction grating pattern (deflecting member), and this leads to the ease of manufacture of the reticle.

Also, when as in the fifth embodiment, 0-order diffracted light is to be created from the diffraction grating pattern (deflecting member), all diffracted lights including 0-order diffracted light illuminates the reticle pattern and thus, the effect of increasing the σ value of the illuminating optical system is obtained. At this time, the diffraction grating pattern may be formed so as to increase the σ value only for the relatively rough pattern of the reticle pattern, and the σ value may be partly varied in the illuminating field. Also, in a reticle which does not require the transfer of a minute pattern, a diffraction grating pattern for increasing the σ value over the whole surface of the reticle pattern thereof may be formed. Accordingly, if design is made such that the σ value is set by the diffraction grating pattern, a mechanism for making the σ value of the illuminating optical system variable will become unnecessary. At this time, the σ value of the illuminating optical system may simply be set to an optimum value (0.5 or less) for inclined illumination. Further, for an isolated pattern, for example, a line pattern or a space pattern or the like, it will be effective to cause 0-order diffracted light to be created from the diffraction grating pattern (deflecting member). Also, causing 0-order diffracted light to be created from the diffraction grating pattern (deflecting member) will result in the obtainment of the effect that when for example, five line and space patterns are exposed, a film decrease caused by the resist images of the opposite ends thereof can be reduced.

Now, in each of the above-described embodiments, a phase type diffraction grating is used as the deflecting member, but alternatively, an amplitude type diffraction grating may be used, and again in such case, ±1st-order diffracted lights are created and therefore, improvements in the resolving power and the depth of focus can be expected.

Also, as the deflecting member, unevenness having a cross-sectional shape like a sine wave may be formed on a glass substrate with one period thereof being determined to about double the pitch of the reticle pattern. Where the reticle pattern is a two-dimensional pattern, two sets of grating plates having said sine wave-like unevenness may be superposed one upon the other and disposed so that the directions of travel of the sine waves may intersect each other in conformity with the periodicity of the two-dimensional pattern. Alternatively, two sets of sine wave-like diffraction gratings may be formed on the surface and back of a glass substrate. Further, as the deflecting member, unevenness having a cross-sectional shape like a triangular wave may be formed on a glass substrate in the same manner as described above. Also, as the deflecting member, use may be made of one covered with a number of minute Fresnel zone plates.

For the reticle if each embodiment, perpendicular illumination can be effected to the reticle pattern by the use of a conventional illuminating optical system, and the σ value of the illuminating optical system may preferably be determined to 0.5 or less. Also, the resist used when effecting exposure by the use of the reticle of each embodiment may be of the positive type or the negative type. Further, in any of the embodiments, the diffraction grating pattern (deflecting member) need not be provided on the glass surface of the reticle, but may be formed on a discrete transparent substrate, as shown in FIGS. 4B and 4C. In such case, for example, by the utilization of a pellicle frame or the like, the substrate on which the diffraction grating pattern is formed may be placed (fixed) in proximity to the reticle. Alternatively, said substrate may be fixed in the interior of the illuminating optical system, instead of being fixed to the reticle. In such case, a relay lens system may be disposed in the illuminating optical system, whereby a diffraction grating pattern (deflecting member) may be provided in a plane substantially conjugate with the glass surface of the reticle, in other words, a plane spaced apart a predetermined distance from the conjugate plane of the pattern surface of the reticle toward the light source side. Also, as shown in FIG. 4A, a transparent substrate for preventing the adherence of foreign substances may be fixed in intimate contact with the diffraction grating pattern.

Also, in the first to fifth embodiments, the diffraction grating pattern (deflecting member) is used to realize an illuminating state equivalent to the inclined illuminating method (the deformed light source method), but for example, it is also possible to arrange diffraction grating patterns in a plurality of directions to thereby effect zonal illumination to the reticle pattern.

An exposing apparatus to which the photo-mask according to the present invention can be any one having a projection optical system, and further the projection optical system may be of the refraction type, the reflection type or a type comprising a combination of these types. Also, when the numerical aperture of the projection optical system is varied, particularly is made small, diffracted light from the reticle pattern may become unable to pass through the pupil plane thereof. In such a case, the diffraction grating pattern (deflecting member) can be interchangeably constructed in conformity with the variation in the numerical aperture of the projection optical system and a diffraction grating pattern differing in pitch can be used to thereby vary the angle of incidence of the illuminating light onto the reticle pattern.

A sixth embodiment of the present invention will now be described with reference to FIG. 11. In this embodiment, description will be made of a projection-exposing apparatus to which is applicable a diffraction grating pattern (deflecting member) RG1 formed on a glass substrate 14 discrete from a reticle $R_0$, as shown in FIG. 12. FIG. 12 shows the constructions of the reticle $R_0$ and the glass substrate 14 used in the present embodiment. In FIG. 12, the reticle $R_0$ and the glass substrate 14 are separate, but the other formation conditions are entirely the same as those of the reticle $R_1$ of FIG. 1 and need not be described.

Figure 11:
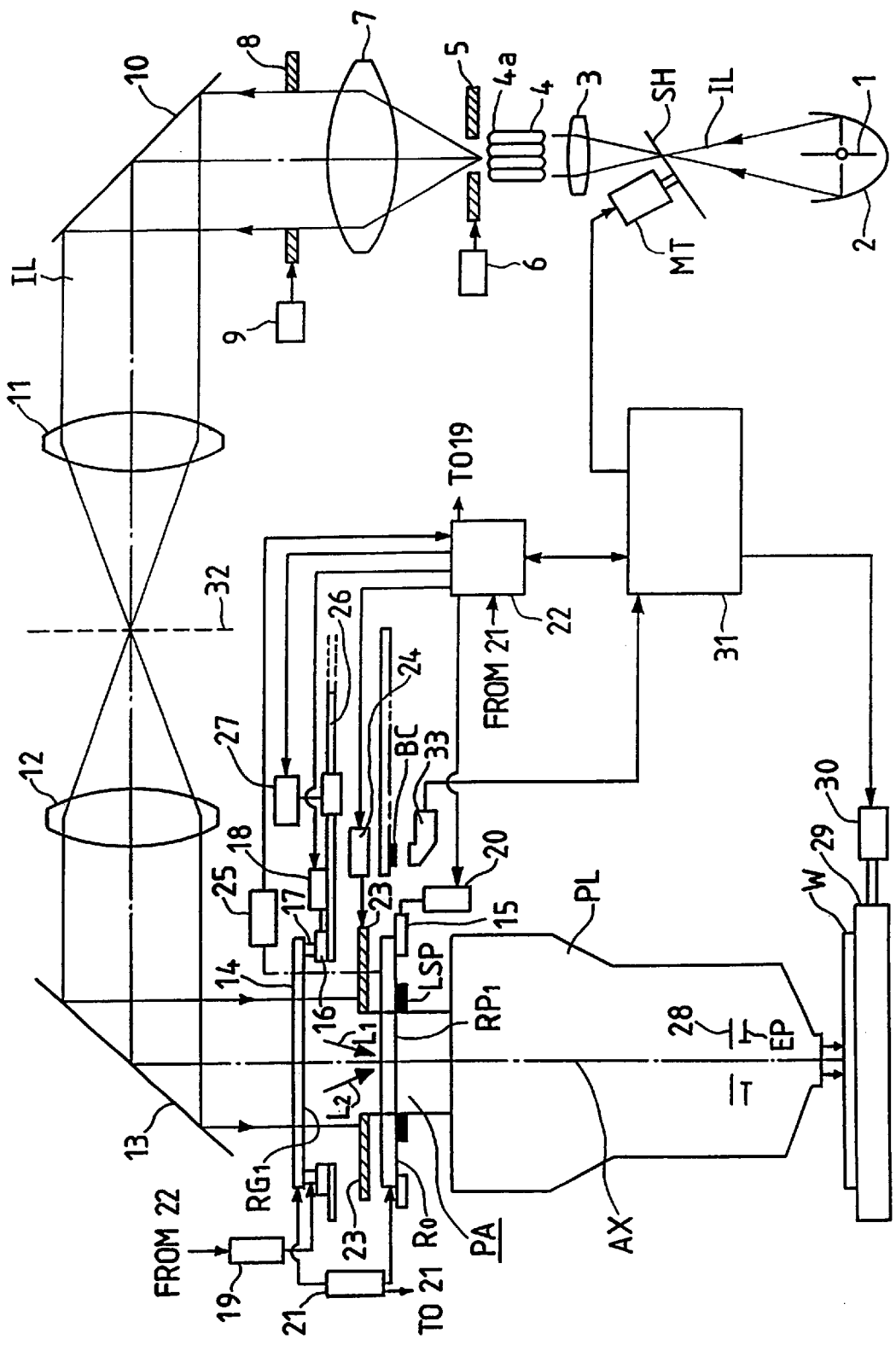
FIG. 11 shows the construction of a projection-exposing apparatus according to a sixth embodiment of the present invention.
Figure 12:
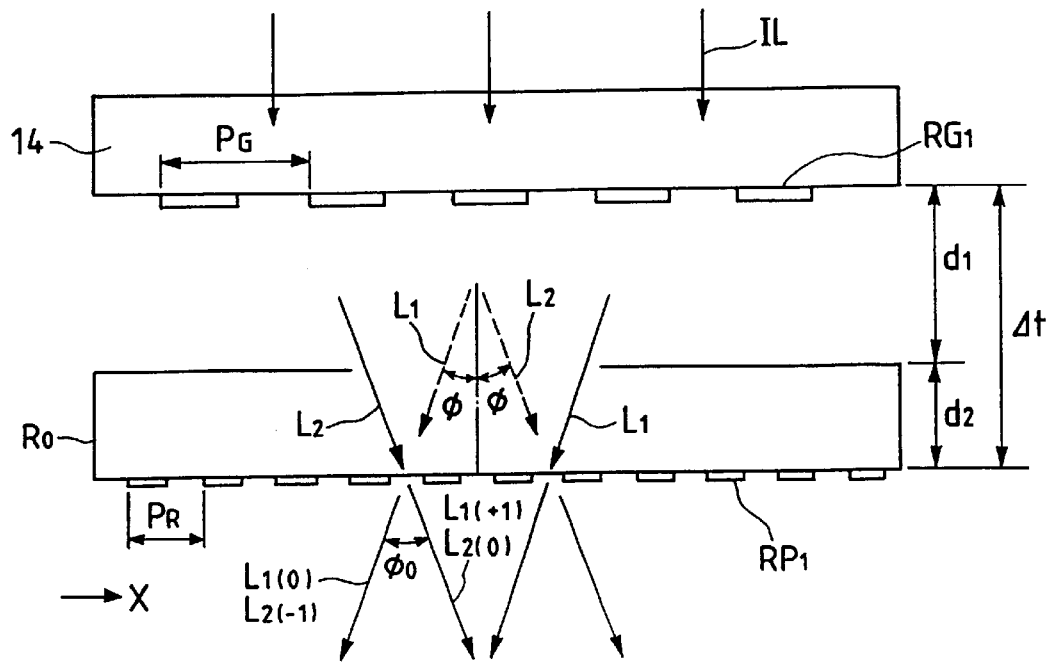
FIG. 12 is an enlarged view of the vicinity of the reticle in FIG. 11.

In FIG. 11, illuminating light IL emitted from a mercury lamp 1 enters a fly-eye lens 4 via an elliptical mirror 2 and a relay lens system 3. A shutter SH for closing and opening the optical path of the illuminating light IL is disposed near the second focus of the elliptical mirror 2, and the shutter SH is driven by a driving system MT, whereby the control of the exposure amount, etc. are effected. The exit surface 4a of the fly-eye lens 4 provides a Fourier transformation plane for the reticle pattern, and an aperture stop 5 is provided near the exit surface 4a. The aperture stop 5 is a stop for prescribing the numerical aperture $NA_{IL}$ of an illuminating optical system, i.e., the σ value (the ratio of the numerical aperture $NA_R$ of the projection optical system to the numerical aperture $NA_{IL}$ of the illuminating optical system), and the size of the opening portion thereof is variable by a driving portion 6. In the present embodiment, the diameter of the opening is determined so that the σ value (coherence factor) may be of the order of 0.1–0.3.

Now, the illuminating light IL from the fly-eye lens 4 passes through a relay lens 7 to a field stop (reticle blind) 8. The field stop 8 is provided at a location substantially conjugate with a reticle pattern $RP_1$, and the opening portion of the field stop 8 is made variable by a driving portion 9, whereby the illuminated area on the reticle pattern becomes changeable as desired. The light beam IL passed through the field stop 8 arrives at a mirror 13 via a mirror 10 and condenser lenses 11, 12, and is reflected substantially vertically downwardly by the mirror 13. Further, the light beam IL is applied to the reticle $R_0$ through a glass substrate 14 having a diffraction grating pattern RG1 formed on the back thereof (the surface adjacent to the reticle).

The glass substrate 14 is a substrate transparent to the illuminating light IL, for example, a quartz substrate, and the diffraction grating pattern RG1 is a phase type diffraction grating. The formation conditions of the diffraction grating pattern RG1 are entirely the same as those in FIG. 1 and therefore need not be described here. In manufacturing the phase type diffraction grating, dielectric material thin film (such as SOG) can be subjected to patterning or the glass substrate 14 itself can be subjected to etching to form a level difference, thereby provide a phase difference. Alternatively, the refractive index of a particular portion in the surface of the glass substrate may be changed. As a method of changing the refractive index, for example, ion implantation or the like can be done.

Now, when the illuminating light IL is applied to the diffraction grating pattern RG1 substantially perpendicularly thereto, only ±1st-order diffracted lights L1 and L2 are created from the diffraction grating pattern RG1. Further, the ±1st-order diffracted lights are inclined at a predetermined angle with respect to the optical axis Ax of the projection optical system PL and incident on a reticle pattern RP1 formed in a pattern area PA surrounded by a light intercepting portion LSB. It is for preventing the creation of 0-order diffracted light which is not preferable to improvements in the resolving power and the depth of focus that the phase type diffraction grating is used.

The glass substrate 14 is held on a holding member 16 and is two-dimensionally movable and rotatable by a driving portion 18 in a plane substantially perpendicular to the optical axis AX of the projection optical system PL. Further, the glass substrate 14 is movable in the direction of the optical axis AX by a driving element (such as a piezo element) 17, which in turn is driven by a driving portion 19. The reticle $R_0$ is placed on a reticle stage 15 and is two-dimensionally movable and rotatable by a driving portion 20 in a plane substantially perpendicular to the optical axis AX of the projection optical system PL.

In the present embodiment, the glass plate 14 is designed to be movable and rotatable relative to the reticle $R_0$ by the driving portion 18 or the driving portion 20. For example, by the substrate 14 being rotated in conformity with the periodicity of the reticle pattern, the directions of the periods of the reticle pattern and the diffraction grating pattern can be made substantially coincident with each other. Information regarding this amount of movement and this amount of rotation can be obtained by alignment marks (not shown) which are provided on the glass substrate 14 and the reticle $R_0$ being detected by a mark detecting system 25 (shown only in X direction).

A movable light intercepting portion 23 for intercepting the half shadow blur (the details of which will be described later) of the diffracted lights from the diffraction grating pattern $RG_1$ is provided between the substrate 14 and the reticle $R_0$, and the position of the movable light intercepting portion 23 in a plane perpendicular to the optical axis AX is moved by a driving portion 24. Information from the mark detecting system 25 is also input to a first control system 22, which thus controls the driving portion 19 as well as the driving portions 18, 20 and 24. It is to be understood that the movable light intercepting portion 23 is retracted when the mark detecting system 25 detects the alignment mark on the reticle $R_0$.

Further, a plurality of glass substrates including the glass substrate 14 and having one-dimensional or two-dimensional phase type diffraction grating patterns differing in pitch from one another and a plurality of holding members are provided on an interchange member 26, and design is made such that any glass substrate is disposed in the illuminating optical path by a driving system 27. The interchange member 26 is a rotatable turret plate, on which a plurality of glass substrates provided with diffraction grating patterns of different pitches are placed with the holding member 16 interposed therebetween. Therefore, the plurality of glass substrates (diffraction grating patterns) are interchangeable by the turret plate being driven. Accordingly, by the glass substrates being interchanged in conformity with the pitch of the reticle pattern, it becomes possible to dispose a diffraction grating pattern having an optimum pitch for the reticle pattern in the illuminating optical path.

Now, the illuminating light IL passed through the pattern area PA enters the both-side telecentric projection optical system PL, which projects (forms) the projected image of the reticle pattern $RP_1$ onto a wafer W having a resist layer formed on the surface thereof. In the present embodiment, a variable aperture stop 28 is provided in or near the pupil plane Ep of the projection optical system PL so that the numerical aperture NA of the projection optical system PL can be changed. The wafer W is held on a wafer stage 29 in such a manner that the surface thereof substantially coincides with the best imaging plane. The wafer stage 29 is finely movable in the direction of the optical axis (Z direction) and two-dimensionally movable in the step and repeat fashion by a motor 30. When the transfer exposure of the reticle $R_0$ onto a shot area on the wafer W is completed, the wafer stage is stepped to the next shot position. The two-dimensional position of the wafer stage 29 is normally detected at a resolution of e.g. the order of 0.01 μm by an interferometer, not shown.

In FIG. 11, provision is made of a main control device 31 for generally controlling the entire apparatus, and a bar code reader 33 for reading a bar code BC representative of the name formed by the side of the reticle pattern, in the course in which the reticle is conveyed to just above the projection optical system PL. The main control device 31 has pre-registered therein the names of a plurality of reticles to be handled in this projection-exposing apparatus and the operation parameters of the projection-exposing apparatus corresponding to the respective names. When the bar code reader 33 reads the bar code BC, the main control device 31 selects from within the interchange member 26 a glass substrate most matching the pattern information (such as pattern pitch and pitch direction) pre-registered as one of the operation parameters which corresponds to that name. The main control device 31 outputs a driving command to the driving system 27 to drive the interchange member 26 so that the selected glass substrate may be set on the reticle $R_0$, and also rotates the glass substrate through the first control system 22 so that the directions of the periods of the reticle pattern and the diffraction grating pattern may substantially coincide with each other.

Now, when the glass substrate is rotated, the first control system 22 controls the driving of the driving portion 18 on the basis of the information from the aforementioned mark detecting system 25. This information is not limited to the information from the mark detecting system 25, but may be the output information of a rotary encoder (not shown) provided in the driving portion 15, or the output information from a pattern detecting system (not shown) for directly observing the pattern provided on each of the glass substrate and the reticle.

Further, the optimum setting conditions of the aperture stop 5, the field stop 8, the movable light intercepting portion 23 and the variable aperture stop 28 under the previously selected glass substrate (i.e., reticle pattern) are also registered as the operation parameters corresponding to the above-mentioned names, and this condition setting is also effected simultaneously with the setting of the glass substrate. Thus, the glass substrate (diffraction grating pattern) optimum for the reticle $R_0$ placed on the reticle stage 15 is set accurately. Also, the inputting of the pattern information is not restricted to that by the bar code reader, but the operator may input the pattern information by means of a keyboard or the like.

Figure 13B:
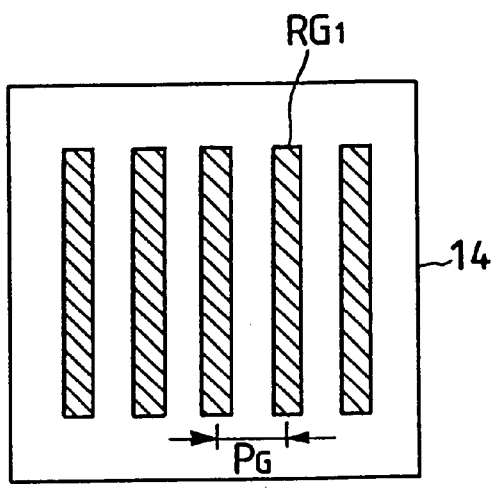
FIG. 13B shows a diffraction grating pattern optimum for the reticle pattern of FIG. 13A.
Figure 13A:
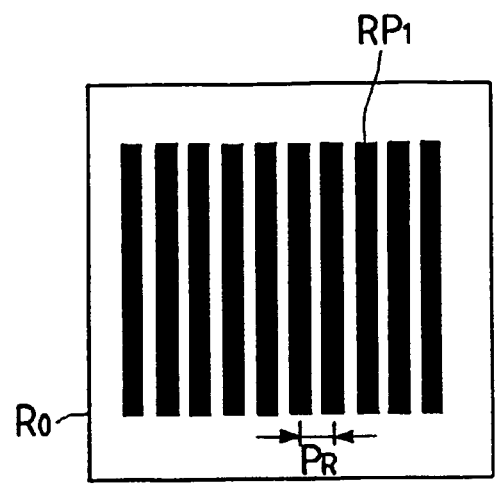
FIG. 13A shows the specific construction of the reticle pattern in FIG. 12.

Now, as shown in FIG. 12, in the present embodiment, the glass substrate 14 is disposed on the light source side of the reticle $R_0$ and the diffraction grating pattern RG1 is formed on the lower surface (the reticle side surface) of the substrate 14, thereby realizing illumination equivalent in principle to inclined illumination. The spacing Δt between the reticle pattern RP1 and the diffraction grating pattern RG1 is determined so as to satisfy the aforementioned expression (10). FIGS. 13A and 13B show the details of the reticle pattern RP1 and diffraction grating pattern RG1, and here, the relation that $P_G=2P_R$ is satisfied to maximize the depth of focus. As previously described, the pitch direction of the diffraction grating pattern RG1 and the pitch direction of the reticle pattern RP1 are substantially coincident with each other. Thus, when the reticle $R_0$ is rotated during the exposing operation or during alignment, the rotation of the reticle $R_0$ is followed (responded to) so as to maintain the above-noted relation and the glass substrate 14 is rotated by the holding member 16.

Figure 13C:
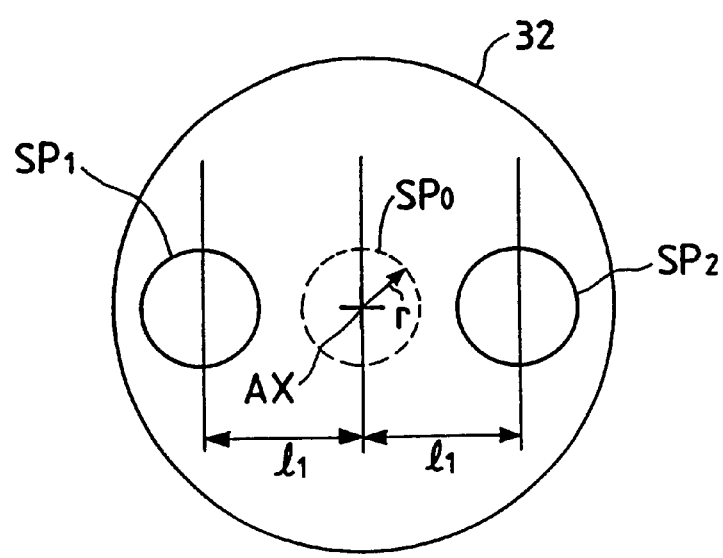
FIG. 13C represents the angle range of the diffracted light by the diffraction grating pattern of FIG. 13B in an area position on the pupil plane of an illuminating optical system.

FIG. 13C represents the angle of incidence of the illuminating light incident on the reticle $R_0$ as a position in the Fourier transformation plane of the reticle pattern (for example, the exit surface 4a of the fly-eye lens 4 in FIG. 11 or the conjugate surface 32 thereof). Circles SP1 and SP2 represent the angle of reticle incidence (the position on the surface 32) of the illuminating light transmitted through the phase type diffraction grating pattern RG1 of FIG. 13B. At this time, the distance (numerical aperture) $l_1$ of each of the center positions of the circles SP1 and SP2 (the centroidal positions of the distribution of the quantity of light) from the optical axis AX is $\lambda/P_G$. That is, the addition of the diffraction grating pattern $RG_1$ of FIG. 13B to the light source side of the reticle is equivalent to the deformed light source method which limits the shape of a secondary light source within the two circles SP1 and SP2 of FIG. 13C. Accordingly, by the reticle being inclination-illuminated under such a condition, one of ±1st-order diffracted lights and 0-order diffracted light passing through the pupil plane $E_p$ of the projection optical system become equidistant from the optical axis AX.

On the other hand, a circle $SP_0$ indicated by broken line is the image of a σ stop 6 on the Fourier transformation plane (here, the surface 32), and the radius r thereof represents the numerical aperture (the sine of angle) of the illuminating system and is associated with the σ value. That is, when the reticle side numerical aperture of the projection optical system is $NA_R$, $r=NA_R \times \sigma$. Here, if there is any light beam incident perpendicularly, it passes through an area corresponding to the position of the circle $SP_0$ in FIG. 13C.

Figure 14:
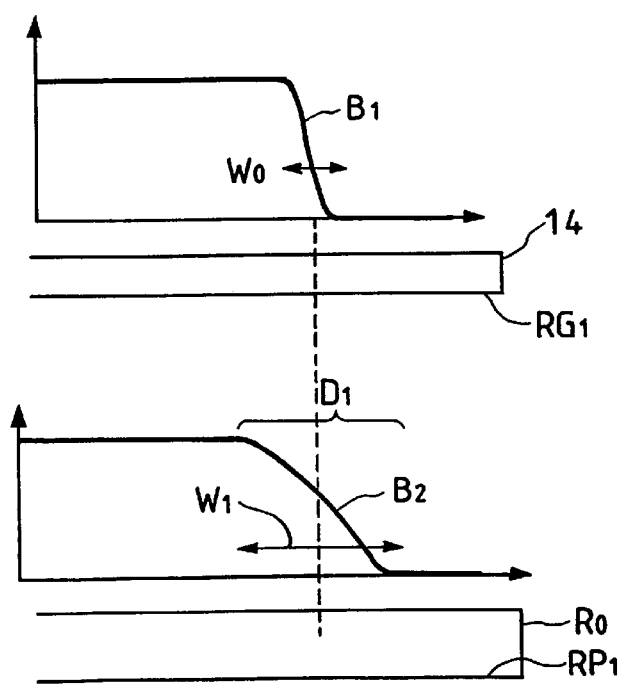
FIG. 14 shows the half shadow blur of diffracted light from the diffraction grating pattern of FIG. 13B.

Now, in FIG. 12, the reticle pattern RP1 and the diffraction grating pattern RG1 are spaced apart by the spacing Δt ($\Delta t=d_1+d_2$; $d_1$: the distance between the upper surface of the reticle and the diffraction grating pattern; $d_2$: the thickness of the reticle) as previously described. Therefore, a half shadow blur $D_1$ by the diffraction of the illuminating light on the diffraction grating pattern RG1 is created on the end portion of the illuminated area on the reticle. That is, the uniformity of the illumination on the reticle is reduced. This state is shown in FIG. 14. In FIG. 14, B1 indicates the distribution of the quantity of illuminating light on the diffraction grating pattern RG1, B2 indicates the distribution of the quantity of illuminating light on the reticle pattern PR1, the horizontal axis represents the position, and the vertical axis represents the quantity of light. The distribution position of the quantity of illuminating light fluctuates with a variation in the aforementioned field stop 8.

Now, the width $W_0$ of the distribution B1 of the quantity of light at the boundary between light and shade is a defocus blur by the distance (spacing Δt) between the conjugate surface of the field stop 8 (i.e., the reticle pattern RP1) and the diffraction grating pattern RG1 in the direction of the optical axis AX. On the other hand, the half shadow width $W_1$ in the distribution B2 of the quantity of light on the reticle pattern RP1 is wide as compared with the half shadow width $W_0$. This is due to the half shadow blur of the diffracted light $L_1$ ($L_2$) from the diffraction grating pattern RG1, and the half shadow width $W_1$ is represented by the following equation, in which n is the refractive index of the reticle:

$$W_1=(2\lambda/P_G+2NA_{IL})\times(d_1+d_2/n) \tag{14}$$

The prevention of the influence of the half shadow as described above will now be described with reference to FIG. 15. In the description of FIG. 15, for the sake of convenience, the spacing Δt is explained as a fixed value. To prevent the influence of the half shadow, the formation area GA of the diffraction grating pattern RG1 is made wider by the order of $W_1/2$ in each of X and Y directions than the pattern area PA. Along therewith, the position of the distribution of the quantity of light as previously described moves, and the ±1st-order diffracted lights $L_1$ and $L_2$ are symmetrically applied over the whole of the formation area of the reticle pattern RP1 and the illumination becomes uniform. In conformity with this, the field stop 8 also need be widened by an amount corresponding to the order of $W_1/2$.

Further, to prevent the influence of the half shadow, a light intercepting member is necessary and for example, a light intercepting zone (light intercepting pattern) of a width $W_1$ is provided around the necessary area of the reticle pattern RP1. The light intercepting zone need not always be provided on the reticle, but a light intercepting plate may be disposed between the diffraction grating pattern RG1 and the projection optical system PL. For example, a light intercepting plate 23 can be provided between the diffraction grating pattern RG1 and the reticle $R_0$. In the apparatus of the present embodiment (FIG. 11), a movable light intercepting plate 23 is provided and the width thereof is $W_1$ or greater and can cut the half shadow. Further, the movable light intercepting plate 23 is movable in operative association with the field stop 8 (in operative association while having offset corresponding to a difference of the order of $W_1/2$). Accordingly, it can cope with even a reticle in which the pitch or the size of the pattern area of the reticle pattern RP1 differs and the light intercepting zone is not provided. Thereby, the light diffracted by the diffraction grating pattern RG1 can be prevented from passing through the other transparent portion than the formation area (the outside of the light intercepting zone LSB) of the reticle pattern RP1 and entering the projection optical system PL. Here, description has been made with the spacing $\Delta t$ as a fixed value, but the allowable value of the half shadow width $W_1$ may be predetermined and the spacing $\Delta t$ may be determined from expression (10) in conformity with the pitch of the diffraction grating pattern so that the half shadow width $W_1$ may be equal to or less than the allowable value.

Figure 16A:
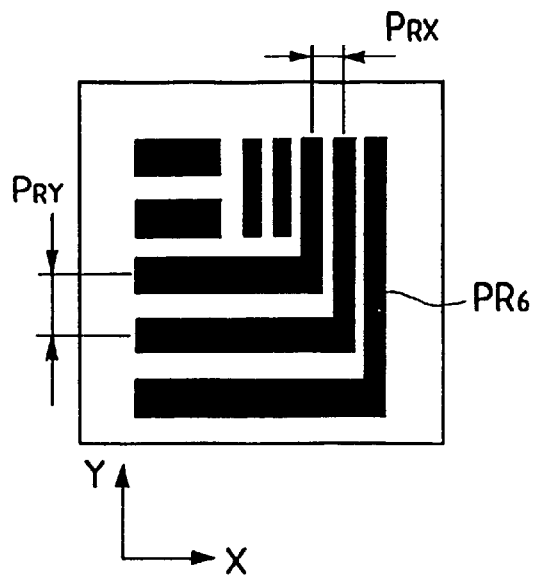
FIG. 16A shows a two-dimensional reticle pattern.
Figure 16B:
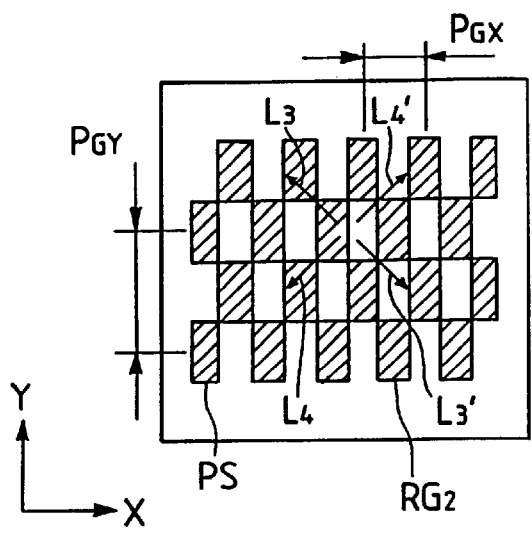
FIG. 16B shows a diffraction grating pattern optimum for the pattern of FIG. 16A.
Figure 16C:
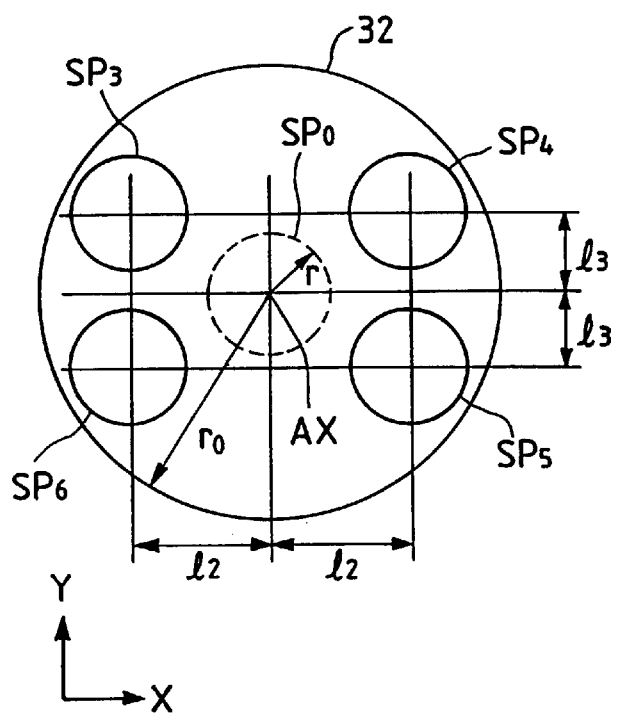
FIG. 16C represents the angle range of the diffracted light by the diffraction grating pattern of FIG. 16B in an area position on the pupil plane of the illuminating optical system.

Reference is now had to FIGS. 16A–16C to describe a case where a two-dimensional periodic pattern is used as the reticle pattern. The reticle pattern RP6 of FIG. 16A is a two-dimensional periodic pattern having pitches $P_{RX}$ and $P_{RY}$ in X and Y directions as in FIG. 5A. On the other hand, the diffraction grating pattern RG2 of FIG. 16B is entirely same as that of FIG. 5B, i.e., a pattern in which rectangular patterns PS formed of a phase shifting material (for example, SOG) are repetitively arranged at pitches $P_{GX}$ and $P_{GY}$ in X and Y directions. The pitches $P_{GX}$ and $P_{GY}$ are determined to the relations that $P_{GX}=2P_{RX}$ and $P_{GY}=2P_{RY}$. The diffracting grating pattern RG2 may have only its pitch $P_G$ and pitch direction set accurately relative to the reticle pattern RP6 as described above, and the diffraction grating pattern RG2 may be shifted (positionally deviated) in XY plane relative to the reticle pattern RP6. However, as a matter of course, it is necessary to make the relative rotation error zero in order to make the pitch directions of the two patterns coincident with each other.

Now, when the illuminating light IL is incident on the diffraction grating pattern RG2 substantially perpendicularly thereto, only two sets of ±1st-order diffracted lights ($L_3, L_3'$) and ($L_4, L_4'$) are created from the pattern RG2 with respect to X and Y directions, respectively. The two sets of ±1st-order diffracted lights are further incident symmetrically on the reticle pattern RP6 at an angle $\phi$ ($\sin \phi = \lambda/P_G$) with respect to the direction of the optical axis of the projection optical system. FIG. 16C, like FIG. 13C, shows the angle range (the secondary light source shape) of the illuminating light incident on the reticle pattern RP6, and the angle range is areas $SP_3$, $SP_4$, $SP_5$ and $SP_6$. Assuming that the X and Y directions of FIG. 16A correspond to the X and Y directions of FIG. 16C, $l_2 = \lambda/P_{GX}$ and $l_3 = \lambda/P_{GY}$. As a result, one of the ±1st-order diffracted lights and 0-order diffracted light created from the reticle pattern RP6 pass through four partial areas in the pupil plane $E_P$ of the projection optical system which are substantially equidistant from the optical axis AX of the projection optical system, and a high resolution and a great depth of focus are obtained. At this time, the illuminations on the four partial areas are substantially equal.

The duty ratio of the diffraction grating pattern RG2 may be arbitrary, but may desirably be determined to 1:1 in preventing the creation of high-order diffracted lights. The other formation conditions of the diffraction grating pattern RG2, for example, the conditions such as the spacing between it and the reticle pattern RP6, the size of the formation area thereof and the width of the light intercepting zone provided on the pattern surface, are similar to those for the diffraction grating pattern RG1 and therefore need not be described. If the pitch of the reticle pattern RP6 differs between X and Y directions, the pitch of the diffraction grating pattern also differs between X and Y directions and further, the width of the aforementioned light intercepting zone and the size of the formation area of the diffraction grating pattern also differ between X and Y directions. For example, when the pitch of the diffraction grating pattern (reticle pattern) in X direction is smaller than that in Y direction, the width of the light intercepting zone and the width of the formation area of the diffraction grating pattern in X direction are great as compared with the widths in Y direction.

Here, a case where a deflecting member (diffraction grating pattern) is provided near the light source side of the reticle is compared with the deformed light source method (the inclined illuminating method) in which the secondary light source shape is deformed as in the prior art. In the deformed light source method, a light intercepting plate (an aperture stop) is disposed on the pupil plane of an illuminating optical system, for example, the exit surface of a fly-eye lens, whereby only the four areas SP3–SP6 in FIG. 16C are selected to provide a secondary light source. Accordingly, in the deformed light source method, the loss of the quantity of light is great and the illumination on the reticle surface is greatly reduced. Further, the illuminating light passes through each of the four areas SP3–SP6 and therefore, the illuminating optical system requires a numerical aperture greater than the radius $r_0$ in FIG. 16C (the distance between each of the centers of the areas SP3–SP6 and the optical axis AX).

In contrast, where a diffraction grating pattern is provided near the light source side of the reticle, an illuminating light beam having a small beam diameter ($\sigma$ value=about 0.1–0.3) suffices, and illumination equivalent to a deformed light source is realized by the diffraction grating pattern near the reticle. Therefore, a light intercepting plate is unnecessary and the loss of the quantity of light is small. Further, the light beam is thin (numerical aperture r), and this leads to the advantage that the illuminating optical system can be made compact. Moreover, the effects of an improvement in the resolution and an increase in the depth of focus can be obtained equally with the prior-art deformed light source method.

Now, a diffraction grating, particularly, a phase type diffraction grating, used as the deflecting member in the present embodiment is identical in basic structure to a phase shift reticle of the shifter light interception type. However, the phase shift reticle suffers from the problem that the defect of the shifter (phase grating) is intactly transferred onto a wafer, because the phase type grating is on the surface of the reticle (the surface conjugate with the wafer). It is very difficult to manufacture a phase shift reticle free of defect and in the present day technology, it is considered to be difficult to put it into practical use. In contrast, the diffraction grating pattern used as the deflecting member is provided at a location spaced apart by $\Delta t$ from the reticle surface toward the light source side, and defect or the grating pattern itself may not at all be transferred onto a wafer. This will hereinafter be described with reference to FIGS. 17A and 17B.

Figure 17A:
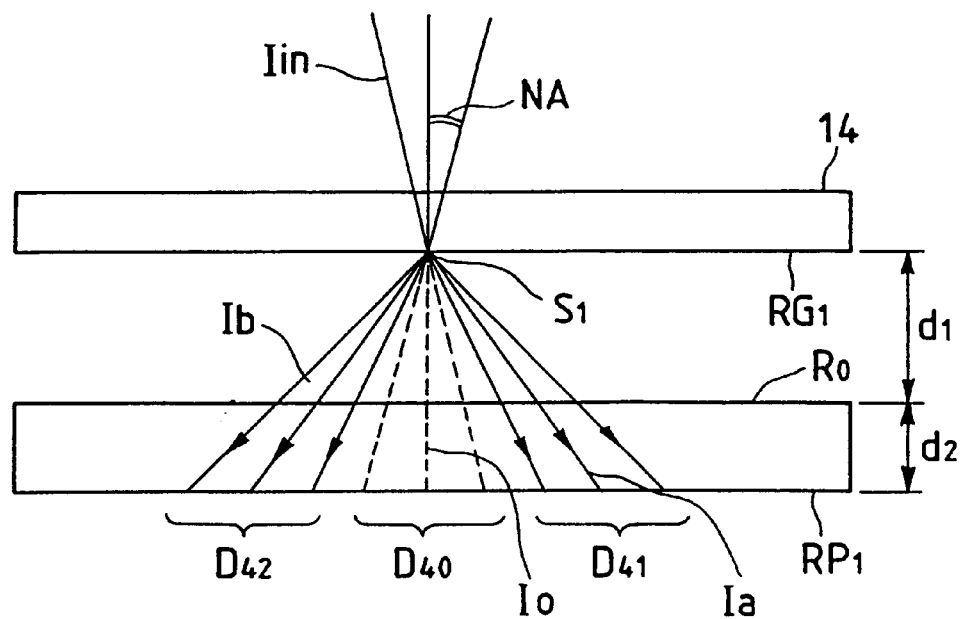
FIGS. 17A and 17B illustrate the reason why the image of the diffraction grating pattern is not transferred onto a wafer.
Figure 17B:
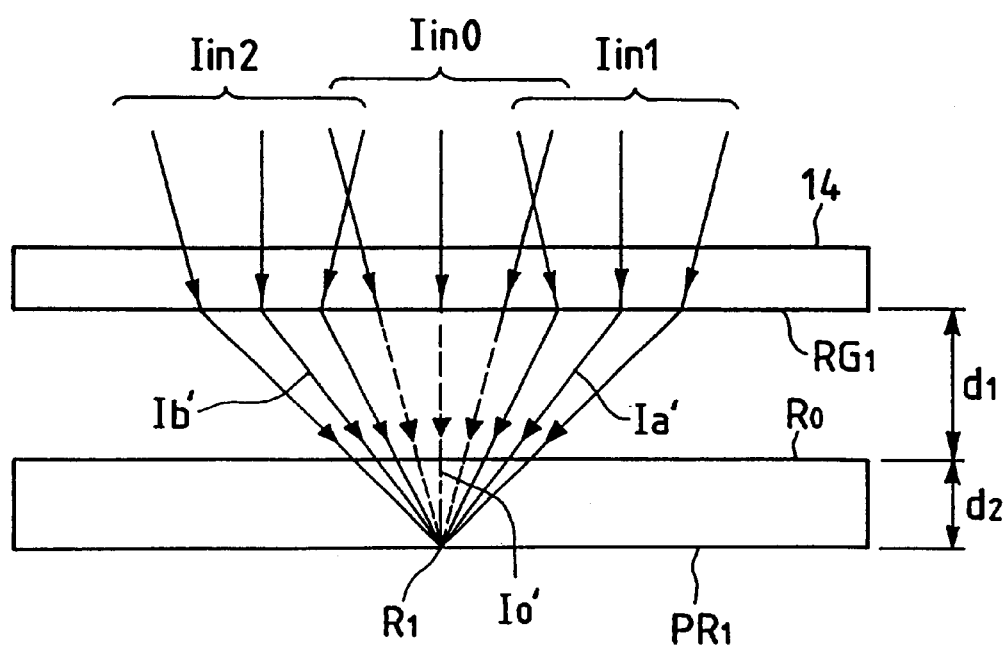

In FIG. 17A, a light beam passing a point S1 on a phase grating (diffraction grating pattern) RG1 becomes ±1st-order lights Ia and Ib and illuminates a reticle pattern RP1. Further, the light beam incident on the point S1 has a resolution range corresponding to the numerical aperture $NA_{IL}$ of the illuminating light and therefore, on the reticle pattern RP1, the ±1st-order lights Ia and Ib spread to the ranges D41 and D42, respectively, of $2NA_{IL}$ ($d_1+d_2/n$). Accordingly, even if the point S1 has any defect, the image thereof will become much blurred on the reticle pattern RP1 and will have no practical influence. On the other hand, FIG. 17B shows the state of light beams which arrive at a point R1 on the reticle pattern RP1, and the −1st-order light Ia' of a light beam $I_{in1}$ and the +1st-order light of a light beam $I_{in2}$ arrive at the point R1. Accordingly, it is seen that the defect on the phase grating RG1 is averaged on the reticle pattern RP1 and has no influence. In FIGS. 17A and 17B, $I_0$, D40, $I_{in0}$ and $I_0'$ indicate cases where there is the creation of 0-order light.

The transfer of the diffraction grating pattern RG1 itself will now be considered. Taking it into account that generally an illuminating light beam has a certain degree of thickness (has a numerical aperture>0) and that the reticle pattern RP1 and the diffraction grating pattern RG1 are sufficiently spaced apart from each other as previously described, this will neither pose any problem. That is, the diffraction grating pattern will not be transferred onto a wafer. Here, in the projection-exposing apparatus, consideration will be made by the use of actual constants. For example, if the wafer side $NA_W=0.5$ and the reticle side $NA_R=0.1$ and the reticle pattern pitch equals 3.5 μm and λ=0.365 μm (i line) and σ=0.3 (that is, $NA_{IL}$=reticle side $NA_R×σ=0.03$), the diffraction grating pitch is 7.0 μm and the angle of diffraction φ is sin φ=0.0521. At this time, the depth of focus of the phase diffraction grating is of a value substantially equal to the depth of focus of a proximity exposing machine, and assuming that the optical path difference λ=λ, $2λ/(0.0521+0.03)^2-(0.0521-0.03)^2=117$ μm. Accordingly, if the reticle pattern RP1 and the diffraction grating pattern RG1 are spaced apart by 17 μm or more from each other in the air, the diffraction grating itself will not be transferred onto the wafer. Actually, the thickness of the reticle is of the order of 2 mm and amounts to 1.3 mm (1300 μm) when converted in the air and therefore, there is no possibility of the diffraction grating pattern RG1 which is provided on the glass substrate 14 discrete from the reticle $R_0$ being transferred onto the wafer. Even when the diffraction grating pattern is formed on the glass surface of the reticle, the diffraction grating pattern will not be transferred onto the wafer because the reticle pattern and the diffraction grating pattern are spaced apart from each other by the order of 1.3 mm as it is converted in the air.

The exposing operation of the apparatus of the present embodiment (FIG. 11) will now be described briefly. In the present embodiment, it is to be understood that a plurality of diffraction grating patterns including the diffraction grating pattern described in the first to fifth embodiments are formed on glass substrate discrete from a reticle and further, a plurality of glass substrates are contained in a deposit portion (for example, a dustproof cassette), not shown. Also, the main control device 31 selects a diffraction grating pattern best suited for each of several reticles from head to be used for the transfer onto a wafer, in accordance with a predetermined program or instructions from the operator, and several glass substrates provided with this selected diffraction grating pattern are carried out of the deposit portion and held on the interchange member 26.

Now, when the head (first) reticle is to be loaded onto the reticle stage 15, the bar code reader 32 reads pattern information (pattern pitch and pitch direction) from the reticle bar code BC. The main control device 31 receives this pattern information as an input, and selects a glass substrate provided with a diffraction grating pattern best suited for the head reticle from among the plurality of glass substrates. Thereafter, the main control device 31 drives the interchange member 26 by the driving system 27, thereby disposing the previously selected glass substrate in the illuminating optical path. Further, if required, the main control device drives the holding member 16 by the driving portion 18 to thereby make the pitch direction of the reticle pattern and the pitch direction of the diffraction grating pattern coincident with each other.

The execution of reticle alignment may be done before the glass substrate is disposed in the illuminating optical path, but in the case of a sequence in which reticle alignment is executed after the disposition of the glass substrate and the reticle is minutely rotated, the glass substrate is also rotated, following (in response to) the rotation of the reticle. Also, where the so-called die-by-die system whereby alignment is effected for each shot area by the use of an alignment sensor of the TTR (Through The Reticle) type is adopted when superposition exposure is effected for each shot area on a wafer, and the amount of relative positional deviation, particularly, the relative rotation error, of the reticle and wafer is corrected by the minute rotation of the reticle, it is necessary that the glass substrate be rotated, following the rotation of the reticle. In short, where the reticle is rotated after the pitch direction of the reticle pattern and the pitch direction of the diffraction grating pattern are made coincident with each other, it is necessary that the glass substrate be rotated, following the rotation of the reticle. However, if the amount of rotation of the reticle is minute and the relative rotation error of the reticle pattern and diffraction grating pattern caused with the rotation of the reticle is an allowable value or less, it is not necessary that the glass substrate be particularly rotated, following the rotation of the reticle.

Subsequently, the main control device 31 exposes the first reticle pattern for each shot area while controlling the opening time of the shutter SH. At a point of time whereat the pattern transfer by the first reticle has been terminated, the main control device 31 executes the interchange of the reticle and the selection and setting of the glass substrate, and starts pattern transfer under the second reticle. Thereafter, the above-described operation is repetitively executed, whereby projection exposure of a high resolution and a great depth of focus becomes possible by all reticles.

In the case of a reticle provided with a pattern of rough pitch (line width), a discrete pattern or an isolated pattern and where it is not necessary to vary the σ value as in the fifth embodiment or to make normal illumination of a great σ value as previously described pattern exposure may be done without the glass substrate being disposed in the illuminating optical path as previously described. Also, irrespective of the use of the glass substrate as previously described, the progressive focus exposing method, i.e., a method whereby during exposure, a wafer is stepwisely or continuously moved or vibrated in the direction of the optical axis of a projection optical system to thereby increase the apparent depth of focus of a projection-exposing apparatus, may be applied to a predetermined reticle. Each of the plurality of glass substrates placed on the interchange member 26 is suitably interchanged with a glass substrate within the deposit portion in conformity with the situation (schedule) of use of the reticle in the projection-exposing apparatus. This interchanging operation may be performed before the use of the glass substrate, but may desirably be performed during the exposing operation with the throughput taken into account.

As described above, in the present embodiment, illumination equivalent to the deformed light source method (the inclined illuminating method) can be realized by a simple construction without the illuminating optical system being made bulky, and projection exposure of a high resolution and a great depth of focus becomes possible. In the present embodiment (FIG. 11), design is made such that the reticle and the glass substrate (diffraction grating pattern) are held discretely from each other. However, design may also be made such that for example, while a reticle is being conveyed from the dustproof cassette to the reticle stage, a glass substrate provided with a diffraction grating pattern best suited for the reticle is placed on the reticle and the reticle is loaded onto the reticle stage with the reticle and the glass substrate held integrally with each other. In this case, holders for fixing (such as spacers) may preferably be provided at a plurality of locations on the reticle or the glass substrate. Also, when the glass substrate is to be placed on the reticle, the pitch direction of the reticle pattern and the pitch direction of the diffraction grating pattern are brought into coincidence with each other.

Now, in the present embodiment, a turret plate is used as the interchange member 26, but alternatively, for example, a slider may be used. Further, instead of providing the interchange member 26 as shown in FIG. 11, design may be made such that a glass substrate provided with a diffraction grating pattern best suited for each reticle is carried out of the deposit portion and conveyed to the holding member 16. Also, in the present embodiment, an optimum glass substrate (diffraction grating pattern) is selected in conformity with the pitch and pitch direction of the reticle pattern, but for example, with attention paid to only the pitch of the reticle pattern, an optimum diffraction grating pattern may be selected. That is, it will be good if the pitch of the diffraction grating pattern is optimized for the reticle pattern. This is because by the glass substrate being rotated by the holding member 16, the pitch directions of the reticle pattern and diffraction grating pattern can be brought into coincidence with each other.

Also, for a reticle in which as in the fifth embodiment, the σ value is made variable in a sham fashion or normal illumination of a great σ value is made in a sham fashion, discretely from the pitch information of the reticle pattern, information for selecting the diffraction grating pattern as shown in FIG. 8B may be registered in the reticle bar code BC. Further, depending on the reticle pattern, the glass substrate (diffraction grating pattern) is retracted from the illuminating optical path, whereby changeover may be effected from inclined illumination to normal illumination and pattern exposure may be effected.

Now, in the present embodiment, description has been made of the inclined illuminating method in which the illuminating light beam is inclined by the diffraction grating pattern (deflecting member) and applied to the reticle pattern, but if for example, a glass substrate on which diffraction grating patterns are arranged in a plurality of directions is prepared, it will also become possible to apply the zonal illuminating method to a reticle pattern. In this case, the optimum conditions of the aperture stop 5, field stop 8, movable light intercepting portion 23 and aperture stop 28 as previously noted are also set from the information of the reticle bar code or the input information from the operator.

Also, the spacing $\Delta t$ between the diffraction grating pattern and the reticle pattern may be found from the information of the reticle bar code by the main control device 31 by the use of expression (10), or the value of the spacing $\Delta t$ may simply be directly registered in the reticle bar code. In the present embodiment, provision is made of a gap sensor 21 for detecting the spacing between the glass substrate and the reticle in the direction of the optical axis AX (see FIG. 11) so that the control accuracy of the driving element 17 can be checked up.

When the σ value of the illuminating system set as previously described is changed, the set conditions of the spacing $\Delta t$, field stop 8, movable light intercepting portion 23 and aperture stop 28 also change with the change of the σ value. So, the main control device 31 can calculate the set conditions after changed, and control each driving portion in conformity therewith.

Also, when the aperture stop 28 is driven to vary, particulaly decrease the numerical aperture of the projection optical system PL, the diffracted lights from the reticle pattern may become unable to pass through the pupil plane $E_p$ thereof. So, it is desirable that the glass substrate (diffraction grating pattern) be interchangeably constructed in conformity with any variation in the numerical aperture of the projection optical system the angle of incidence of the illuminating light onto the reticle pattern be varied by the use of a diffraction grating pattern differing in pitch.

The interchange member 26 in FIG. 11 can be intactly utilized as this interchange mechanism.

Further, in the deformed light source method, it is preferable that the radius (numerical aperture) of a light source area in the secondary light source, for example, the area SP1 in FIG. 13C, be about 0.3 times the reticle side numerical aperture of the projection optical system PL. If the light source area is larger than this, it will become difficult to obtain the effect of improving the resolution and the depth of focus, and if conversely, the light source area is too small, the influence of the defect of the diffraction grating cannot be neglected. Therefore, in the present embodiment, the size (aperture diameter) of the aperture stop 5 may preferably be set so that the σ value may be of the order of 0.1–0.3.

Also, when normal illumination is effected with the diffraction grating pattern retracted from the optical path as previously described, it will be more advantageous in terms of the resolution and the depth of focus if the σ value is of the order of 0.6–0.7. Accordingly, where inclined illumination and normal illumination are made changeable over, it is desirable that the σ value be made variable within the range of $0.1 \leq \sigma \leq 0.7$. Specifically, the aperture diameter of the aperture stop 5 can be varied, or a zoom lens system can be disposed between the light source 1 and the fly-eye lens 4 and the beam diameter of the illuminating light entering the fly-eye lens 4 can be varied by the use of the zoom lens system. Alternatively, the σ value of the illuminating system may be fixed at the order of 0.1–0.3 optimum for inclined illumination, and such a diffraction grating pattern that will make the σ value variable in a sham fashion as previously described may be selected and used.

Further, if the aperture diameter of the aperture stop 5 is simply made variable, the loss of the quantity of light by the aperture stop 5 will occur. Therefore, a zoom lens system is employed as the relay lens system 3 and the beam diameter of the illuminating light entering the fly-eye lens 4 is enlarged or reduced in conformity with the aperture diameter of the aperture stop (σ stop) 5 by this zoom lens system. Thereby, the loss of the quantity of light can be greatly reduced.

Here, for an isolated pattern, for example, a line pattern or a space pattern, it is effective to cause 0-order diffracted light to be created from the diffraction grating pattern (deflecting member). Also, causing 0-order diffracted light to be created from the diffraction grating pattern (deflecting member) leads to the obtainment of the effect that when for example, five line and space patterns are exposed, the film decrease occurring in the resist images at the opposite ends thereof can be reduced. Further, in the present embodiment, it has been described that a mercury lamp or an excimer laser source is used as the light source 1, but other light source may also be used. For example, the harmonic of a metal steam laser or a YAG laser may be used.

Also, as regards the wavelength band of the exposure light, a monochrome, a quasi-monochrome or a wide band is selected depending on the chromatic aberration corrected situation of the projection optical system PL and illuminating optical system, but the diffraction grating pattern used in the present invention basically permits the use of exposure light of any wavelength band of a monochrome, a quasi-monochrome and a wide band. For example, for exposure light of a wavelength $\lambda_1$, the pitch $P_2$ of the diffraction grating pattern is made into $P_2=2P_1$ (sin $\phi=\lambda_1/P_2$) so that the illuminating light may be incident on a reticle pattern of pitch $P_1$ under the condition that sin $\phi=\lambda_1/2P_1$. On the other hand, for exposure light of a wavelength $\lambda_2$, sin $\phi_2=\lambda_2/2P_1$ and sin $\phi_2=\lambda_2/P_2$, and the relation that $P_2=2P_1$ is a relation determined from these, and even if the exposure wavelength differs, it will not be necessary to change the pitch of the diffraction grating.

Further, to manufacture a diffraction grating pattern in conformity with a reticle as previously described, costs and time are required, but the pitch of a reticle pattern used in a projection-exposing apparatus is generally a substantially constant value in conformity with the resolution thereof. The resolution can be found from the numerical aperture (NA) of the projection optical system and the exposure wavelength (λ). So, it will suffice to find from the projecting magnification and resolution of the projection optical system the pitch of a diffraction grating pattern which can provide a practically sufficient effect, and simply dispose a diffraction grating pattern of the thus found pitch. For example, when the wafer side numerical aperture of the projection optical system is $NA_W=0.5$, in the case of i line, the resolution is of the order of 35 μm L/S, and when the projecting magnification is ⅕, the pitch of the reticle pattern used is approximately 0.70 μm×5=3.5 μm. Thus, a practically sufficient effect will be provided even if a diffraction grating pattern of a pitch of 7 μm is simply provided.

Description will now be made of a projection-exposing apparatus according to a seventh embodiment of the present invention. In this embodiment, the apparatus of the sixth embodiment (FIG. 11) is intactly used and therefore, the construction of the apparatus need not be described. Now, in the sixth embodiment, the diffraction grating pattern (deflecting member) is spaced apart by the spacing Δt from the reticle pattern surface and therefore, there is no possibility of the defect (such as flaw or foreign substances) of the diffraction grating pattern and the diffraction grating pattern itself being transferred onto a wafer. However, there is the possibility of said defect or the diffraction grating pattern itself deteriorating the uniformity of the illumination on the surface of the reticle. So, in the present embodiment, description will be made of a projection-exposing apparatus in which the deterioration of the uniformity of the illumination on the surface of the reticle can be prevented. It is to be understood that a glass substrate 14 (diffraction grating pattern RG1) best suited for the reticle pattern RP1 is already held on the holding member 16 and the pitch directions of the reticle pattern RP1 and diffraction grating pattern RG1 are coincident with each other.

In the projection-exposing apparatus shown in FIG. 11, the main control device 31 opens the shutter SH and starts the exposure of the reticle pattern RP1 onto the wafer W. Further, the main control device 31 stepwisely or continuously moves or vibrates the glass substrate 14 in a plane perpendicular to the optical axis AX during the exposure. This operation is performed by the driving portion 18 and the amount of movement or the amplitude is equal to or greater than the pitch $P_G$ of the diffraction grating pattern RP1. However, to improve the uniformity of the illumination on the surface of the reticle, the greater than the pattern pitch $P_G$ is said amount of movement or said amplitude, the better. If in a plane perpendicular to the optical axis AX, the direction of movement (vibration) of the glass substrate 14 may be arbitrary. As a result, even if the diffraction grating pattern (deflecting member) is disposed near the light source side of the reticle, the deterioration of the uniformity of the illumination on the surface of the reticle can be prevented. The size of the formation area GA of the diffraction grating pattern RP1 on the glass substrate 14 is in conformity with the value ($W_1/2$) described in the sixth embodiment and the amount of movement or the amplitude of the glass substrate 14.

Now, where a monochromatic light source such as a narrow-band excimer laser is used as the light source 1, there is the possibility of the illuminating light causing multiplex reflection and interference between the reticle $R_0$ and the glass substrate 14 to thereby create interference fringe (illumination irregularity) on the surface of the reticle. So, the main control device 31 stepwisely or continuously moves or vibrates the glass substrate 14 in the direction of the optical axis AX during the exposure by the driving portion 19. When at this time, the glass substrate 14 is moved by λ/4 in the direction of the optical axis, the light and shade of the interference fringe are reversed and therefore, the amount of movement or the amplitude of the glass substrate 14 should be about λ/4 or greater, where λ is the wavelength of the illuminating light for exposure. On the other hand, where a light source having a spectrum widened to some degree such as a mercury lamp is used, the coherent distance of the illuminating light is sufficiently short as compared with the spacing between the glass substrate 14 and the reticle $R_0$ (the distance in the direction of the optical axis) and therefore, said movement or said vibration is unnecessary. Also, where use is made of a light source having a long coherent distance to a certain degree such as an excimer laser which is not narrowed in band, said movement or said vibration may preferably be effected, or the distance between the glass substrate 14 and the reticle $R_0$ may preferably be determined to half of the coherent distance of the illuminating light or greater.

Further, where an excimer laser source is used, there is the possibility of illumination irregularity being also caused by the multiplex reflection of the glass substrate 14 itself (the internal reflection between the entrance surface and the exit surface). To prevent this, the glass substrate 14 can be minutely rotated or minutely vibrated during the exposure with any other direction than the optical axis AX as the rotational axis. This is because the length of the optical path in the glass substrate 14 is varied by said minute rotation or said minute vibration and the condition of interference is varied.

Also, in the present embodiment, the glass substrate 14 (diffraction grating pattern) is disposed near the light source side of the reticle, but for example, the diffraction grating pattern (deflecting member) may be deviated by a predetermined amount (determined from said Δt and the optical characteristic of the composite system 11, 12) from the surface in the illuminating optical system conjugate with the reticle pattern surface toward the light source side and the pattern may be moved, vibrated or minutely rotated (vibrated) just as in the present embodiment.

As described above, in the present embodiment, without the illuminating optical system being improved the conventional reticle can be intactly utilized to realize projection exposure of a high resolution and a great depth of focus and moreover, it becomes possible to improve the uniformity of the illumination on the surface of the reticle.

Figure 18:
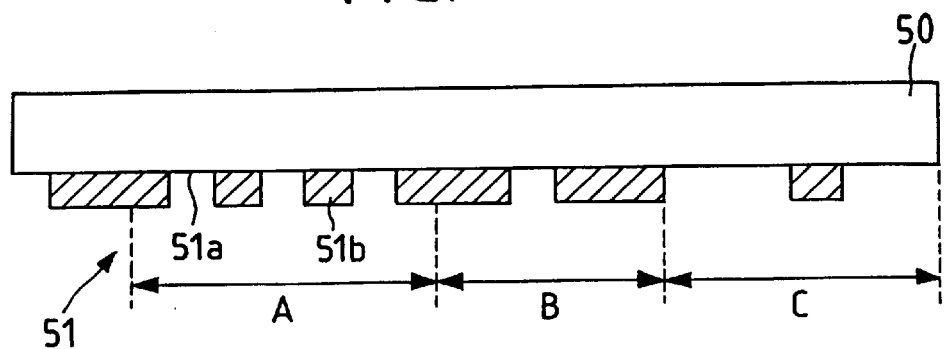
FIG. 18 shows the construction of a half-tone type phase shift reticle used in a projection-exposing apparatus according to an eighth embodiment.

Description will now be made of a projection-exposing apparatus according to an eighth embodiment. of the present invention. Again in this embodiment, the apparatus of the sixth embodiment (FIG. 11) is intactly used and therefore, the construction of the apparatus need not be described. Reference is first had to FIG. 18 to describe the pattern of a reticle used in the present embodiment. In FIG. 18, a circuit pattern 51 comprised of a semi-transmitting portion 51$b$ having a predetermined transmittance and a transmitting portion 51$a$ having a high transmittance (nearly 1) is formed on one surface of a reticle 50 which is a light-transmitting quartz (or glass) substrate. Transmitted light transmitted through the semi-transmitting portion 51$b$ has a phase difference of $(2m+1)\pi$ (m being an integer), as compared with transmitted light transmitted through the transmitting portion 51$a$, and transmission energy is of the order of ¼ or less. This transmitting portion 51$a$ may be the substrate surface itself of the reticle 50. Also, the semi-transmitting portion 51$b$ is formed of metallic thin film, dielectric material thin film (particularly light-absorbent dielectric material thin film) or multilayer film of these materials. In FIG. 18, a portion A represents a one-dimensional line and space pattern, a portion B represents an isolated space pattern, and a portion C represents an isolated line pattern.

Now, the reticle pattern 51 as described above can be formed by forming thin film of the above-mentioned material with a predetermined film thickness (primarily determined in conformity with a phase difference and a transmission energy amount to be given to the transmitted light through the semi-transmitting portion 51$b$) on one surface of the reticle 50, and thereafter effecting one cycle of patterning. Accordingly, the manufacture of the reticle pattern 51 is markedly easy as compared with the manufacture of a phase shift reticle which requires two cycles of patterning of each of a light intercepting member and a phase shifter and alignment between the patterns. Where the semi-transmitting portion 51$b$ is formed of one kind of thin film, said phase difference and said transmission energy amount must be controlled by only the film thickness thereof and it is difficult to satisfy the above-described formation condition. So, if the semi-transmitting portion is made into multilayer structure comprising a plurality of layers of thin film, for example, two-layer structure of a chromium layer and an SOG layer and the phase difference and the transmission energy amount are made controllable independently of each other by the respective film thicknesses, the above-described formation condition can be simply satisfied and moreover, it will become possible to form the reticle pattern by one cycle of patterning.

As described above, in the present embodiment, the reticle 50 having the pattern 51 comprised of the transmitting portion (naked substrate surface portion) 51$a$ and the semi-transmitting portion 51$b$ through which the phase of the transmitted light differs by $(2m+1)\pi$ from the transmitted light through the transmitting portion 51$a$ and the transmission energy is of the order of ¼ or less (which reticle will hereinafter be referred to as the half-tone type phase shift reticle) is inclination-illuminated by the diffracted light from the diffraction grating pattern (deflecting member) as previously described. The half-tone type phase shift reticle is proposed in U.S. application Ser. No. 780,249 (Oct.22, 1991).

Figure 19:
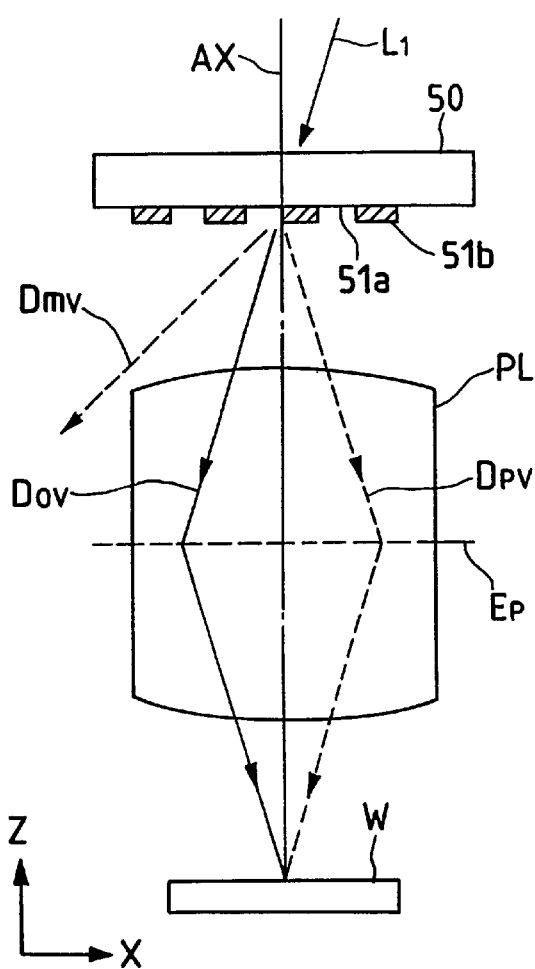
FIG. 19 illustrates the principle of the exposure of the eighth embodiment.

FIG. 19 shows the creation of diffracted lights from the reticle pattern 51, particularly the one-dimensional line and space pattern (the portion A in FIG. 18) and the manner of imaging when inclined illumination is effected to the reticle 50. In FIG. 19, for simplicity of illustration, there is shown only the one-dimensional line and space pattern (duty 1:1) comprising the transmitting portion 51$a$ and the semi-transmitting portion 51$b$. In the present embodiment, the light beams directly illuminating the reticle 50 are ±1st-order diffracted lights L1 and L2 created from the diffraction grating pattern (phase grating) disposed near the light source side of the reticle 50 as previously described. Here, only one of the light beams (+1st-order diffracted light L1) will be described.

Figure 20:
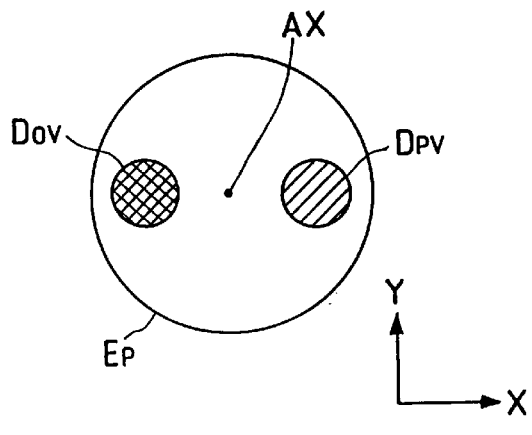
FIG. 20 shows the passage position of diffracted light created from a one-dimentional reticle pattern on the pupil plane of the projection optical system in the projection-exposing apparatus according to the eighth embodiment.

In FIG. 19, the illuminating light beam (diffracted light) L1 incident on the reticle 50 is incident on the reticle 50 from a direction perpendicular to the lengthwise direction of the reticle pattern 51 (the pitch direction of the pattern 51 and in FIG. 19, X direction) with the angle of diffraction $\phi$ on the diffraction grating pattern as the angle of incidence. The angle of incidence (the angle of diffraction) $\phi$ is primarily determined by the pitch P51 of the reticle pattern 51, i.e., the position of the diffracted light created from the reticle pattern 51 in the pupil plane Ep of the projection optical system PL. When the illuminating light beam L1 is incident on the reticle 50 at an angle $\phi$ with respect thereto, 0-order diffracted light $D_{OV}$, +1st-order diffracted light $D_{PV}$ and −1st-order diffracted light $D_{MV}$ are created from the reticle pattern 51 in the direction of the angle of diffraction conforming to the pattern pitch P51. In FIG. 19, the light beams passing through the pupil plane Ep of the projection optical system PL to the wafer W are 0-order diffracted light $D_{OV}$ and +1st-order diffracted light $D_{PV}$ of the above-mentioned three light beams, and these two light beams form an interference fringe, i.e., the image of the pattern on the wafer W. The positions of the 0-order diffracted light $D_{OV}$ and +1st-order diffracted light $D_{PV}$ in the pupil plane Ep of the projection optical system PL at this time are shown in FIG. 20. As is apparent from FIG. 20, one of the ±1st-order diffracted lights (in FIG. 20, +1st-order diffracted light $D_{PV}$) and 0-order diffracted light ($D_{OV}$) created from the reticle pattern 51 pass substantially equidistantly from the optical axis AX in the pupil plane Ep of the projection optical system Ep. That is, in principle, illumination equivalent to the inclined illuminating method (deformed light source method) is realized and a high resolution and a great depth of focus are obtained.

Now, when the illumination of the half-tone type phase shift reticle 50 is effected by the use of the projection-exposing apparatus of FIG. 11, the intensity ratio of the 0-order diffracted light $D_{OV}$ and the +1st-order diffracted light $D_{PV}$ varies in conformity with the amplitude transmittance of the semi-transmitting portion 51b. If for example, the amplitude transmittance of the semi-transmitting portion 51b is 0 when the amplitude transmittance of the transmitting portion 51a is 1, said intensity ratio from the one-dimensional line and space pattern (duty 1:1) becomes approximately 1:0.4. Generally, the contrast of the reticle pattern 51 created on the wafer W (the contrast of the interference fringe by the two light beams, i.e., the 0-order diffracted light $D_{OV}$ and the +1st-order diffracted light $D_{PV}$) becomes maximum (100%) when the intensities of the two light beams are equal, that is, the intensity ratio of the two light beams is 1:1. Therefore, by approximating the intensity ratio of the two light beams to 1:1, the contrast of the image can be improved.

When in the reticle pattern (one-dimensional pattern) used in the present embodiment, for example, the amplitude transmittance of the transmitting portion 51a is 1 and the amplitude transmittance of the semi-transmitting portion 51b is −0.222 (the phase difference relative to the transmitting portion 51a is π, and the energy transmittance is 4.93%), the intensity ratio of the 0-order diffracted light $D_{OV}$ and the 1st-order diffracted light $D_{PV}$ can be made into 1:1. That is, the constrast of the image can be made into 100%. If the remaining film characteristic of photoresist is taken into consideration, the value 4.93% of the transmittance of the semi-transmitting portion 51b can be regarded as leading to the obtainment of the same result as the complete light interception of the conventional reticle, and the problem of the light intercepting property does not arise at all.

In the foregoing, description has been made of a case where a one-dimensional line and space pattern is used as the reticle pattern 51. However, it is sometimes the case with the actual reticle that besides the line and space pattern in FIG. 18, a one-dimensional line and space pattern (FIG. 21) arranged, for example, in a direction (Y direction) orthogonal to the pitch direction (X direction) of the pattern is also formed. The pattern 51A in FIG. 21 is formed under the same conditions (pitch, etc.) as the pattern in FIG. 19, and differs only in that the pitch directions of the pattern are orthogonal to each other.

Figure 21:
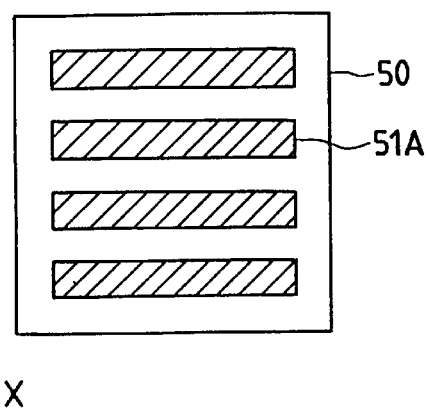
FIG. 21 shows another example of the reticle pattern used in the eighth pattern.
Figure 22:
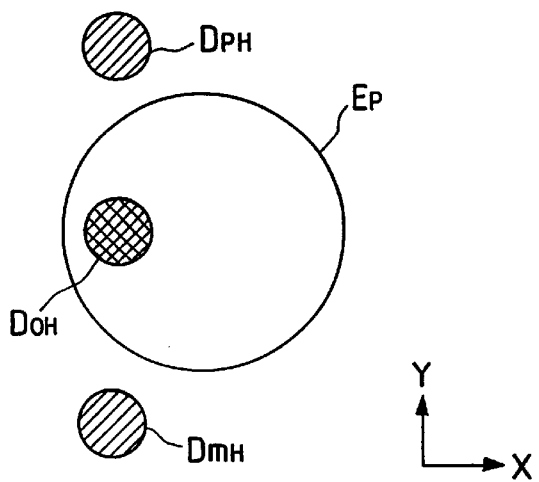
FIG. 22 shows the passage position of diffracted light created from the reticle pattern of FIG. 21 under the illuminating condition of FIG. 19 on the pupil plane of the projection optical system in the projection-exposing apparatus according to the eighth embodiment.

FIG. 22 shows the passage positions of diffracted lights created from the pattern 51A of FIG. 21 in the pupil plane Ep of the projection optical system when the illuminating light beam is applied to the pattern 51A under the same illuminating condition as in FIG. 19, that is, while being inclined from the lengthwise direction of the pattern 51A (a direction perpendicular to the pitch direction, and in FIG. 22, X direction). As is apparent from FIG. 22, only the 0-order diffracted light $D_{OH}$ passes through the pupil plane Ep of the projection optical system PL and neither of ±1st-order diffracted lights $D_{PH}$ and $D_{MH}$ is positioned in the pupil plane $E_P$ and therefore can be transmitted through the projection optical system PL. Accordingly, only the 0-order diffracted light $D_{OH}$ arrives at the wafer, and an interference fringe, i.e., a pattern image, is not formed.

Figure 23:
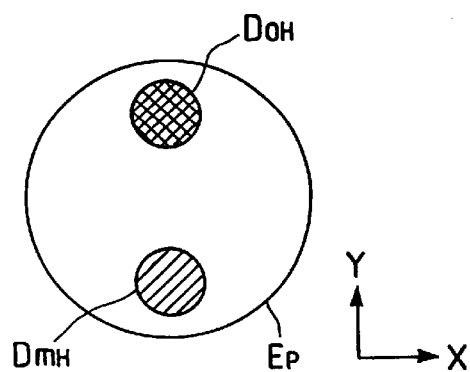
FIG. 23 shows the passage position of diffracted light created from the reticle pattern of FIG. 21 under an optimum illuminating condition on the pupil plane of the projection optical system in the projection-exposing apparatus according to the eighth embodiment.

So, the illuminating light beam can be made to be incident on the line and space pattern 51A as shown in FIG. 21 while being inclined from the pitch direction of the pattern 51A (Y direction). FIG. 23 shows the passage positions of the diffracted lights created from the pattern 51A at this time in the pupil plane Ep of the projection optical system. In FIG. 23, the 0-order diffracted light $D_{OH}$ and the −1st-order diffracted light $D_{MH}$ are transmitted through the projection optical system PL and therefore, the interference fringe of the two light beams, i.e., the pattern image, is formed on the wafer.

Figure 24A:
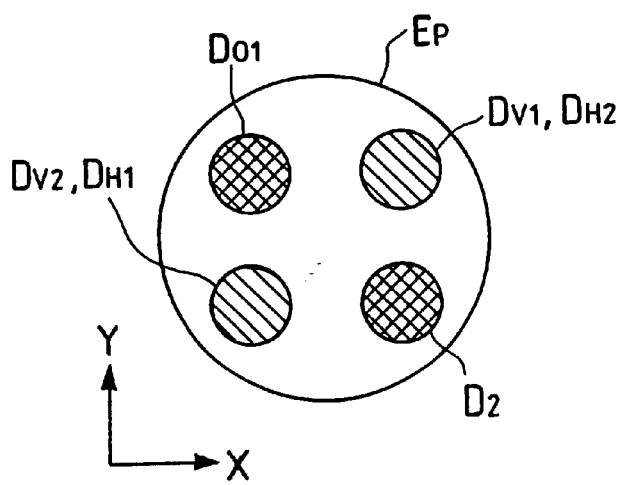
FIGS. 24A–24D show the passage positions of diffracted light created from a two-dimensional reticle pattern when the reticle pattern is inclination-illuminated with two or four light beams on the pupil plane of the projection optical system in the projection-exposing apparatus according to the eighth embodiment.

Thus, when a reticle having one-dimensional line and space patterns (a longitudinal pattern 51 and a lateral pattern 51A) having periodicity in each of two directions orthogonal to each other is to be illuminated by two illuminating light beams, the directions of incidence of the two illuminating light beams onto the reticle pattern can be determined so that the passage positions of two 0-order diffracted lights $D_{01}$ and $D_{02}$ in the pupil plane Ep of the projection optical system may be such as shown in FIG. 24A. By such disposition being adopted, one of the ±1st-order diffracted lights from the pattern 51 by each of the two illuminating light beams passes through partial areas $D_{V1}$ and $D_{V2}$ and likewise, of the ±1st-order diffracted lights from the pattern 51A passes through partial areas $D_{H1}$ and $D_{H2}$. The 0-order diffracted light $D_{OV}$ in FIG. 23 does not contribute to the improvement in the contrast of the image, but simply provides predetermined offset (a predetermined quantity of light irrespectively of the position) even if the half-tone type phase shift reticle is used, because 1st-order diffracted lights interfering with each other to form an image are not present (1st-order diffracted which can be transmitted through the pupil plane of the projection optical system are not present. Therefore, the periodic pattern 51 in FIG. 19 is resolved., but the pattern 51A in FIG. 21 cannot be resolved.

Figure 24B:
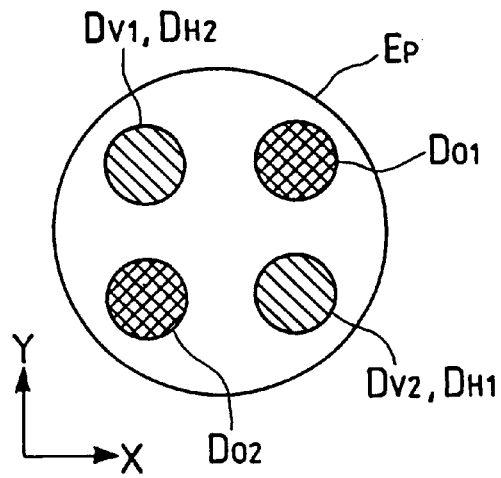

Even when inclined illumination is effected to the reticle having the periodic patterns 51 and 51A by the use of two illuminating light beams so that there may be obtained an illumination distribution as shown in FIG. 24B, there is obtained a result similar to that when inclined illumination which can provide an illumination distribution as shown in FIG. 24A. In FIGS. 24A and 24B, however, the directions of incidence of the two illuminating light beams onto the reticle pattern are substantially orthogonal to each other.

Figure 24C:
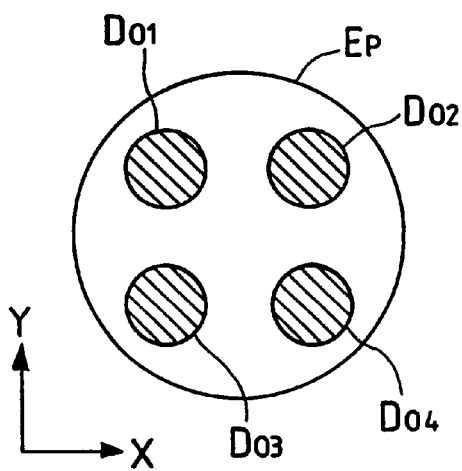

Further, even when inclined illumination which can provide an illumination distribution as shown in FIG. 24C is effected by the use of the two light beams used in FIG. 24A and the two light beams used in FIG. 24B at a time, the periodic patterns 51 and 51A can be imaged on the wafer with high contrast. Here, when one of the four light beams is incident on the periodic patterns 51 and 51A, 0-order diffracted lights created from these patterns pass through a partial area $D_{01}$ (FIG. 24C) in the pupil plane Ep. Further, 1st-order diffracted lights created from the patterns 51 and 51A pass through positions in the pupil plane Ep horizontally and vertically spaced apart by a predetermined distance about the partial area $D_{01}$. Particularly, one of the ±1st-order diffracted lights created from the pattern 51 passes through a partial area $D_{02}$, and one of the ±1st-order diffracted lights created from the pattern 51A passes through a partial area $D_{03}$. Therefore, the patterns 51 and 51A can be resolved well under any of the illuminating conditions as shown in FIGS. 24A–24C.

Figure 26:
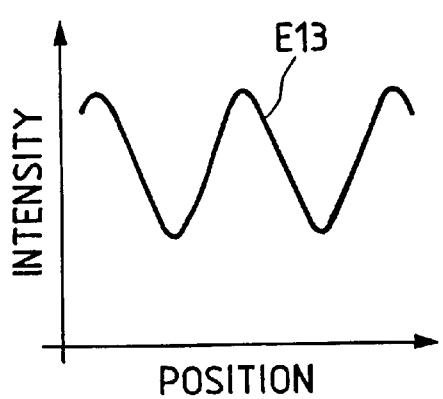
FIG. 26 shows the image intensity distribution of a pattern on a wafer in a projection-exposing apparatus according to the prior art.

FIG. 26 shows an example of the result of the calculation of the image intensity when an illuminating light beam is inclined and applied to a one-dimensional 1:1 line and space pattern comprising a transmitting portion and a light intercepting portion (transmittance 0) so that the illumination distribution on the pupil plane of the projection optical system may be such as shown in FIG. 24A. At this time, the image intensity is indicated by E13 and the contrast of the image is about 53%. This means that as previously described, the 0-order diffracted light has become an offset component and the contrast has been reduced. In the presentday photoresist, the minimum image contrast necessary to form a line and space pattern is considered to be about 60%, and the transfer of a pattern to resist cannot be accomplished by the combination of a conventional projection-exposing apparatus and a conventional reticle (a reticle comprising only a transmitting portion and a light intercepting portion).

Figure 25:
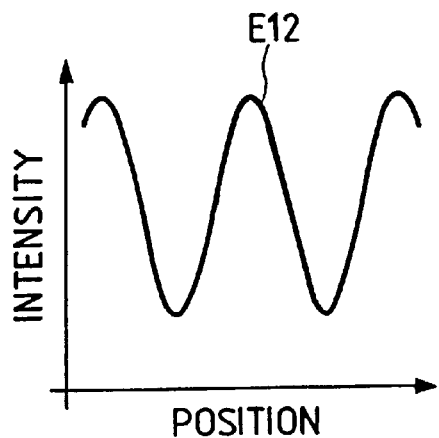
FIG. 25 shows the image intensity distribution of the pattern on a wafer in the projection-exposing apparatus according to the eighth embodiment.

To reduce the influence of the reduction in contrast by this offset component, it is conceivable to reduce the relative intensity ratio of 0-order diffracted light to 1st-order diffracted light created from the reticle pattern. So, FIG. 25 shows an example of the result of the calculation of the image intensity when an illuminating light beam is inclined and applied to a reticle in which the amplitude transmittance of the semi-transmitting portion is −0.3 (the phase difference relative to the transmitting portion is π and the energy transmittance is 9%) relative to the transmitting portion of an amplitude transmittance 1 so that the illumination distribution as shown in FIG. 24A or 24B may be obtained. At this time, the image intensity is indicated by E12. Also, this image has contrast of about 70%, and the transfer of the pattern is possible by the use of the presentday photoresist. This is because the amplitude transmittance of the semi-transmitting portion of the reticle is of the order of −0.3 and therefore 0-order diffracted light created from the line and space pattern decreases and the offset component of the image decreases and further, the 1st-order diffracted light component transmitted through the pupil plane of the projection optical system increases.

A one-dimensional line and space pattern having directionality orthogonal to the pattern for which the result of the calculation has been shown here is also imaged with similar contrast. That is, where a reticle having a two-dimensional 1:1 line and space pattern is illuminated under the illuminating condition of any one of FIGS. 24A–24C (two light beams or four light beams) suited for the directionality of each pattern, if the amplitude transmittance of the semi-transmitting portion is of the order of −0.3 when the amplitude transmittance of the transmitting portion of the reticle is 1, it will become possible to minimize the reduction in the image contrast by the offset caused by the 0-order diffracted light.

In the above-described embodiments, the shape (pitch and pitch direction) of the diffraction grating pattern has been determined so that of the diffracted lights of the 1st-order diffracted lights from the diffraction grating pattern by the reticle pattern, one of the ±1st-order diffracted lights and the 0-order diffracted and thus, total two light beams, may arrive at the wafer. This is because if of the diffracted lights created from the reticle pattern, only the 0-order diffracted light has arrived at the wafer, the image of the reticle pattern cannot be formed on the wafer by the 0-order diffracted light alone and the 0-order diffracted light as mere offset light deteriorates the contrast of the image formed by the other illuminating light beam.

Figure 24D:
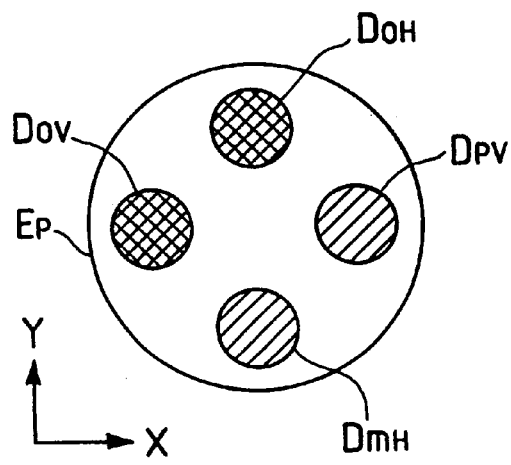

In the present embodiment, however, use is made of the half-tone type phase shift reticle and therefore, by increasing the amplitude transmittance of the semi-transmitting portion 51b, the intensity of the 0-order diffracted light created from the reticle pattern can be made small as compared with the intensity of the 1st-order diffracted light. Accordingly, even if such an illuminating light beam that only the 0-order diffracted light from the reticle pattern arrives at the wafer is incident on the reticle, the quantity of the offset component by this light beam becomes small as compared with a case where the conventional reticle is used. Therefore, the degree of the reduction in the contrast of the image formed by the other illuminating light beam may be small. Accordingly, even if the shape of the diffraction grating pattern, i.e., the direction of incidence of the illuminating light beams onto the reticle pattern, is determined so that the passage positions of the illuminating light beams in the pupil plane of the projection optical system may be such as shown in FIG. 24D, it will be possible to obtain an iamge of sufficient contrast. The diffraction grating pattern to be used at this time can be the diffraction grating pattern RG2 shown in FIG. 16B as it has been rotated by 45° in the plane of the drawing sheet of FIG. 16B.

Now, the line width and directionality of the pattern of the reticle used in the projection-exposing apparatus are not limited to one kind. Therefore, it is desirable that the angle and direction of diffraction of the diffracted light created from the diffraction grating pattern used in the present embodiment, i.e., the passage position of the 0-order diffracted light in the pupil plane of the projection optical system, be variable depending on the kind of the reticle pattern. The reason for this is that the direction and angle of incidence of the illuminating light beam onto the reticle pattern are determined by the direction in which the pattern is depicted, and the width and pitch of the pattern.

Also, if the angle of incidence ϕ of the illuminating light beam, i.e., the angle of diffraction on the diffraction grating pattern (the pattern pitch $P_G$), is determined so that the distances of one of the ±1st-order diffracted lights and 0-order diffracted light created from the reticle pattern from the optical axis AX may be substantially equal in the pupil plane of the projection optical system, the depth of focus of the image on the wafer can be made great. The pitch direction and pitch $P_G$ of the diffraction grating pattern are determined in conformity with the direction of incidence determined in this manner. Also, when a pattern depicted in a two-dimensional direction is to be illuminated, it can be illuminated with the directions of incidence of two or four illuminating light beams adjusted to the pitch direction of each pattern as previously described. At this time, the illumination distribution on the pupil plane of the projection optical system are as shown in FIGS. 24A–24C.

Figure 27A:
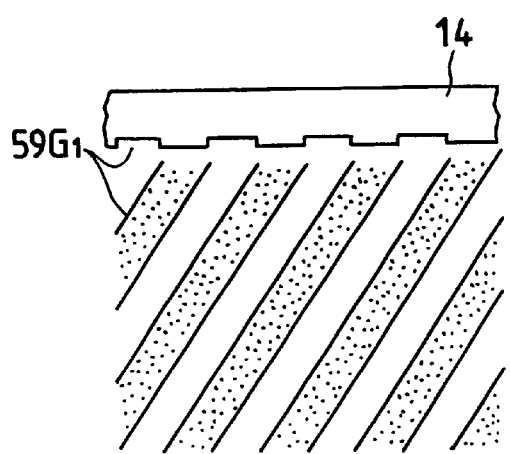
FIGS. 27A and 27B are fragmentary enlarged views of modifications of a deflecting member (glass substrate) used in the projection-exposing apparatus according to the eighth embodiment.
Figure 27B:
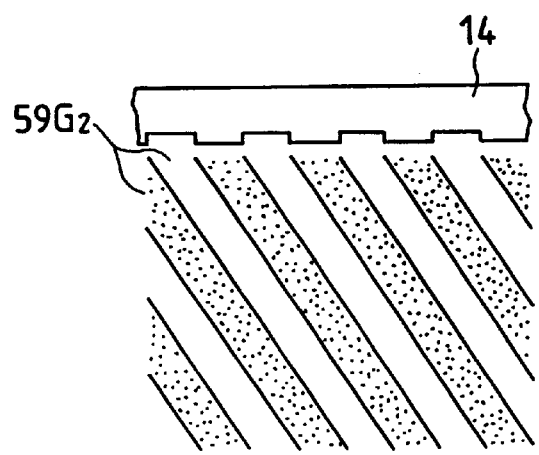

Further, the amplitude transmittance of the semi-transmitting portion of the reticle pattern used may preferably be of the order of −0.3. Also, the ±1st-order diffracted lights from the diffraction grating pattern are used as illuminating light beams and thus, each pattern on the reticle is illuminated from two directions symmetrical with respect to the optical axis AX. This also leads to the advantage that the centroidal directions of the quantities of light of these light beams are coincident with the optical axis and the positional deviation (telecentric deviation) of the image by defocus does not occur. Further, when the reticle having the one-dimensional line and space pattern shown in FIG. 19 is to be illuminated, the reticle pattern is likewise illuminated by the ±1st-order diffracted lights and therefore, the problem of telecentric deviation does not arise. Also, use may be made of one-dimensional diffraction grating patterns 59G1 and 59G2 arranged in a direction inclined by 45° with respect to the pitch directions of the reticle patterns 51 and 51A, as shown in FIGS. 27A and 27B, and the illuminated states as shown in FIGS. 24A and 24B can be created.

As described above, in the present embodiment, the inclined illumination by the diffraction grating pattern is applied to the half-tone type phase shift reticle. Further, when the reticle pattern 51 is exposed onto the wafer W, use is also made of the progressive focus exposing method whereby the wafer W is stepwisely or continuously moved or vibrated in the direction of the optical axis AX of the projection optical system PL during the exposure of a shot area. The movement range or vibration range (amplitude) of the wafer is set with the depth of focus of the projection optical system and the level difference on the surface of the wafer taken into account. That range can be divided, for example, into a plurality of steps such as a lower portion, a middle portion and an upper portion, and exposure can be effected in each step. It is widely known that by using this method, it is possible to increase the depth of focus particularly in an isolated pattern. This progressive focus exposing method is not restricted to moving the wafer, but for example, such design may be adopted that at least one of optical members constituting the projection optical system is moved, whereby the imaging plane of the projection optical system is moved.

Generally, if for a dense, continuous pattern like a line and space pattern, as already described, illumination is effected so that one of the ±1st-order diffracted lights and the 0-order diffracted light may pass through positions in the pupil plane of the projection optical system substantially equidistant from the optical axis, the depth of focus will increase. The actual reticle pattern, however, includes both of a dense pattern like a line and space pattern and so-called isolated pattern. Accordingly, if for such a reticle, the progressive focus exposing method is used simultaneously with the above-described inclined illuminating method, it will be possible to increase the apparent depth of focus for any pattern. For this purpose, in the projection-exposing apparatus of FIG. 1, the main control device 31 can drive the wafer stage 29 by the driving system 30 to move or vibrate the wafer W in the direction of the optical axis of the projection optical system PL and also control the opening and closing of the shutter SH.

In the present embodiment, as regards the numerical aperture $NA_{IL}$ of the light beam illuminating the diffraction grating (glass substrate), it is desirable that as previously described, the coherence factor ($\sigma$ value) be of the order of $0.1 \leq \sigma \leq 0.3$. This is because if the $\sigma$ value is too small, the degree of faithfulness of the image will be reduced by the proximity effect or the like, and if the a value is too great, the coherence between the light beams transmitted through the transmitting portion and semi-transmitting portion of the reticle pattern will be reduced and the improvement effects of the resolution and the depth of focus will be descreased.

Also, in the apparatus of FIG. 11, the symmetrically inclined illumination of the reticle pattern by the diffraction grating pattern is effected, while in the present embodiment, the half-tone type phase shift reticle is used and therefore, the intensities of the 0-order diffracted light and 1st-order diffracted lights on the pupil plane of the projection optical system can be made substantially equal. Accordingly, in the present embodiment, it is not necessary to cause a plurality of light beams to be symmetrically incident on the reticle pattern and moreover, it is not always necessary that the intensities of the ±1st-order diffracted lights created from the diffraction grating pattern (deflecting member) be equal. Further, it is to be understood that the diffraction grating pattern is formed on the whole surface of the glass substrate used in the present embodiment, but the formation area of the diffraction grating pattern on the glass substrate can be set, for example, only on the pattern portion (the pattern portion comprising the transmitting portion and the semi-transmitting portion) of the reticle so as to satisfy the aforedescribed condition which is free of the influence of the half-shadow blur. Also, the diffraction grating pattern (deflecting member) may be disposed at a predetermined distance (a value corresponding to $\Delta t$) from the conjugate surface of the reticle pattern is the illuminating optical system.

A projection-exposing apparatus according to a ninth embodiment of the present invention will now be described with reference to FIG. 28. In this embodiment, description will be made of a projection-exposing apparatus of the step and scan type provided with a reflection refraction reduction-projection optical system of ¼ reduction (hereinafter simply referred to as the projection optical system) comprised of a combination of a refracting element and a reflecting element.

Figure 28:
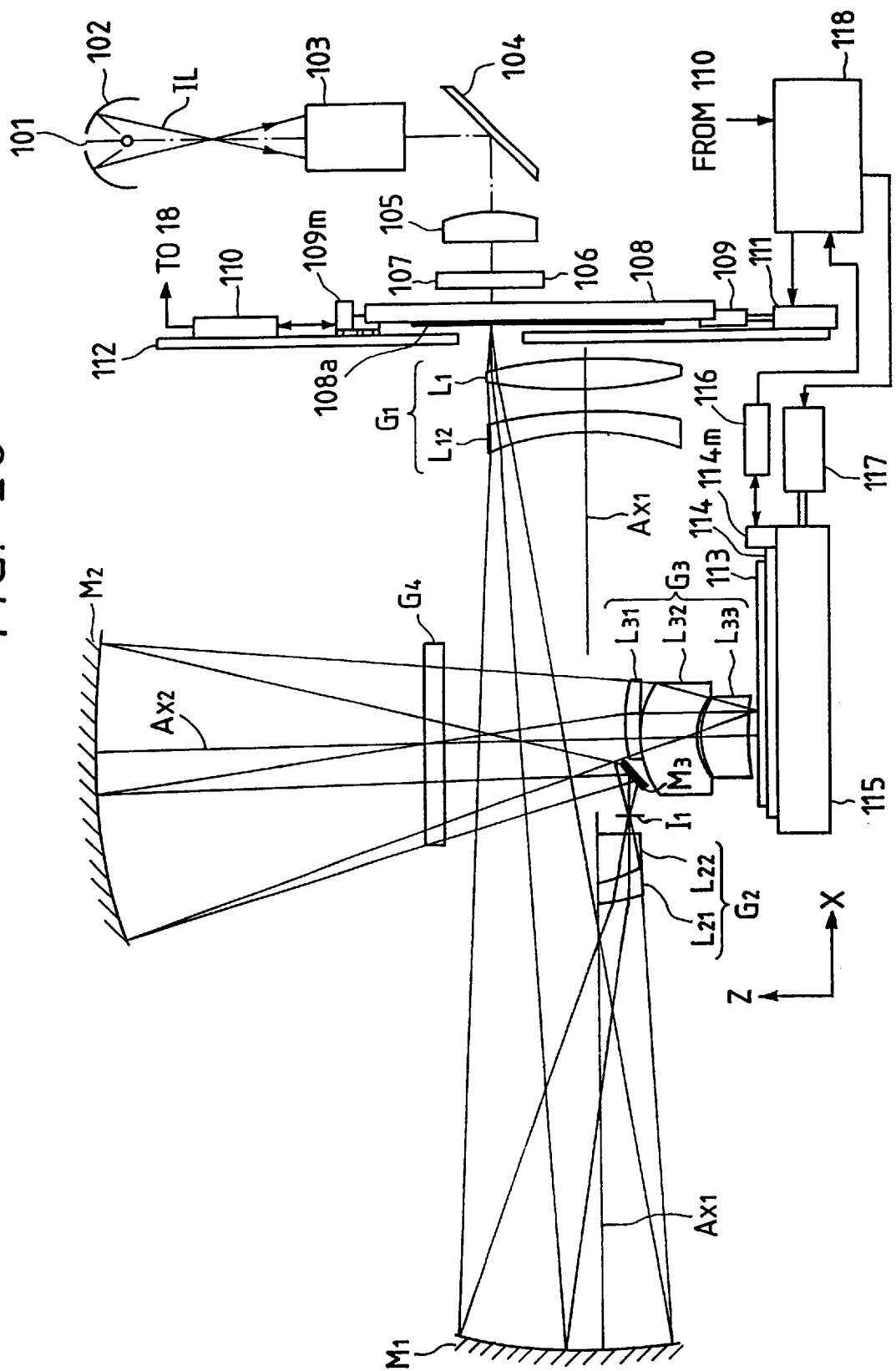
FIG. 28 schematically shows the construction of a projection-exposing apparatus according to a ninth embodiment of the present invention.

In FIG. 28, illuminating light IL emitted from a mercury lamp 101 is reflected by an elliptical mirror 102 and enters an illuminating optical system 103 including an optical integrator (fly-eye lens), an aperture stop and a stop member having an arcuate slit. The aperture stop is a variable stop for prescribing the numerical aperture of the illuminating optical system, and in the present embodiment, the aperture diameter thereof is determined so that $\sigma$ value may be of the order of 0.1–0.3.

Further, the illuminating light emerging from the illuminating optical system 103 is applied to a reticle 108 via a mirror 104, a condenser lens 105 and a glass substrate 106 having a diffraction grating pattern 107 formed on the back thereof (the surface adjacent to the reticle). The glass substrate 106 is a substrate (quartz substrate or the like) transparent to the illuminating light IL, and the diffraction grating pattern 107 is a one-dimensional phase type diffraction grating provided at a predetermined pitch on the substrate 106. The phase grating pattern 107 is one on which dielectric material thin film is patterned, and the duty thereof is 1:1. The constructions of the light source 101 to the condenser lens 105 are entirely similar to those in the prior-art apparatus.

Now, when the illuminating light IL is incident on the glass substrate 106 substantially perpendicularly thereto, only ±1st-order diffracted lights are created from the diffraction grating pattern 107. Further, the ±1st-order diffracted lights are inclined by a predetermined angle with respect to the reticle 108 and are incident on a circuit pattern (a one-dimensional line and space pattern formed in a pattern area 108a. The illuminating area of the illuminating light on the reticle pattern surface is arcuate. The reticle 108 is held on a reticle stage 109 movable on a column 112 at a uniform speed in at least Z direction (a vertical direction in the plane of the drawing sheet of FIG. 28). The reticle stage 109 effects one-dimensional scanning movement in Z direction and minute rotational movement for the correction of yawing by a driving system 111. A movable mirror 109m for reflecting a length measuring beam from a laser interferometer 110 is fixed to one end of the reticle stage 109, and the position in Z direction and the amount of yawing of the reticle 108 are measured on real time by the interferometer 110.

The circuit pattern formed on the reticle 108 is reduced to ¼ by a projection optical system (G1-G4, M1, M2) and is transferred onto a wafer 113. The wafer 113 is held on a minutely rotatable wafer holder 114 which is provided on a two-dimensionally movable wafer stage 115. The wafer stage 115 is driven by a driving system 117, and the coordinates position and the amount of yawing thereof are measured by a laser interferometer 116. A fixed mirror 114m for reflecting a length measuring beam from the interferometer 116 is fixed to one end portion of the wafer stage 115.

Now, the effective exposing area of the projection optical system (G1-G4, M1-M3) in FIG. 28 is an arcuate slit area, and during exposure, the reticle 108 and the wafer 113 are moved (scanned) at a predetermined speed in Z direction and X direction, respectively. At this time, a main control system 118 controls the scanning speeds of the stages 109 and 115 so as not to destroy the imaging relation between the reticle 108 and the wafer 113. In the present embodiment the projecting magnification is ¼ and therefore, the movement speed Vws of the wafer stage 115 in X direction during scan exposure is ¼ of the movement speed Vrs of the reticle stage 109 in Z direction. The main control system 118 moves the reticle stage 109 and the wafer stage 115 relative to each other during scan exposure while keeping a predetermined speed ratio, on the basis of positional information (and further, speed information) from the interferometers 110 and 116, yawing information, and speed information from tachogenerators or the like in the driving systems 111 and 117, and while suppressing the relative positional relation between the reticle pattern and a shot area on the wafer 113 within a predetermined alignment error.

Description will now be made of the specific construction of the projection optical system shown in FIG. 28. As shown, the light beam from the reticle pattern surface passes through a first lens group G1 comprising a biconvex positive lens L11 and a negative meniscus lens L12 having its convex surface facing the reticle side and is directed to a first concave reflecting mirror M1. The light beam is given a predetermined reduction magnification by the reflection here, and enters a second lens group G2 comprising a negative meniscus lens L21 having its convex surface facing the first concave reflecting mirror M1 and a positive lens L22 having its surface of sharper curvature facing the first concave reflecting mirror M1 side. A further reduced primary image $I_1$ is formed by the second lens group G2. The light beam from the primary image $I_1$ is reflected an optical path bending plane reflecting mirror M3 and is incident on a second concave reflecting mirror M2, and is given a magnification somewhat greater than one-to-one magnification by the reflection here. Further, the light beam is given a reduction magnification by a third lens group G3 comprising a positive lens L31 having its surface of sharper curvature facing the second concave reflecting mirror M2 side, a meniscus lens L32 having its convex surface facing the second concave reflecting mirror M2 side, and a positive lens L33 having its surface of sharper curvature facing the second concave reflecting mirror M2 side, and a secondary image more reduced than the primary image $I_1$ is formed on the wafer 13. A negative lens having weak negative refractive power is disposed as a fourth lens group G4 between the second concave reflecting mirror M2 and the third lens group G3, and corrects high-order spherical aberrations well.

In the above-described construction, the first lens group G1, the first concave reflecting mirror M1 and the second lens group G2 together constitute a first partial optical system, and the second concave reflecting mirror M2, the third lens group G3 and the fourth lens group G4 together constitute a second partial optical system. The second lens group G2 in the first partial optical system is provided only on one side of the optical axis $A_{x1}$ of the first partial optical system to condense only the reflected light from the first concave reflecting mirror M1 without intercepting the light beam travelling toward the first concave reflecting mirror M1. Also, the optical path bending plane reflecting mirror M3 is obliquely disposed near the third lens group G3 at an angle of 45° with respect to the optical axis $A_{x1}$ of the first partial optical system, and is designed to make the optical axis $A_{x2}$ of the second partial optical system orthogonal to the optical axis $A_{x1}$ of the first partial optical system. The plane reflecting mirror M3 is near the primary image $I_1$ and therefore, the size thereof is small, and this mirror can be sufficiently installed by cutting away a portion of the first positive lens L31 in the first lens group G3. Also, the fourth lens group G4 in the second partial optical system is provided so as not to intercept the optical path of the first partial optical system. Although the angle at which the plane reflecting mirror M3 is obliquely disposed is 45°, this mirror can of course be disposed in an arbitrary manner within a range which permits the separation of the optical path.

Figure 29:
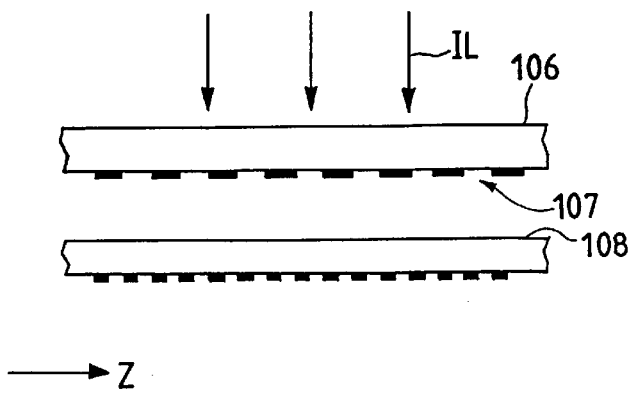
FIG. 29 is a fragmentary enlarged view of a diffraction grating pattern and a reticle in FIG. 28.

FIG. 29 is a fragmentary enlarged view of the diffraction grating pattern 107 and the reticle 108. The diffraction grating pattern 107 is a phase shift pattern, and the phase of light transmitted through the phase shift portion thereof deviates by approximately $(2m+1)\pi$[rad] (m being an integer) relative to the phase of light transmitted through the light transmitting portion thereof. As a result, as in each of the afore-described embodiments, illumination equivalent to the deformed light source method (the inclined illuminating method) can be realized, and projection exposure of a high resolution and a great depth of focus becomes possible.

The formation area of the diffraction grating pattern 107 on the glass substrate 106 can be determined to the same degree of size as or larger than the illuminated area (the arcuate slit area) on the pattern surface of the reticle 108. At this time, it is desirable that with the numerical aperture $NA_{IL}$ of the illuminating light taken into account, the formation area of the diffraction grating pattern 107 be made wider by at least an amount matching the numerical aperture $NA_{IL}$ than the illuminated area. The spacing between the diffraction grating pattern 107 and the reticle pattern and the formation condition of the diffraction grating pattern 107 are just similar to those in the aforedescribed embodiments. Although not shown, again in the present embodiment, an interchange mechanism and finely moving mechanism for the glass substrate 106 are provided, and the pitch directions of the reticle pattern and diffraction grating pattern 107 are coincident with each other.

Figure 30:
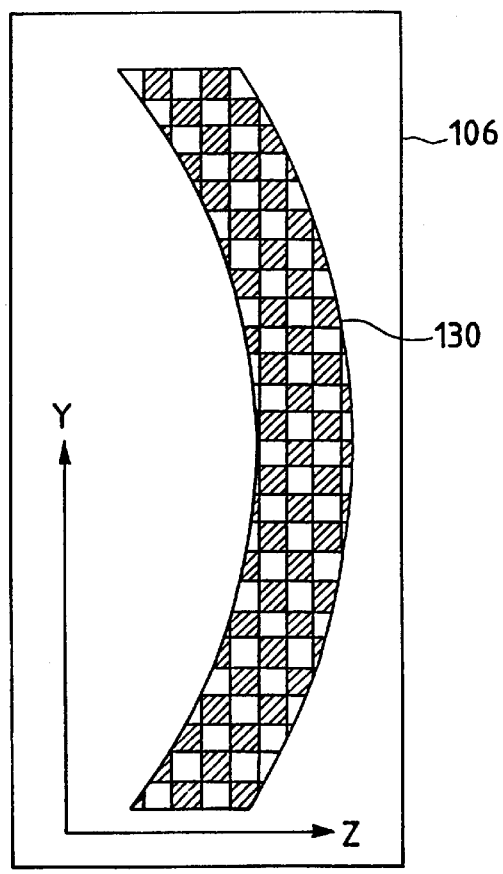
FIG. 30 shows an example of the diffraction grating pattern suitable for the apparatus of FIG. 28.

Now, the actual reticle pattern includes many periodic patterns (longitudinal patterns and lateral patterns) arranged chiefly in two directions orthogonal to each other. An example of the diffraction grating pattern suitable for this kind of reticle pattern is shown in FIG. 30. As shown in FIG. 30, the diffraction grating pattern 130 is a checked phase type diffraction grating (phase shift pattern). Also, the formation area of the diffraction grating pattern 130 on the glass substrate 106 is arcuate and is determined so as to be more or less wider than the illuminating area of the illuminating optical system on the reticle pattern, i.e., the effective exposure area of the projection optical system. This takes into account the expanse (blur) of the illuminated area created due to the spacing Δt between the diffraction grating pattern 130 and the reticle pattern. In FIG. 30, for the convenience of illustration, the size (pitch) of the check is exageratedly shown. Actually, the checked pattern is formed at a pitch much more minute than the arcuate area, i.e., a pitch double that of the reticle pattern.

Now, when the illuminating light IL is incident on the diffraction grating pattern 130 in FIG. 30 perpendicularly thereto, four 1st-order diffracted lights are created in directions (Y, Z)=(+1, +1), (+1, −1), (−1, +1), (−1, −1). Also, the angles of diffraction thereof are primarily determined by the period (pitch) of the checked pattern. Accordingly, light beams incident on the reticle 108 are only the 1st-order diffracted lights from said four directions, and a perpendicular incident light beam (0-order diffracted light from the diffraction grating pattern 130) is not created.

Figure 31:
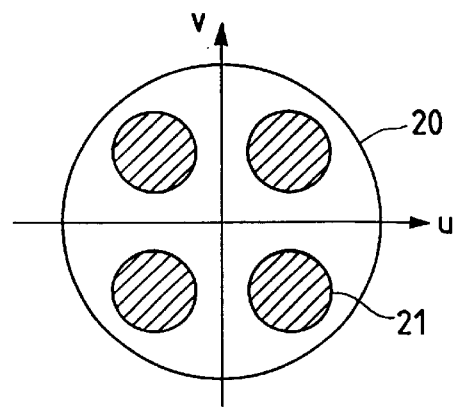
FIG. 31 shows the angle distribution of the incident light onto the reticle when the diffraction grating pattern of FIG. 30 is used.

As a result, the angle distribution of the incident light 121 onto the reticle 108 becomes such as shown in FIG. 31. In FIG. 31, u indicates the angle in Y direction and v indicates the angle in Z direction, and the reference numeral 20 designates the opening of the projection optical system. This is entirely equivalent to the deformed light source method. The angle of incidence of each of these diffracted lights has an optimum value depending on the pitch of the reticle pattern. This angle of incidence is described, for example, SPIE 1974-63, 1992, "New Imaging Technique for 64M-DRAM", etc. However, where an illuminating state (system) equivalent to the deformed light source method is to be realized by the use of a phase type diffraction grating disposed near the light source side of the reticle, the pitches of the phase type diffraction grating in X and Y directions can be determined to the double of the pitches of the reticle pattern in X and Y directions. This also holds true of the case of the checked grating shown in FIG. 30. Thereby, the optimum angle of incidence of the illuminating light conforming to the pitch of the reticle pattern can be obtained.

Also, the above-described relation is constant irrespective of the wavelength of the illuminating light and therefore, even if the light source has a wide band or a wavelength width comprising discrete several bright lines, an optimum illuminating condition conforming to the pitch of the reticle pattern can be realized. The phase difference provided by the phase type diffraction grating 107, 130 will deviate from an ideal phase difference π[rad] if the exposure wavelength varies. However, supposing, for example, a light source having a central wavelength of 240 nm and a wavelength width of the order of ±10 nm, a phase shifter which provides a phase difference of 180° (π[rad]) to light of a wavelength 240 nm provides a phase difference of 187.8° to light of a wavelength 230 nm. If such a case, the offsetting of 0-order light by the phase shifter does not completely take place and thus, 0-order diffracted light is created in the vicinity of the origin (u=v=o) of FIG. 31, that is, substantially perpendicular incident light as is conventional is created for the reticle. As a result, the effect in the apparatus (FIG. 28) of the above-described construction which is equivalent to the deformed light source method lessens. However, the intensity ratio of the 0-order light and four 1st-order diffracted lights created at the phase difference of 187.8° is merely 0.7%, which is not such an amount that the image quality (the resolution and the depth of focus) is substantially deteriorated.

Also, as is apparent from FIG. 28, the diffraction grating pattern 107 is not in a relation conjugate with the wafer surface onto which the reticle pattern is to be transferred (the imaging relation) and therefore, it is difficult for the defect of the reticle or a foreign substance adhering thereto to be transferred onto the wafer surface, and the presence of more or less defect or the like would pose no problem. Further, the reticle 108 is scanned in Z direction relative to the phase type diffraction grating 130 as shown in FIG. 30, and there is the effect that by the averaging (Z direction) accompanying such scanning, the defect or the like of the diffraction grating is also smoothed and becomes more inconspicuous.

In the present embodiment, the diffraction grating pattern 107 is formed on the glass substrate 106, but alternatively, it may be formed, for example, on the glass surface of the reticle 108. In such case, it is necessary that the diffraction grating pattern be formed substantially on the whole surface of the reticle correspondingly to the formation area 108a of the reticle pattern. As a further alternative, the diffraction grating pattern may be disposed in a plane in the illuminating optical system which is conjugate with the pattern surface of the reticle 108, or a plane spaced apart from said conjugate plane toward the light source side by a predetermined distance (a value corresponding to said Δt and the magnification of a composite system including the condenser lens 105, etc.). In the former case, the problem of the transfer of defect or the like will be reduced by only the averaging effect accompanying the scanning as described above, but there is the advantage that the aforementioned half shadow blur will be eliminated. In the latter case, an effect entirely similar to that of the present embodiment will be obtained. Further, in order to make the illuminated area on the reticle pattern surface arcuate, the diffraction grating pattern (deflecting member) may be formed on the stop member, i.e., the arcuate slit, disposed in a plane in the illuminating optical system 103 which is substantially conjugate with the reticle pattern. Also, instead of this stop member being provided in the illuminating optical system, the formation area of the diffraction grating pattern may be defined into an arcuate slit-like shape and the other portion of the glass substrate surface than this formation area may simply be covered with a light intercepting layer.

Also, as shown in FIG. 30, in the present embodiment, the scan direction (Z direction) of the reticle 108 and the pitch directions (Y and Z directions) of the diffraction grating pattern 130 are made coincident with or orthogonal to each other, but by the averaging effect provided by the scanning as described above, at least one of the pitch directions may be only slightly deviated relative to the scan direction. This means an advantage in manufacturing the diffraction grating pattern.

Now, the diffraction grating pattern 107 used in the apparatus of FIG. 28 can be of a degree of size (area) equal to the reticle side effective area of the projection optical system (and the illuminating optical system), and need not be formed on the whole surface of the reticle correspondingly to the pattern area of the reticle. Accordingly, even when use is made of a large-sized reticle, the diffraction grating itself may be small, and this is advantageous in terms of cost. Also, a plurality of phase type diffraction gratings differing in pitch and direction of period from one another may be formed on one and the same glass substrate, and the glass substrate may be moved in conformity with the pitch of the reticle pattern so that a diffraction grating best suited for the reticle pattern may be disposed in the illuminating optical path.

While the present embodiment has been shown with respect to an example in which a reflection refraction reduction projection optical system is employed as the projection optical system, the use of a projection optical system comprising a reflecting element alone or a projection optical system comprising a refracting element alone will also lead to the obtainment of an effect entirely similar to that described above. Particularly, where use is made of a projection optical system comprising a refracting element alone, the illuminated area on the reticle pattern surface may be made into a rectangular shape. Also, the projecting magnification of the projection optical system may be any magnification. Further, if the apparatus is of any other type than the step and scan type, but is of the scan type, an effect entirely similar to that of the present embodiment can be obtained.

What is claimed is:

1. A mask formed with a pattern having pitch $P_R$ for use to transfer said pattern onto a predetermined surface with illuminating light from a light source, comprising:

a pattern having a pitch $P_G$ ($P_G=2P_R$) formed at the light source side with respect to said pattern having the pitch $P_R$ by a predetermined distance.

2. A mask according to claim 1, wherein said pattern having the pitch $P_R$ is formed on one surface of the mask that transmits said illuminating light and said pattern having the pitch $P_G$ is formed on another surface of said mask.

3. A mask according to claim 1, wherein said pattern having the pitch $P_R$ and said pattern having the pitch $P_G$ are respectively formed on different optical members.

4. A mask for use to transfer a pattern formed on one of surfaces of said mask onto a photosensitive substrate with illuminating light incident on another surface of said mask, comprising:

a deflecting member disposed on or in the proximity of said another surface and constructed to transfer said pattern onto said substrate with at least one of higher resolution and greater depth of focus than the mask without the deflecting member.

5. A photo-mask having a substrate that is substantially transparent to illuminating light of a predetermined wavelength and that is formed, on a surface thereof at one side thereof, with a mask pattern to be transferred onto a photosensitive substrate using the illuminating light, the photo-mask also having a deflecting member at an opposite side of the substrate disposed within a predetermined distance of said surface on which the mask pattern is formed and constructed to deflect said illuminating light to transfer said mask pattern onto said photosensitive substrate with at least one of higher resolution and greater depth of focus than the mask without the deflecting member.

6. The photo-mask of claim 5, wherein said deflecting member includes a diffraction grating pattern.

7. The photo-mask of claim 6, wherein said diffraction grating pattern is a phase type diffraction grating.

8. A photo-mask according to claim 7, wherein said phase type diffraction grating is formed of a groove, the depth d of the groove being determined by the following equation:

$$d(n-1)=\lambda/2$$

wherein n is the refractive index of said phase type diffraction grating, $\lambda$ is the wavelength of said illuminating light.

9. A photo-mask according to claim 7, wherein said phase type diffraction grating is formed of a transmitting portion and a semi-transmitting portion which shifts the phase of said illuminating light by approximately $(2m+1)\pi$ (m being an integer) and whose transmittance to said illuminating light is equal to or less than the order of ¼ of the transmittance of said transmitting portion.

10. The photo-mask of claim 6, wherein when the numerical aperture of an illuminating optical system for applying said illuminating light is $NA_{IL}$ and the pitch of said diffraction grating mask pattern is $P_G$, the spacing $\Delta t$ between said mask plane conjugate with said photosensitive substrate and said diffraction grating pattern with respect to a direction perpendicular to said transparent substrate is determined to the relation that $\Delta t \geq P_G/2NA_{IL}$.

11. The photo-mask of claim 6, wherein the formation area of said diffraction grating pattern is larger by a predetermined amount than the formation area of said mask pattern formed on said transparent substrate.

12. The photo-mask of claim 6, wherein said pattern formed on said transparent substrate includes a periodic pattern, and the pitch direction of said diffraction grating pattern substantially coincides with the pitch direction of said periodic pattern.

13. The photo-mask of claim 12, wherein when the pitch of said periodic pattern is $P_R$, the pitch $P_G$ of said diffraction grating pattern is $P_G=2P_R$.

14. The photo-mask of claim 12, wherein said periodic pattern is a two-dimensional pattern in which pitches in two directions intersecting each other are $P_{R1}$ and $P_{R2}$, and said diffraction grating pattern comprises check elements in which the lengths of sides with respect to respective ones of said two directions are $P_{R1}$ and $P_{R2}$ arranged in a checked pattern.

15. The photo-mask of claim 5, wherein said deflecting member is integral with said transparent substrate and is provided on that surface of said transparent substrate which is opposite to the surface on which said mask pattern is formed.

16. The photo-mask of claim 15, wherein said deflecting member includes a diffraction grating pattern, and the formation area of said diffraction grating pattern is larger by a predetermined amount than the formation area of said mask pattern formed on said transparent substrate.

17. The photo-mask of claim 16, wherein said diffraction grating pattern is a phase type diffraction grating.

18. The photo-mask of claim 16, further comprising:

a protective member disposed on the formation surface side of said diffraction grating pattern relative to said transparent substrate and substantially covering the formation area of said diffraction grating pattern.

19. The photo-mask of claim 18, wherein said protective member is a pellicle.

20. The photo-mask of claim 18, wherein said protective member is a substrate substantially transparent to said illuminating light.

21. The photo-mask of claim 5, wherein said deflecting member is provided on a substrate discrete from said transparent substrate and is substantially transparent to said illuminating light.

22. The photo-mask of claim 21, wherein said deflecting member is formed on that surface of the discrete substrate which is adjacent to said transparent substrate.

23. The photo-mask of claim 21, further comprising:

a holding member for holding the discrete substrate substantially in parallelism to said transparent substrate.

24. The photo-mask of claim 21, wherein said deflecting member includes a diffraction grating pattern, and the formation area of said diffraction grating pattern is larger by a predetermined amount than the formation area of said mask pattern formed on said transparent substrate.

25. The photo-mask of claim 24, wherein said diffraction grating pattern is a phase type diffraction grating.

26. A photo-mask according to claim 5, wherein a light source that emits said illuminating light is disposed on a side of said surface opposite to the surface formed with the mask pattern, and said deflecting member is disposed with a predetermined spacing from a plane which is conjugate with said photosensitive substrate.

27. A method of exposing for transferring a pattern formed on one of surfaces of a mask onto a photosensitive substrate through a projection optical system by applying illuminating light from a light source to another surface of said mask, comprising:

deflecting said illuminating light by a deflecting member disposed on or in the proximity of said another surface and constructed to apply said illuminating light to said pattern of the mask to transfer said pattern onto said photosensitive substrate with at least one of higher resolution and greater depth of focus than the mask without the deflecting member.

28. A method of transferring a pattern having pitch $P_R$ formed on a mask onto a predetermined surface by illuminating said mask with illuminating light from a light source, comprising:

deflecting said illuminating light by means of a deflecting member formed with a pattern having a pitch $P_G$ ($P_G=2P_R$) and disposed between said light source and a surface on which said pattern of the mask is formed so as to illuminate said pattern of the mask.

29. A method of transferring a pattern formed on a mask onto a photosensitive substrate through a projection optical system by applying illuminating light from said light source to said mask, comprising:

deflecting said illuminating light by a deflecting member disposed on the light source side with respect to said pattern with a predetermined spacing relative to a plane which is conjugate with said photosensitive substrate and constructed to transfer said pattern onto said substrate with at least one of higher resolution and greater depth of focus than the mask without the deflecting member.

30. The method of transferring of claim 29, wherein said illuminating light is deflected so that said illuminating light may be inclined with respect to the pattern of said mask by an angle conforming to the degree of minuteness of the pattern of said mask.

31. The method of transferring of claim 29, wherein said illuminating light is deflected so that of diffracted lights created from the pattern of said mask, one of ±1st-order diffracted lights and 0-order diffracted light may pass substantially equidistantly from the optical axis of said projection optical system in or near the Fourier transformation plane in said projection optical system for the pattern of said mask.

32. The method of transferring of claim 29, wherein light diffracted by a diffraction grating pattern as said deflecting member is applied to the pattern of said mask.

33. The method of transferring of claim 32, further comprising:

rectilinearly said diffraction grating pattern in a predetermined direction while the pattern of said mask is exposed onto said photosensitive substrate.

34. The method of transferring of claim 33, wherein said diffraction grating pattern is rectilinearly moved in a plane perpendicular to the optical axis of said projection optical system, and the amount of movement or the amplitude of said rectilinear movement of said diffraction grating pattern is equal to or greater than the degree of the pitch of said diffraction grating pattern.

35. The method of transferring of claim 32, wherein said diffraction grating pattern is moved or vibrated in the direction of the optical axis of said projection optical system while the pattern of said mask is exposed onto said photosensitive substrate, and when the wavelength of said illuminating light is $\lambda$, the amount of movement or the amplitude of vibration of said diffraction grating pattern is equal to or greater than the order of $\lambda/4$.

36. The method of exposing of claim 32, further comprising:

moving the imaging plane of said projection optical system and said photosensitive substrate relative to each other in the direction of the optical axis of said projection optical system while the pattern of said mask is exposed onto said photosensitive substrate.

37. A method of exposing for applying illuminating light from a light source to a mask to thereby transfer a pattern formed on said mask onto a photosensitive substrate through a projection optical system, wherein the pattern of said mask is comprised of a transmitting portion of which the transmittance to said illuminating light is approximately 1, and a semi-transmitting portion which gives a phase difference of approximately $(2m+1)\pi$ (m being an integer) to the illuminating light transmitted through said transmitting portion and of which the transmittance to said illuminating light is equal to or less than the order of ¼ of the transmittance of said transmitting portion, said method comprising:

diffracting said illuminating light by a diffraction grating member disposed between said light source and said mask to thereby incline and apply said illuminating light to the pattern of said mask.

38. The method of exposing of claim 37, further comprising:

moving the imaging plane of said projection optical system and said photosensitive substrate relative to each other in the direction of the optical axis of said projection optical system while the pattern of said mask is exposed onto said photosensitive substrate.

* * * * *